(12) United States Patent
Garmshausen et al.

(10) Patent No.: US 12,179,419 B2
(45) Date of Patent: Dec. 31, 2024

(54) PROCESS AND APPARATUS FOR LOCALLY POLYMERIZING A STARTING MATERIAL BY DUAL COLOR PHOTOPOLYMERIZATION AND METHOD FOR VOLUMETRIC PRINTING OF A SHAPED BODY

(71) Applicant: xolo GmbH, Berlin (DE)

(72) Inventors: Yves Garmshausen, Berlin (DE); Marcus Reuter, Berlin (DE); Marin Regehly, Berlin (DE); Dirk Radzinski, Berlin (DE)

(73) Assignee: xolo GmbH, Berlin (DE)

( * ) Notice: Subject to any disclaimer, the term of this patent is extended or adjusted under 35 U.S.C. 154(b) by 321 days.

(21) Appl. No.: 17/596,232

(22) PCT Filed: Jun. 8, 2020

(86) PCT No.: PCT/EP2020/065818
§ 371 (c)(1),
(2) Date: Dec. 6, 2021

(87) PCT Pub. No.: WO2020/245456
PCT Pub. Date: Dec. 10, 2020

(65) Prior Publication Data
US 2022/0305723 A1 Sep. 29, 2022

(30) Foreign Application Priority Data
Jun. 6, 2019 (DE) .......................... 102019115336.0

(51) Int. Cl.
B29C 64/135 (2017.01)
B29C 64/264 (2017.01)
(Continued)

(52) U.S. Cl.
CPC .......... *B29C 64/135* (2017.08); *B29C 64/264* (2017.08); *B29C 64/282* (2017.08);
(Continued)

(58) Field of Classification Search
None
See application file for complete search history.

(56) References Cited

U.S. PATENT DOCUMENTS

| 5,230,986 A | 7/1993 | Neckers |
| 2003/0099910 A1 | 5/2003 | Kim et al. |
| 2022/0055290 A1 | 2/2022 | Hahn et al. |

FOREIGN PATENT DOCUMENTS

| EP | 1670039 A1 | 6/2006 |
| EP | 3702837 A1 | 9/2020 |

(Continued)

OTHER PUBLICATIONS

Lee, S.K. et al. "Two-Photon Radical-Photoinitiator System Based on Iodinated Benzospiropyrans," Chem. Mater., American Chemical Society, 3:5 (1991), pp. 858-864.
(Continued)

*Primary Examiner* — Sanza L. McClendon
(74) *Attorney, Agent, or Firm* — Eversheds Sutherland (US) LLP

(57) ABSTRACT

The present invention relates to a process, an apparatus and photoswitchable photoinitiators for locally polymerizing a starting material by dual color photopolymerization and a method for volumetric printing of a shaped body (xolography). In particular, photoinitiators are provided, which cause raring of photopolymerizable formulations upon irradiation with two different wavelengths and which maybe used for volumetric printing (xolocure initiators).

19 Claims, 3 Drawing Sheets

(51) Int. Cl.
    *B29C 64/282*     (2017.01)
    *B33Y 10/00*     (2015.01)
    *B33Y 30/00*     (2015.01)
    *B33Y 70/00*     (2020.01)
    *C08F 2/50*     (2006.01)
    *C08F 122/10*     (2006.01)
    *C08F 220/04*     (2006.01)
    *C08F 220/56*     (2006.01)
    *C08F 222/10*     (2006.01)
    *G03F 7/00*     (2006.01)

(52) U.S. Cl.
    CPC ............... *B33Y 10/00* (2014.12); *B33Y 30/00* (2014.12); *B33Y 70/00* (2014.12); *C08F 2/50* (2013.01); *C08F 122/1006* (2020.02); *C08F 220/04* (2013.01); *C08F 220/56* (2013.01); *C08F 222/102* (2020.02); *C08F 222/104* (2020.02); *G03F 7/0037* (2013.01)

(56) References Cited

FOREIGN PATENT DOCUMENTS

| | | |
|---|---|---|
| WO | 199411760 A1 | 5/1994 |
| WO | 2019080820 A1 | 5/2019 |
| WO | 2020094593 A1 | 5/2020 |

OTHER PUBLICATIONS

International Search Report and Written Opinion for PCT/EP2020/065818, date of mailing Oct. 20, 2020, 10 pages.
Hahn, Vincent et al., 3-D Laser Nanoprinting, Optics & Photonics News Oct. 2019, pp. 30-36.
Lee, Suk-Kyu et al., Benzospiropyrans as Photochromic and/or Termochromic Photoinitiators, Chem. Mater. 1991, 3, 852-858.
Parthenopoulos, Dimitri A. et al., Three-Dimensional Optical Storage Memory, Science, 245, 1989, 843-845.

PROCESS AND APPARATUS FOR LOCALLY POLYMERIZING A STARTING MATERIAL BY DUAL COLOR PHOTOPOLYMERIZATION AND METHOD FOR VOLUMETRIC PRINTING OF A SHAPED BODY

CROSS REFERENCE TO RELATED APPLICATIONS

This application is a U.S. national stage application of PCT/EP2020/065818, filed Jun. 8, 2020, which claims priority to German Patent Application No. 10 2019 115 336.0, filed Jun. 6, 2019. The content of these applications is incorporated herein by reference.

FIELD OF INVENTION

The present invention relates to a process, an apparatus and photoswitchable photoinitiators for locally polymerizing a starting material by dual color photopolymerization and a method for volumetric printing of a shaped body (xolography). In particular, photoinitiators are provided, which cause curing of photopolymerizable formulations upon irradiation with two different wavelengths and which may be used for volumetric printing (xolocure initiators).

BACKGROUND OF ART

A definition of photoswitches, structures which are photochromic, and terms used in the field can be found in [Bouas-Laurent, Dürr, Pure and Applied Chemistry, 2001, 73, 639-665]. In general, a photoswitch is a photochromic compound which can undergo a reversible structural change in at least one direction via a photochemical path. A typical example is the spiropyran/merocyanine System, as illustrated in below:

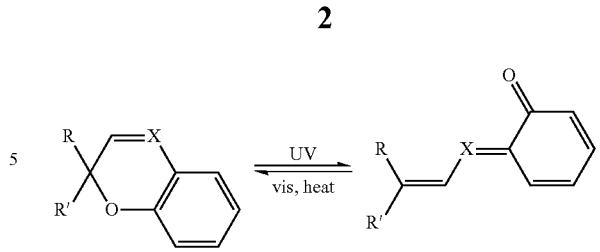

In such chromene based photoswitches, R and R' can be alkyl, alkyne, or aryl substituents, and X can be a carbon or a nitrogen atom. Various derivatives of this family are photochromic, wherein the aryl part is further substituted, or the oxygen atom is changed for a nitrogen atom. The double bonds of the open form can be E and/or Z configured.

An overview on photoinitiators with terms and definitions can be found in [Green, Industrial Photoinitiators A Technical Guide, CRC Press, 2010; Fouassier and Lalevée, Photoinitiators for Polymer Synthesis: Scope, Reactivity and Efficiency, Wiley VCH, 2012]. Curing of a material refers to the polymerization of monomers. Depending on the mechanism of the polymerization several functional groups have been found to be suitable monomers, which include but are not limited to acrylates, methacrylates, thiol+ene, epoxides, oxiranes, oxetanes, or vinylethers. Photoinitiators start the polymerization upon irradiation with light. The polymerization can be conducted in a radical fashion, cationic, anionic, or metal catalyzed. Photoinitiators are either type 1, where a single compound can start the polymerization or type 2, where a co-initiator is required. Type 1 photoinitiators can undergo homolytic (radical) or heterolytic bond cleavage (cationic/anionic) to form the reactive species. In the following reactions further species can be produced which can cause a different nature of the polymerization, e.g. an amine radical is initially produced by homolytic bond cleavage, which than abstracts a hydrogen atom from the environment

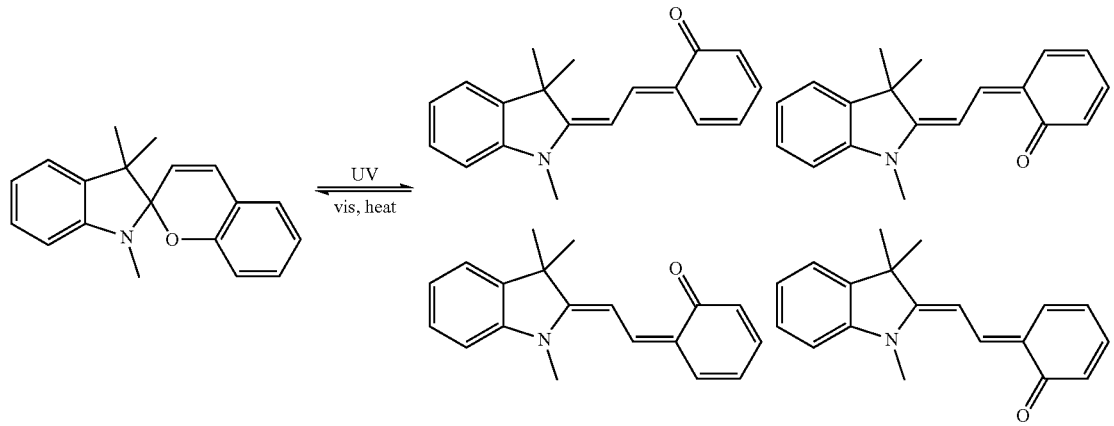

The colorless spiropyran is the thermodynamically favored form and undergoes a ring opening reaction upon irradiation with UV light to the metastable colored merocyanine form (positive photochromism). The merocyanine form can be a mixture of four different isomers. Within this patent the term merocyanine refers to one or more of the different E/Z isomers. The reverse reaction from merocyanine to spiropyran can be conducted either by light or thermally (T-type photochromism). The spiropyran photoswitches belong to the group of chromene based switches, which are usually positive and T-type photochromic.

to form an amine and start a base mediated polymerization. Type 2 photoinitiators can start the polymerization by two different mechanisms, where the first is hydrogen abstraction from a co-nitiator, which produces two radicals and can cause further reactive species from follow up reactions. The second mechanism is a photoredox reaction, where an electron is transferred between co-initiator and photoinitiator. The photoredox reaction can be proceeded by further proton transfer reactions to produce radicals or other follow up reactions which result in further reactive species such as acids, bases or radicals. Several structural motives are known to initiate a polymerization and examples of the most important ones are shown below.
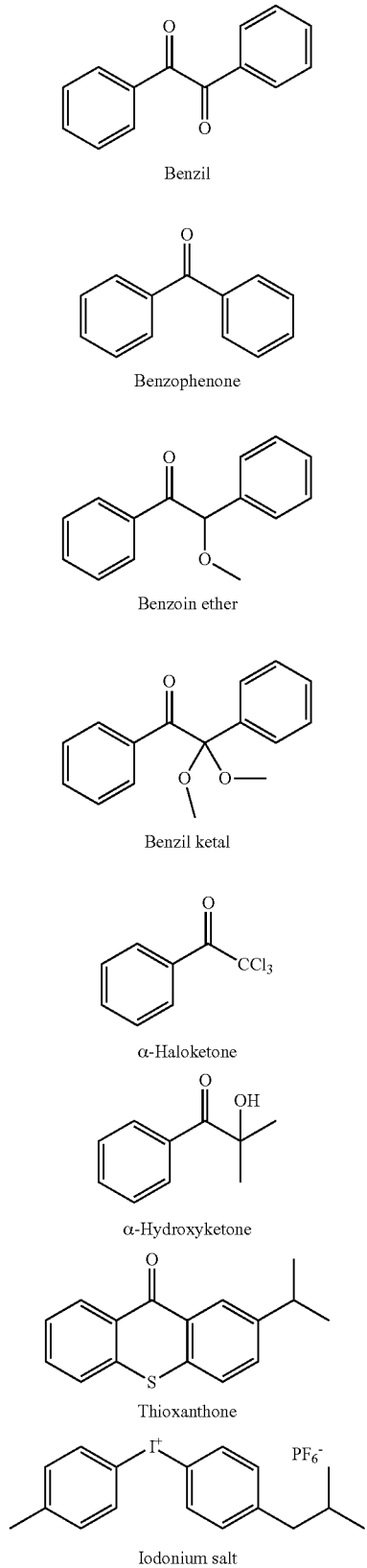
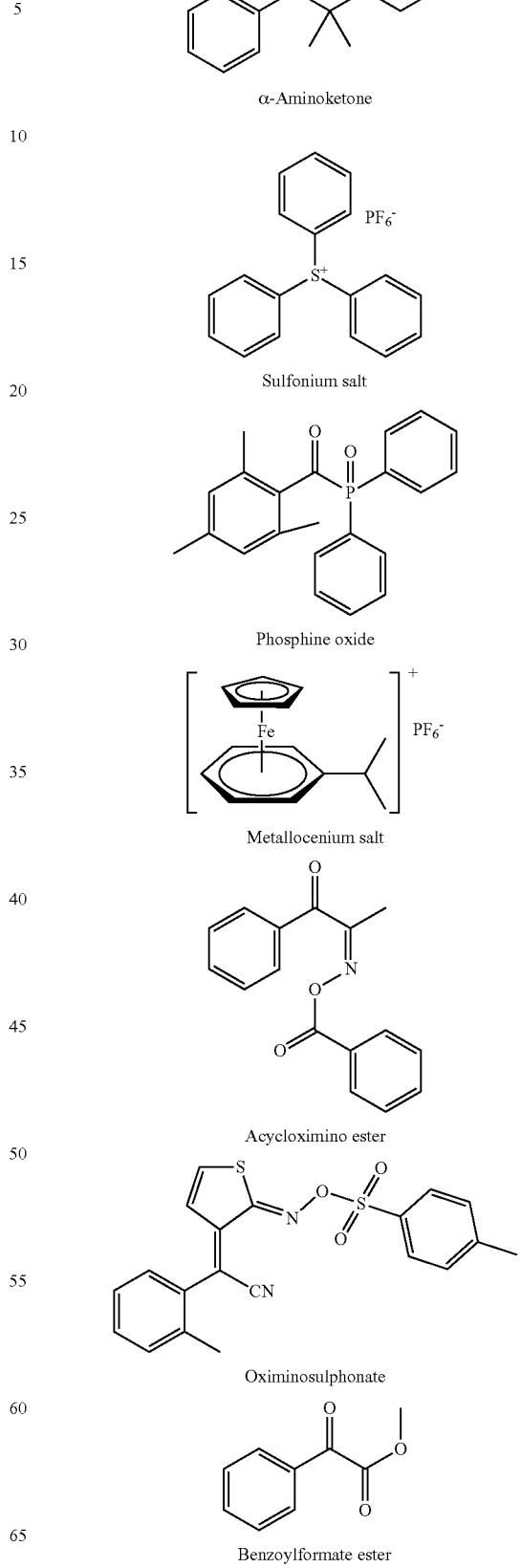

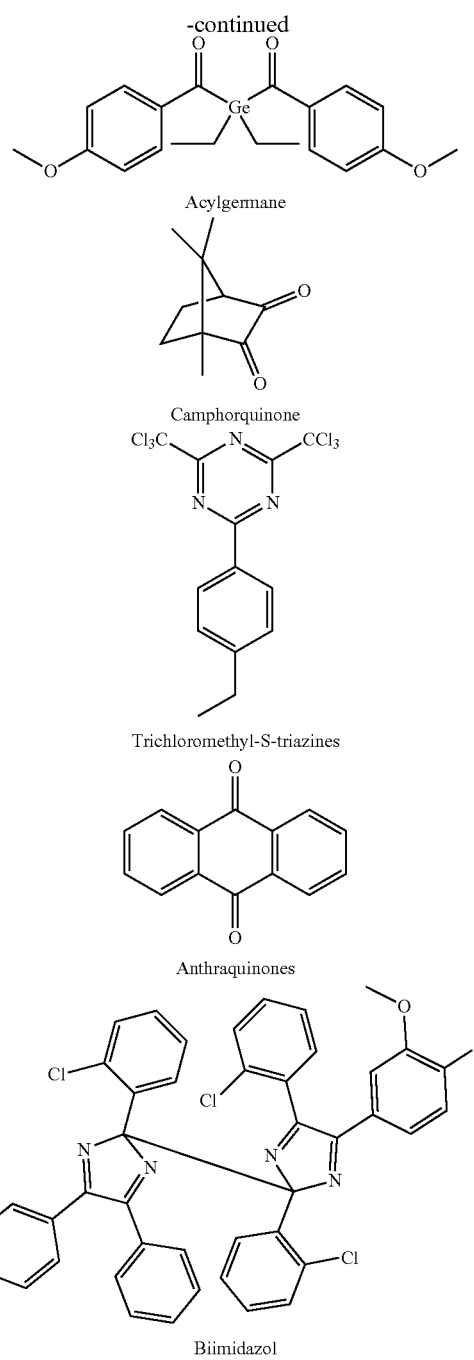

Acylgermane

Camphorquinone

Trichloromethyl-S-triazines

Anthraquinones

Biimidazol

Additive manufacturing or 3D printing can be performed with various techniques and materials and allows to produce customized parts. Compared to injection molding, additive manufacturing enables the formation of more complex structures, saving material and giving the opportunity to construct specialized parts for machines with superior performance. However, most of the additive manufacturing techniques rely on a layer by layer build sequence. Therefore, the object is sliced into many layers and one layer is printed after the other. Consequently, certain limitations are inherent, which is the necessity for support structures to prevent overhanging parts from falling apart. Usually, several mechanical steps are involved between printing of the layers, which leads to long production times. The starting material for a print must be in a form to allow for the mechanical operations without destruction of the object, which restricts starting materials to certain powder sizes or viscosities.

One of the most prominent 3D printing techniques is stereolithography [Hull, U.S. Pat. No. 4,575,330, 1984] and techniques related to stereolithography. In general, a thin layer of a photocurable resin is irradiated with a specific pattern of light of one wavelength. This causes a photopolymerization and results in hardening at the illuminated areas. Then a new layer of photocurable resin is introduced from the top or bottom of the previous layer, and illumination leads to curing in this layer. The advantage of irradiation-based techniques is the fast process of photopolymerization and the high resolution in which light can be applied to a layer as well as a certain flexibility in terms of material properties. Although stereolithography is a well-known technique, the previously mentioned drawbacks still apply. Stereolithography requires support structures, which makes an elaborate post-processing necessary. Despite the fast photopolymerization, the slow mechanical processes to go from one layer to the next reduce the overall production speed of stereolithography. Furthermore, the resin must fulfill certain criteria, such as low viscosity to enable flow and homogeneity of the layers as well as a high absorption at the irradiation wavelength to avoid curing in the previous layers. The requirement of thin layers for a high resolution as well as the low viscosity result in high oxygen and water concentrations at the surface. While water quenches the cationic polymerization process, oxygen quenches the radical process. Although the latter can be improved by the addition of amines, the resins require high concentrations of costly photoinitiators to overcome the inhibition process but still yield less crosslinked materials which are therefore less robust.

To overcome the limitations of stereolithography, volumetric printing has been proposed as a solution. In such an approach the resin is in a container and byte action of light curing does not happen on the walls of the container but inside the volume. This removes the necessity of support structures, allows for resins of low and high viscosity, allows the formation of soft objects, and does not suffer from the inhibition by oxygen or water.

One implementation of volumetric printing relies on two photon polymerization, where a common photoinitiator is excited by the simultaneous uptake of two photons, causing polymerization in the focus of a laser beam [S. Maruo et al., Opt. Lett., 1997, 22, 132-134]. Two photon polymerization requires costly and delicate setups with intense pulsed laser sources. Furthermore, the technique is inherently slow due to the nonlinearity of the process, reducing the achievable object size considerably.

Furthermore, the method of tomographic reconstruction has been developed, where the resin is illuminated with different light patterns from various angles. Due to the overlaying light an intensity distribution in the volume is generated, which causes curing wherever a certain threshold is exceeded. The light patterns which are required to form a three-dimensional object are calculated before in a similar way to a reverse process of computer tomographic analysis [Kelly et al., US20180326666A1, 2018; Shusteff et al., US20180015672A1, 2018; Delrot et al. WO2019043529A1, 2019]. This technique suffers from the inherent disadvantage to match the hardening threshold at every position in the volume. Furthermore, the resin rotates, causing diffusion while curing. Both effects cause a low resolution and object size. Furthermore, this technique does not allow to produce objects with sharp edges and is therefore limited to round surfaces of the printed parts.

To overcome the issues of two photon polymerization and tomographic reconstruction, a dual color photoinitiating system can be envisioned. This requires a photoinitiator which upon irradiation with light of a first wavelength %1 is transformed from its thermodynamically stable ground state form A into a metastable ground state species B. When species B absorbs light of the second wavelength %2, it can initiate a polymerization reaction via form C. Form C is an excited state of B, which produces radicals, cations or anions by further reaction with or without a co-initiator. In the sense of this invention the terms first wavelength, second wavelength, and third wavelength can refer to a range of wavelengths. For usage in a volumetric printing approach a back reaction from B to A must be possible to avoid hardening of unwanted areas. The back reaction from B to A can be triggered thermally or by irradiation with a third wavelength λ3.

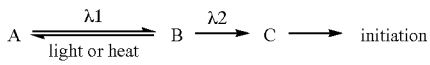

There are two unwanted reaction pathways, which could lead to polymerization with the first wavelength alone. A can directly initiate the polymerization instead of switching or B can absorb a photon of the first wavelength and initiate the polymerization. Ideal dual color photoinitiators which are suitable for volumetric printing do not suffer from these unwanted reactions and are thermally reversible or can be switched back by irradiation with a third wavelength. The following examples are related to photoinitiators and multiple wavelengths irradiation, although all of them suffer from unwanted side reactions and/or a lack of thermal reversibility. So far, no three-dimensional objects other than single voxels have been made, which does not require any thermal or photochemical back reaction and is not sufficient for volumetric printing.

A related concept has been first proposed by Swainson in a series of patents [Swainson, U.S. Pat. Nos. 4,041,476, 4,078,229, 4,238,840, 4,466,080, 4,471,470, 4,333,165] and later by Lippert (US2020/0108557A1). Several theoretical approaches are shown, where the photoinitiator is supposed to react to two or three different wavelengths. However, although the concept is interesting, none of the described molecules in the patents have been shown to respond to two different wavelengths initiating a polymerization and they are neither feasible nor commercially satisfactory for volumetric printing.

JP H0375127A by Kenji and Ichiro claimed three photoswitches for volumetric printing. The molecules described therein are known for their photochromic properties, but do not show selective curing, where beams of both wavelengths would intersect as has been shown by Neckers [US00530986A, column 6, line 27-35]. Even if they were able to initiate with dual color irradiation, they show a slow thermal reverse reaction from B to A, which makes them unsuitable in volumetric printing applications.

Barachevsky et al. [US7244548B2, 2007] and Waldman et al [US2009/0202919A1]disclosed several initiators for recording phase holograms. In this type of application, a curable composition is irradiated with one wavelength first to induce the isomerization from A to B. Later, the second wavelength can be used to record a phase hologram by initiating the polymerization. This application requires photoinitiators which respond to two different wavelengths but do not show a thermal back reaction from B to A. The lack of a thermal back reaction renders the disclosed initiators not suitable for a volumetric printing approach.

US005230986A by Neckers disclosed iodinated benzospiropyrans with suitable co-initiators as two photon radical photoinitiators with the following structure, where at least one of the two substituents $X_1$ and $X_3$ is an iodine:

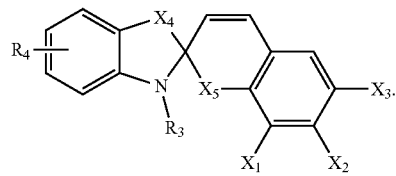

The disclosed molecules are of limited efficiency for photopolymerization, which makes high concentrations necessary [Lee, Neckers, Chem. Mater. 1991, 3, 852-858 and Lee, Neckers, Chem. Mater. 1991, 3, 858-864]. Consequently, the penetration depth of the light is limited and the volume suitable for printing cannot exceed 2 mm as has been shown by the same authors [Lee, Neckers, Chem. Mater. 1991, 3, 858-864, FIGS. 12 and 13]. The iodo substituent acts as a triplet sensitizer on the spiropyrane form, so that the unwanted side reaction from irradiation using the first wavelength alone is dominant, where the spiropyrane causes the photo redox reaction and hence formation of radicals, without isomerizing to the merocyanine. Iodinated benzospiropyrans are further limited by a slow thermal back reaction which makes them unsuitable for volumetric printing.

Two other spiropyran-based two component systems have been reported for recording holograms [Jeudy, Robillard, Opt. Commun. 1975, 13, 25-28; Ichimura, Sakuragi, J. Polym. Sci. Polym. Lett, 1988, 26 185-189]. However, both are not suited for volumetric printing, since on the one hand the thermal back reaction in both cases is too slow for a commercially successful application and on the other hand both cause substantial polymerization with the first wavelength alone [Lee, Neckers, Chem. Mater. 1991, 3, 858-864].

It is the object of the present invention to overcome the disadvantages of the currently available methods as discussed above. More particular, it is the object of the present invention to provide a process, an apparatus and photoswitchable photoinitiators for local polymerization of a starting material by dual color photopolymerization and a method for volumetric printing of a shaped body, which allow flexible and locally targeted curing in a starting material by means of photopolymerization (xolography).

The technology shall be particularly applicable to 3D printing. More particular, photoinitiators shall be provided, which cause curing of photopolymerizable formulations upon irradiation with two different wavelengths and which may be used for volumetric printing (xolocure initiators).

SUMMARY OF THE INVENTION

For the solution, a process for local polymerization of a starting material by means of dual color photopolymerization is provided. Furthermore, a process for 3D-printing of a shaped body has been provided. Further embodiments are described herein.

According to one aspect, a process for local polymerization of a starting material by means of dual color photopolymerization is provided. Here a polymerizable starting material is provided which contains photoinitiator molecules which can be converted by means of sequential optical excitation with several wavelengths into a reactive state in which the photoinitiator molecules locally trigger a polymerization of the starting material, in particular a local curing or hardening of the starting material due to the polymerization. The starting material is photopolymerized in a local volume by irradiating light of a first wavelength simultaneously with or followed by light of a second wavelength different from the first wavelength into the local volume.

In the local volume is provided that, by absorption of a photon of the first wavelength, the photoinitiator molecules are converted from an initial state, in which the photoinitiator molecules do not substantially absorb the light of the second wavelength, to an intermediate state with optical properties different from those of the initial state, in such a way that the photoinitiator molecules in the intermediate state absorb the light of the second wavelength and enter the reactive state. In the local volume, due to the gradual absorption of the light of the first wavelength and the light of the second wavelength, the photoinitiator molecules are transferred from the initial state via the intermediate state into the reactive state, which locally triggers polymerization. Outside of the local volume the photoinitiator molecules which have been in the intermediate state return to the initial state.

According to another aspect, an apparatus for local polymerization of a starting material by means of dual color photopolymerization is created. The apparatus comprises the following: an intake for a polymerizable starting material, light generating means arranged to provide light of a first wavelength and light of a second wavelength, the second wavelength being different from the first wavelength, and light guide means arranged to irradiate the light of the first wavelength and the light of the second wavelength into a local volume. The apparatus is arranged to perform the following processes: taking up the polymerizable starting material by the intake, the starting material containing photoinitiator molecules which can be converted by means of sequential optical excitation into a reactive state in which the photoinitiator molecules locally trigger polymerization of the starting material, and thus result in photopolymerization of the starting material in a local volume by means of irradiation of the light of the first wavelength and the light of the second wavelength in a defined local volume. The following is provided in the local volume: the photoinitiator molecules are converted from an initial state, in which the photoinitiator molecules essentially do not absorb the second light, into an intermediate metastable ground state with changed optical properties compared to the initial state due to absorption of a photon of the first wavelength, in such a way that the photoinitiator molecules in the intermediate state absorb the light of the second wavelength. In the local volume, due to the gradual absorption of light of the first wavelength and light of the second wavelength, the photoinitiator molecules are converted from the initial state via the intermediate state into the reactive state, which locally triggers polymerization. Outside of the local volume the photoinitiator molecules which have been in the intermediate state return to the initial state.

Furthermore, a method for volumetric-printing of a shaped body is provided, in which the shaped body is produced by means of the method for local polymerisation of the starting material, wherein the local photopolymerization leads to hardening or curing of the starting material and thus to production of the shaped body.

The absorptive capacity of the photoinitiator molecules in the intermediate state with respect to light of the second wavelength can be based on a change in the optical properties of the photoinitiator molecules, by which the absorptive capacity for light of the second wavelength is initially formed, in particular in that a spectral absorption band is formed in the region of the second wavelength due to the transition from the initial state to the intermediate state. Alternatively, it can be provided that an absorption band for light of the second wavelength already existing in the initial state of the photoinitiator molecules is amplified or enlarged in the intermediate state.

In the intermediate state, the photoinitiator molecules in the range of the first wavelength may be still absorbing or no longer absorbing. More preferred, the photoinitiator molecules in the intermediate state may substantially not absorb the light of the first wavelength. Most preferred, the photoinitiator molecules in the intermediate state may not absorb the light of the first wavelength.

In one aspect, the intermediate state may return thermally at the printing temperature to the initial state. More preferred, the intermediate state may return thermally at the printing temperature to the initial state with a rate constant higher than $k=0.01$ $s^{-1}$.

More preferred, the rate constant for the thermal back reaction is higher than $0.02$ $s^{-1}$ Even more preferred, the rate constant for the thermal back reaction is higher than $0.05$ $s^{-1}$. Most preferred, the rate constant for the thermal back reaction is higher than $0.08$ $s^{-1}$.

In the various embodiments, local photopolymerization in the local area can lead to hardening or curing of the starting material.

Light of the first and second wavelength cane irradiated simultaneously into the local volume.

Light of the second wavelength can be irradiated into the local volume after the irradiation of the light of the first wavelength into the local volume has ended, the light of the second wavelength being irradiated before the end of a decay time of the intermediate state of the photoinitiator molecules.

Due to the absorption of light of the second wavelength, the photoinitiator molecules can be converted into a reactive state, which triggers polymerization in the local volume. It may be intended that this reactive state is produced in analogy to a Norrish type I reaction or a Norrish type II reaction which is known to the skilled person. Alternatively, it may be intended that this reactive state undergoes an electron transfer reaction with a co-initiator.

Disclosed are further dual color photoinitiators, which respond to electromagnetic radiation of a first wavelength by switching from a thermodynamically stable state A to a metastable state B. B is able to absorb electromagnetic radiation of a second wavelength, thereby forming C, that can initiate a polymerization reaction. B can undergo a fast thermal reverse reaction to the form A and is then deactivated for electromagnetic radiation of the second wavelength. Application of such dual color photoinitiators allows the curing of a photopolymerizable resin in any volume, where electromagnetic radiation of both wavelengths intersects, for example where an image is projected on a light sheet. The disclosed substitution patterns ensure a fast thermal back reaction and no curing with the first wavelength alone, preventing the curing in unwanted areas. Application of the disclosed dual color photoinitiators in a polymerizable mixture allows fast volumetric printing with high resolution. No support structures are required, which saves material and allows for the fabrication of soft and fragile products. A broad range of possible resin viscosities can be covered, and high reactivity is achieved, due to minimized quenching of the polymerization by oxygen and water. The utilization of the disclosed dual color photoinitiators allows faster printing than common photopolymerization based additive manufacturing techniques due to fewer mechanical operations.

The disclosed dual color photoinitiators are characterized in a way that a polymerization is induced where electromagnetic radiation of two different wavelengths interacts with the same volume of polymerizable material in a simultaneous or consecutive fashion. In volumes which interact with electromagnetic irradiation of only one wavelength, no polymerization is induced.

A disclosed dual color photoinitiator in the thermodynamically stable form A absorbs a photon from electromagnetic radiation of the first wavelength which induces an isomerization reaction to the metastable form B. The dual color photoinitiator in the metastable form B absorbs a photon from electromagnetic radiation of the second wavelength, which results in an excited state C and further causes the formation of radicals by hydrogen abstraction from a co-initiator followed by electron transfer or decomposition into radicals, by electron transfer which is followed by hydrogen abstraction or decomposition into radicals, or homolytic bond cleavage which can be preceded or followed by other rearrangement reactions to form radicals. Dual color photoinitiators in the metastable state B which have not absorbed a photon from electromagnetic radiation of the second wavelength, return spontaneously via a thermal process to the thermodynamically stable state A.

The dual color photoinitiators carry carbonyl functions which are weak triplet sensitizers for spiropyrans and related structures and therefore show no curing with UV light alone. Electromagnetic radiation of the first wavelength causes excitation of the initiator in form A and switching to the initiator in form B mainly via a singlet state. The efficient ring opening reaction of the photoswitch motif prevents the dual color initiators from radical formation by irradiation with the first wavelength alone. The merocyanine type form B can act as an internal triplet sensitizer upon irradiation with the second wavelength, which causes the carbonyl group to abstract a hydrogen atom from a co-initiator, undergo an electron transfer reaction, or undergo homolytic bond cleavage. The substituents are chosen in a way to minimize or extinguish the absorption of the merocyanine type form B at the first wavelength and that form B is thermodynamically destabilized to ensure a fast thermal back reaction from B to A. Furthermore, the disclosed dual color initiators benefit from an exceptionally low or neglectable quantum yield for the competing photoreaction from B to A and high extinction coefficients of the B form, where form A does not absorb. The merocyanine form B typically has a broad absorption in the visible region, which allows for high intensities over abroad range of wavelengths.

Suitable dual color photoinitiators have the following structure represented by the following formula (I):

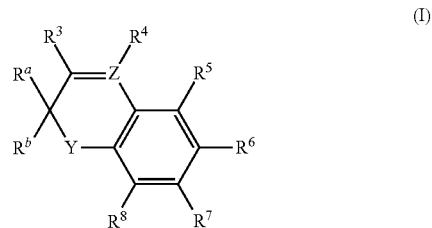

wherein $R^a$ and $R^b$ are selected independently from unsubstituted or substituted aryl, unsubstituted or substituted alkyne or are linked to each other to form an unsubstituted or substituted ring structure, Y is selected from O, S, or N; where Y is N, the substituent contains the atoms necessary to complete a cyclic structure with $R^8$ selected from the group consisting of benzimidazole, indoline, indole, dihydroquinoline, and tetrahydroquinoline; wherein Z is selected from N or $CR^4$; wherein $R^3$ to $R^8$ are independently selected from the group consisting of H; D; halogen; $NO_2$; CN; OH; SH; substituted or unsubstituted $C_1$-$C_{20}$-alkyl; substituted or unsubstituted $C_3$-$C_{20}$-cycloalkyl; substituted or unsubstituted $C_6$-$C_{48}$-aryl; substituted or unsubstituted $C_2$-$C_{42}$-heteroaryl; substituted or unsubstituted $C_2$-$C_{49}$-alkyl acyl; substituted or unsubstituted $C_2$-$C_{49}$-aryl acyl; substituted or unsubstituted $C_2$-$C_{20}$-alkoxy; substituted or unsubstituted $C_6$-$C_4$-aryloxy, and $NH_2$; substituted or unsubstituted $C_1$-$C_{20}$-alkyl ester; substituted or unsubstituted $C_6$-$C_{48}$-aryl ester; substituted or unsubstituted $C_1$-$C_{20}$ alkyl amide; substituted or unsubstituted $C_6$-$C_{48}$-aryl amide; $NR'_2$, $SiR'_3$, —O—$SiR'_3$ wherein R' is independently selected from the group consisting of substituted or unsubstituted $C_1$-$C_{20}$-alkyl and substituted or unsubstituted $C_6$-$C_{48}$-aryl, two R' may form a ring structure; substituted or unsubstituted carboxylic acids and salts thereof; substituted or unsubstituted sulfonic acids and salts thereof; substituted or unsubstituted sulfonic esters; substituted or unsubstituted sulfonic amides; formyl; ether, thioether; carbonate; carbonate ester; sulfates; boronic acids; boronic esters; phosphonic acids; phosphonic esters; phosphines; phosphates; peroxycarbonic acids; thiocarbonic acids; sulfinic acids; sulfinic esters; sulfonates; thiolesters, sulfoxides; sulfones; hydrazides; thioaldehydes; ketones; thioketones; oximes: hydrazines: nitroso; azo; diazo; diazonium; isocyanides; cyanate; isocyanate; thiocyanate; isothiocyanate; hydroperoxide; peroxide; acetals; ketal; orthoester; orthocarbonate esters; ammonium; imines; imides; azide; nitrate; isonitrile; nitrosoxy; substituted unsubstituted carbamates; substituted or unsubstituted ethers; substituted or unsubstituted polyether carbamates; substituted or unsubstituted arylazo; substituted or unsubstituted $C_2$-$C_{20}$-alkynyl and substituted or unsubstituted $C_2$-$C_{20}$-alkenyl; wherein the one or more substituents, if present in one or more of $R^3$-$R^8$, are independently selected from the group consisting of D; halogen; $NO_2$; CN, $C_2$-$C_{49}$-alkyl acyl; substituted or unsubstituted $C_1$-$C_{20}$-alkoxy; substituted or unsubstituted $C_6$-$C_{48}$-aryloxy; substituted or unsubstituted $C_2$-$C_{49}$-aryl acyl; (meth)acrylate; tosyl; $NH_2$; and OH; and/or wherein two adjacent groups of $R^5$-$R^8$ may be linked to each other to form a fused ring structure, preferably, a fused aromatic $C_6$-ring; and wherein at least one of R³-R⁸, is selected from one of the following structures:

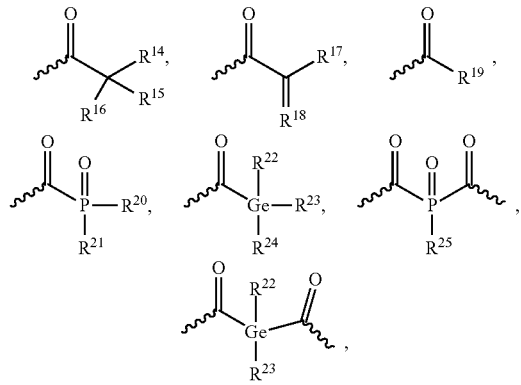

wherein R¹⁴ to R²⁵ are independently selected from the group consisting of H; D; halogen; NO₂; CN; OH; SH; substituted or unsubstituted $C_1$-$C_{20}$-alkyl; substituted or unsubstituted $C_3$-$C_{20}$-cycloalkyl; substituted or unsubstituted $C_6$-$C_{48}$-aryl; substituted or unsubstituted $C_2$-$C_{42}$-heteroaryl; substituted or unsubstituted $C_2$-$C_{49}$-alkyl acyl; substituted or unsubstituted $C_2$-$C_{49}$-aryl acyl; substituted or unsubstituted $C_1$-$C_{20}$-alkoxy; substituted or unsubstituted $C_6$-$C_{48}$-aryloxy, and NH₂; substituted or unsubstituted Ce-Cao-alkyl ester; substituted or unsubstituted $C_6$-$C_{48}$-aryl ester; substituted or unsubstituted $C_1$-$C_{20}$ alkyl amide; substituted or unsubstituted $C_6$-$C_{48}$-aryl amide; NR'₂, SiR'₃, —O—SiR'₃ wherein R' is independently selected from the group consisting of substituted or unsubstituted $C_1$-$C_{20}$-alkyl and substituted or unsubstituted $C_6$-$C_{48}$-aryl, two R' may form a ring structure; substituted or unsubstituted carboxylic acids and salts thereof; substituted or unsubstituted sulfonic acids and salts thereof; substituted or unsubstituted sulfonic esters; substituted or unsubstituted sulfonic amides; formyl; ether, thioether; carbonate; carbonate ester; sulfates; boronic acids; boronic esters; phosphonic acids; phosphonic esters; phosphines; phosphates; peroxycarbonic acids; thiocarbonic acids; sulfinic acids; sulfinic esters; sulfonates; thiolesters, sulfoxides; sulfones; hydrazides; thioaldehydes; ketones; thioketones; oximes; hydrazines; nitroso; azo; diazo; diazonium; isocyanides; cyanate; isocyanate; thiocyanate; isothiocyanate; hydroperoxide; peroxide; acetals; ketal; orthoester; orthocarbonate esters; ammonium; imines; imides; azide; nitrate; isonitrile; nitrosoxy; substituted or unsubstituted carbamates; substituted or unsubstituted ethers; substituted or unsubstituted polyether carbamates; substituted or unsubstituted arylazo; substituted or unsubstituted $C_2$-$C_{20}$-alkynyl and substituted or unsubstituted $C_2$-$C_{20}$-alkenyl; wherein the one or more substituents, if present in one or more of R¹⁴-R²⁵, are independently selected from the group consisting of D; halogen; NO₂; CN; $C_2$-$C_{49}$-alkyl acyl; substituted or unsubstituted $C_1$-$C_{20}$-alkoxy; substituted or unsubstituted $C_6$-$C_{48}$-aryloxy; substituted or unsubstituted $C_2$-$C_{49}$-aryl acyl; (meth)acrylate; tosyl; NH₂; and OH; and RIB and R⁶ may be linked to each other to form a unsubstituted or substituted ring structure, such as a cyclohexyl ring, a cyclopentyl ring or a piperidine ring.

Preferably, suitable dual color photoinitiators may have the following structure represented by the following formula (II):

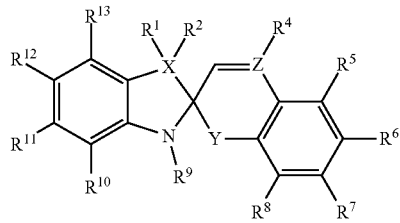

(II)

wherein X is selected from S, CR¹R², or NR¹; Y is selected from 0, S, or NR$^c$; when Y is N, the substituent R$^e$ contains the atoms necessary to complete a cyclic structure with R⁸ selected from the group consisting of benzimidazole, indoline, indole, dihydroquinoline, and tetrahydroquinoline; Z is selected from N or CR⁴; and R¹ to R¹³ are independently selected as defined in R³ to R⁸ regarding formula (I) above.

Preferably, R$^a$ and R$^b$ are independently selected from substituted or unsubstituted $C_6$-$C_{14}$-aryl and substituted or unsubstituted $C_2$-$C_{10}$-alkynyl. More preferred, R$^a$ and R$^b$ are independently selected from substituted or unsubstituted phenyl, substituted or unsubstituted naphthyl and $C_2$-$C_5$-alkynyl.

Preferably X is selected from S or CR¹R². More preferably X is C and R¹ and R² may be independently selected from H, D, $C_1$-$C_4$-alkyl. More preferably, R¹ and R² are methyl.

Preferably Z is CR⁴. More preferably Z is C and R⁴ may be independently selected from H, D, CN, $C_1$-$C_{12}$-alkyl, fluorinated $C_1$-$C_{12}$-alkyl, or $C_6$-$C_{14}$-aryl. More preferably, R³ and R⁴ are H.

Preferably, R⁹ may be selected from H, D, substituted or unsubstituted $C_1$-$C_4$alkyl, phenyl and benzyl. More preferred, R⁹ is methyl, —CH₂—CH₂—OH, phenyl or benzyl.

Preferably, R¹⁰ to R¹³ may be independently selected from H, D, $C_1$-$C_4$-alkyl.

Preferably, R¹⁴ may be selected from H, methyl, halogen, more preferably R¹⁴, R¹⁵, and R¹⁶ may be independently selected from H, methyl, halogen. More preferably R¹⁴, R¹⁵, and R¹⁶ are chlorine.

Preferably, R¹⁴, R¹⁵, and R¹⁶ may be independently selected from H, D, CN, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{26}$-heteroaryl, more preferably, R¹⁴, R¹⁵, and R¹⁶ may be selected from methyl, phenyl, or substituted phenyl.

In a further preferred embodiment, R¹⁴ may be NR'₂, wherein R' may be independently selected from the group consisting of H, D, substituted or unsubstituted $C_1$-$C_{10}$-alkyl and substituted or unsubstituted $C_6$-$C_{32}$-aryl, and two R' may form a ring structure; R¹⁵ and R¹⁶ may be independently selected from H, D, CN, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl. More preferably R¹⁴ may be NR'₂, wherein R' may be independently selected from the group consisting of substituted or unsubstituted $C_1$-$C_{10}$-alkyl, two R' may form a ring structure; R¹⁵ and R¹⁶ may be independently selected from substituted or unsubstituted $C_1$-$C_{10}$-alkyl; substituted or unsubstituted $C_3$-$C_{10}$-cycloalkyl; substituted or unsubstituted $C_6$-$C_{32}$-aryl. Most preferably, R¹⁴ may be NR'₂, wherein R' may be methyl, ethyl, or two R' completing a morpholine; $R^{15}$ and $R^{16}$ are independently selected from methyl, ethyl, and benzyl.

In another preferred embodiment, $R^{14}$ may be OR', wherein R' is selected from the group consisting of H, D, substituted or unsubstituted $C_1$-$C_{10}$-alkyl; substituted or unsubstituted $C_3$-$C_{20}$-cycloalkyl; substituted or unsubstituted $C_6$-$C_{32}$-aryl; substituted or unsubstituted $C_2$-$C_{28}$-heteroaryl, SiR"$_3$, wherein R" is independently selected from the group consisting of substituted or unsubstituted $C_1$-$C_{10}$-alkyl and substituted or unsubstituted $C_6$-$C_{32}$-aryl, $R^{15}$ and $R^{16}$ may be independently selected from H, D, CN, substituted or unsubstituted $C_1$-$C_{20}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl. More preferably, $R^{14}$ may be OR', wherein R' is independently selected from the group consisting of H, D, substituted or unsubstituted $C_1$-$C_{10}$-alkyl, substituted or unsubstituted $C_3$-$C_{10}$-cycloalkyl, SiR"$_3$, wherein R" is independently selected from the group consisting of substituted or unsubstituted $C_1$-$C_{10}$-alkyl and substituted or unsubstituted $C_6$-$C_{32}$-aryl. $R^{15}$ and $R^{16}$ may be independently selected from substituted or unsubstituted $C_1$-$C_{10}$-alkyl; substituted or unsubstituted $C_3$-$C_{10}$-cycloalkyl; substituted or unsubstituted $C_6$-$C_{32}$-aryl. Most preferably, $R^{14}$ is OR', wherein R' is methyl, ethyl, benzyl, or trimethylsilyl; and $R^{15}$ and $R^{16}$ are independently selected from methyl, ethyl, phenyl, and benzyl.

In a further preferred embodiment, $R^{14}$ and $R^{15}$ may be OR', wherein R' is independently selected from the group consisting of H, D, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, $R^{16}$ may be selected from H, D, ON, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl. More preferably, $R^{14}$ and $R^{15}$ may be OR', wherein R' is independently selected from the group consisting of H, D, substituted or unsubstituted $C_1$-$C_{10}$-alkyl, substituted or unsubstituted $C_3$-$C_{10}$-cycloalkyl; and $R^{16}$ may be selected from substituted or unsubstituted $C_1$-$C_{10}$-alkyl; substituted or unsubstituted $C_3$-$C_{10}$-cycloalkyl; substituted or unsubstituted $C_6$-$C_{32}$-aryl. Most preferably, $R^{14}$ and $R^{15}$ may be OR', wherein R' is H, methyl, ethyl, or benzyl; and $R^{16}$ may be selected from methyl, ethyl, phenyl, and benzyl.

Preferably, $R^{17}$ may be selected from substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, substituted or unsubstituted $C_2$-$C_{20}$-alkynyl and substituted or unsubstituted $C_2$-$C_{20}$-alkenyl, OR', wherein R' is selected from the group consisting of H, D, substituted or unsubstituted $C_1$-$C_{10}$-alkyl; substituted or unsubstituted $C_3$-$C_{10}$-cycloalkyl; substituted or unsubstituted C-Car-aryl; substituted or unsubstituted $C_2$-$C_{28}$-heteroaryl, the substituent may contain the atoms necessary to complete a cyclic structure with one of $R^5$-$R^8$ or $R^{10}$-$R^{13}$ forming a phenanthrenequinone. More preferably, $R^{17}$ is selected from substituted or unsubstituted $C_1$-$C_{10}$-alkyl; substituted or unsubstituted $C_6$-$C_{32}$-aryl; OR', wherein R' is selected from the group consisting of H, substituted or unsubstituted $C_1$-$C_{10}$-alkyl. Most preferably, $R^{17}$ may be methyl, ethyl, phenyl, methoxy, or ethoxy.

Preferably, $R^{18}$ may be O or NR wherein R' is selected from substituted or unsubstituted $C_1$-$C_{20}$-alkyl ester; substituted or unsubstituted $C_6$-$C_{48}$-aryl ester. More preferably, R may be O or NR' wherein R' is substituted or unsubstituted $C_6$-$C_{48}$-aryl ester. Most preferably, $R^{18}$ may be O or NR' wherein R' is phenylester or tolylester.

Preferably, $R^{19}$ may be selected from substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, substituted or unsubstituted $C_2$-$C_{20}$-alkynyl and substituted or unsubstituted $C_2$-$C_{20}$-alkenyl, the substituent may contain the atoms necessary to complete a cyclic structure with one of $R^5$-$R^8$ or $R^{10}$-$R^{13}$ forming an anthracene, thioxanthone or fluorenone, more preferably $R^{19}$ may be selected from substituted or unsubstituted phenyl or naphthyl.

Preferably, $R^{20}$ and $R^{21}$ may be independently selected from substituted or unsubstituted $C_6$-$C_{32}$-aryl; substituted or unsubstituted $C_2$-$C_{28}$-heteroaryl, OR', wherein R' is selected from the group consisting of substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, more preferably $R^{20}$ and $R^{21}$ may be independently selected from phenyl, tolyl, methoxy, and ethoxy.

Preferably, $R^{22}$, $R^{23}$, and $R^{24}$ may be independently selected from the group consisting of H, D, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, more preferably $R^{22}$, $R^{23}$, and $R^{24}$ may be independently selected from methyl, ethyl, or phenyl.

Preferably, $R^{26}$ may be selected from substituted or unsubstituted $C_6$-$C_{32}$-aryl; substituted or unsubstituted $C_2$-$C_{26}$-heteroaryl, OR', wherein R' is selected from the group consisting of substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, more preferably $R^{25}$ may be selected from phenyl, tolyl, methoxy, and ethoxy.

Here halogen may be fluorine, chlorine, bromine, iodine.

Here alkyl, alkenyl, and alkynyl may be cyclic, linear, or branched.

Here alkyl acyl has the following formula

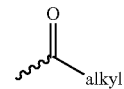

and arylacyl has the following formula aryl

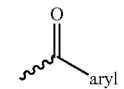

wherein the waved line represents the bond of the acyl group to the structure of formula (I)

In the case that one (or more) of the groups $R_1$-$R_{13}$ is selected as amide, the bond can be made via the N as well as via the CO.

In the case that one (or more) of the groups $R_1$-$R_{13}$ is selected as ester, the bond can be made via the O as well as via the CO.

In one embodiment, $R^3$, $R^4$, $R^8$, and $R^{10}$ are H and one of $R^5$, $R^6$, $R^7$, $R^{12}$ and $R^{13}$ is substituted or unsubstituted $C_2$-$C_{49}$-arylacyl.

In a further embodiment, $R^1$ and $R^2$ are independently selected from $C_1$-$C_{20}$-alkyl, alternatively $C_1$-$C_{12}$-alkyl, alternatively $C_1$-$C_8$-alkyl, alternatively $C_1$-$C_4$-alkyl, alternatively methyl.

In a further embodiment, $R^3$-$R^8$ and $R^{10}$-$R^{13}$ are independently selected from the group consisting of H, D, halogen, $NO_2$, CN, substituted or unsubstituted $C_2$-$C_{49}$-alkyl acyl; substituted or unsubstituted $C_2$-$C_{49}$-arylacyl, substituted or unsubstituted aryl, $NH_2$, and OH, wherein the one or more substituents, if present, are selected from halogen, $NO_2$, CN, $NH_2$ and OH.

In a further embodiment, it is provided that $R^3$-$R^8$ and $R^{10}$-$R^{13}$ are independently selected from the group consisting of H and electron withdrawing groups.

In all embodiments in which one or more of the groups $R^1$-$R^{13}$ are selected from halogen, it may be provided that the halogen is F (fluorine).

In one embodiment, $R^{12}$ and $R^{13}$ may be linked together to form a fused aromatic $C_6$-ring.

In one embodiment, two of $R^{10}$-$R^{13}$ may be linked together to form a fused aromatic $C_6$-ring and one of $R^5$-$R^9$ is selected from unsubstituted or substituted arylacyl; or unsubstituted or substituted alkylacyl.

In one embodiment $R^{10}$-$R^{13}$ are independently selected from the group consisting of H and electron withdrawing groups, and one of $R^5$-$R^8$ is selected from unsubstituted or substituted arylacyl; or unsubstituted or substituted alkylacyl.

Typical electron withdrawing groups may be CN, F, $NO_2$, ester groups, acyl groups, $SO_2R$, such as $SO_2CF_3$, $SO_2Me$, or $SO_2NH_2$, $SF_5$, $NR_3^+$, pyridinium, halogen, and fluorinated alkyls or aryls, such as $CF_3$.

In one embodiment at least one of $R^5$-$R^8$ is independently selected from the group consisting of electron donating groups, alternatively alkoxy, alternatively $R^8$ is methoxy and at least one of $R^5$-$R^8$, $R^{10}$-$R^{13}$ is selected from unsubstituted or substituted arylacyl; or unsubstituted or substituted alkylacyl.

Typical electron donating groups may be SH, SR, OH, OR, $NH_2$, NHR, and $NR_2$.

In one particular embodiment it may be provided that $R^6$, $R^7$ and $R^{12}$ are independently selected from the group consisting of $CF_3$, $SO_2Me$, $SO_2NH_2$, CN, F, $NO_2$, C-aryl, unsubstituted $C_6$-arylacyl of the following formula

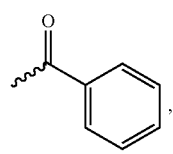

dimethoxy-substituted arylacyl of the formula

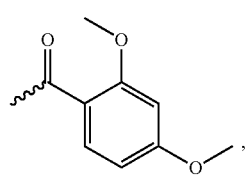

methoxy-substituted arylacyl of the formula

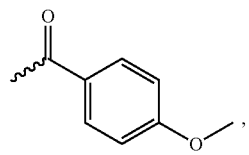

fluorine-substituted arylacyl of the following formula

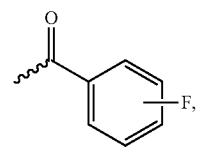

alternatively of the formula

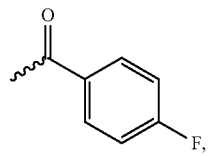

and $C_6$-aryl.

In a further embodiment it may be provided that $R_9$ is selected from the group consisting of $C_1$-$C_{20}$-alkyl and $C_6$-$C_{48}$-aryl, alternatively $C_1$-$C_8$-alkyl and $C_6$-$C_{18}$-aryl, alternatively $C_1$-$C_4$-alkyl and $C_6$-$C_{12}$-aryl, alternatively methyl, benzyl and phenyl.

In an embodiment, the dual color photoinitiator may be linked to a polymerizable group. The polymerizable group may be selected from the group consisting of (meth)acrylate, acrylamide, vinylether, and vinylester, preferably (meth)acrylate.

In another embodiment, two or more dual color photoinitiators may be linked to each other by a linker group. The chemical bond(s) to the linker group may be independently established by any of $R^2$-$R^{13}$, preferably by $R^9$.

In a further embodiment, it is provided that $R^{10}$-$R^{13}$ are independently selected from the group consisting of H and electron withdrawing groups and $R^3$-$R^8$ are independently selected from the group consisting of H and substituents belonging to the following formulae:

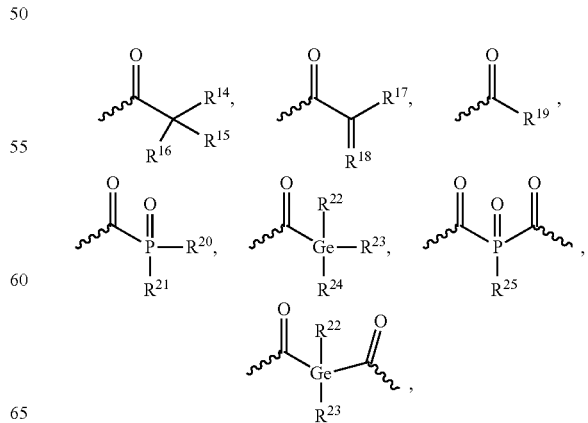

more specific $R^{12}$ electron is an withdrawing group, and $R^6$ is substituted or unsubstituted arylacyl wherein arylacyl group can be unsubstituted or substituted with electron withdrawing or electron donating substituents, such as:

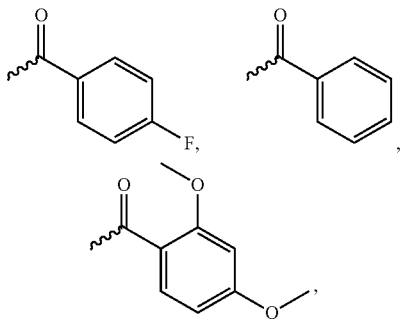

alternatively, $R^6$ is α-aminoacyl, α-hydroxyacyl, or α-alkoxyacyl:

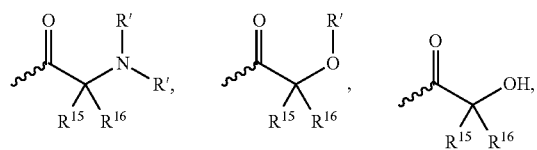

In a further embodiment, it is provided that at least two of $R^3$-$R^8$ and $R^{10}$-$R^{13}$ are independently selected from substituents belonging to the following formulaes:

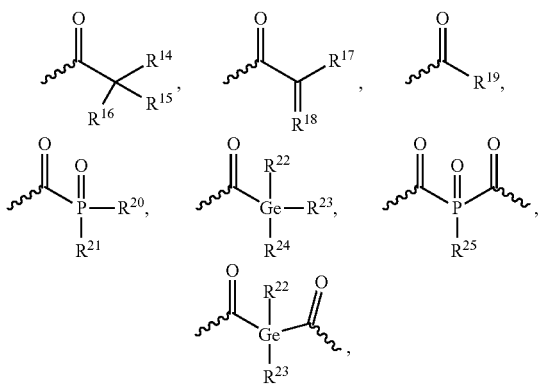

more specific $R^6$ and $R^{12}$ are substituted or unsubstituted arylacyl, alternatively $R^6$ and $R^{12}$ are alpha-aminoacyl, alpha-hydroxyacyl, or alpha-alkoxyacyl:

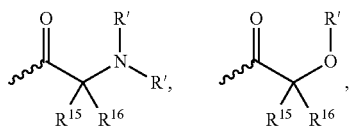

wherein R', $R^{15}$, $R^{16}$ are independently selected from the group of H, D, unsubstituted or substituted aryl; or unsubstituted or substituted alkyl, more preferred from methyl, ethyl, benzyl, phenyl, tolyl. Two R' may form a ring structure.

In a further embodiment, it is provided that one of the substituents $R^3$-$R^8$ and $R^{10}$-$R^{13}$ selected from substituents belonging to the following formulaes:

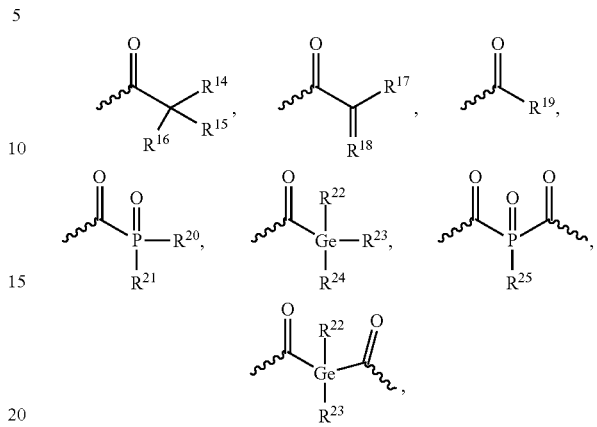

wherein one of the substituents $R^{14}$-$R^{25}$ contains the atoms of a second photoswitchable group.

In a further embodiment, it may be provided that one of the substituents $R^1$-$R^{13}$ contains a functional group which increases the solubility in water. Such functional groups may be in particular ionic functional groups forming salts, such as ammonium or sulfonate; polyethyleneglycols, or polar functional groups, such as OH, $NH_2$, $SO_2NH_2$.

In one embodiment, $R^5$ and $R^7$ are independently selected from the group consisting of H and electron donating groups, more preferred H, methyl, methoxy and $R^6$ is of the following formula:

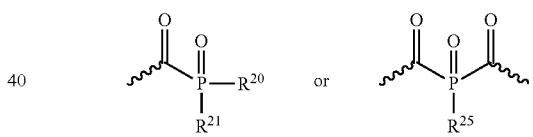

wherein $R^{20}$ and $R^{21}$ or $R^{25}$ are independently selected from aryl or alkoxy, more preferred from phenyl, ethoxy, methoxy.

In a further embodiment, it is provided that $R^{10}$-$R^{13}$ are independently selected from the group consisting of H and electron withdrawing groups and $R^5$-$R^8$ are independently selected from the group consisting of H and substituents belonging to the following formulaes:

wherein $R^{14}$-$R^{15}$ are independently selected from halide, alkyl, or aryl, more preferred from chlorine, methyl, ethyl, phenyl tolyl.

In a particularly preferred embodiment, the photoinitiator molecules used in the process according to the invention comprise one or more of the following compounds 1 to 80.

21
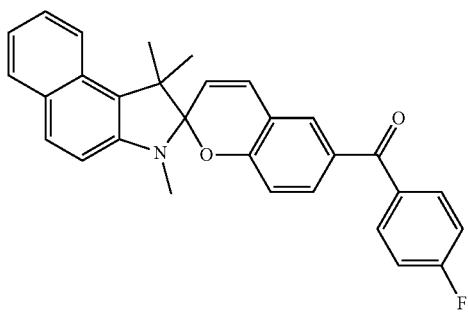
22
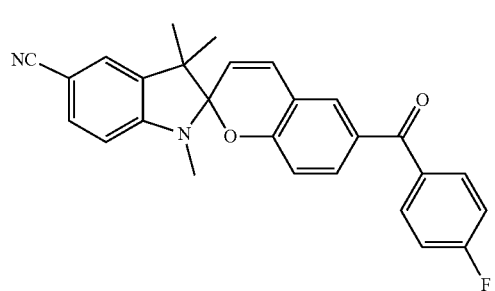
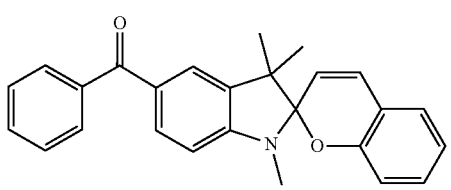
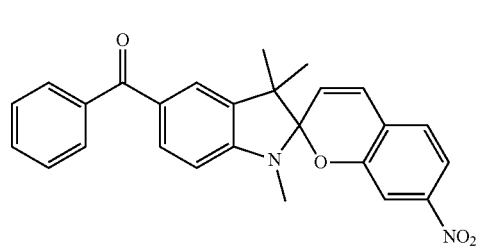
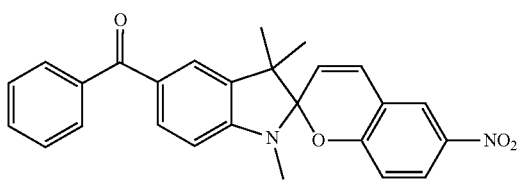
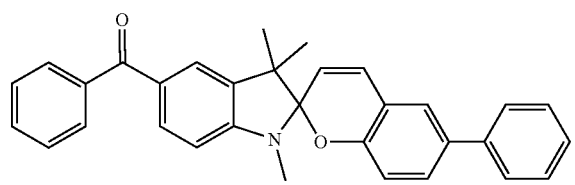
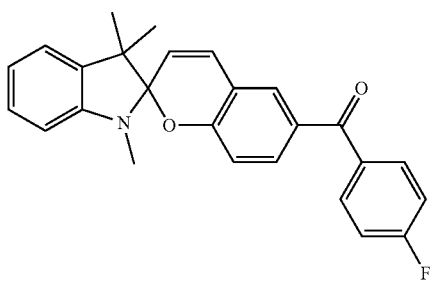
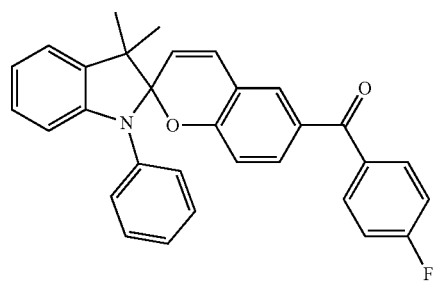
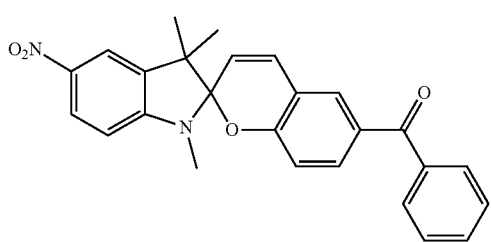
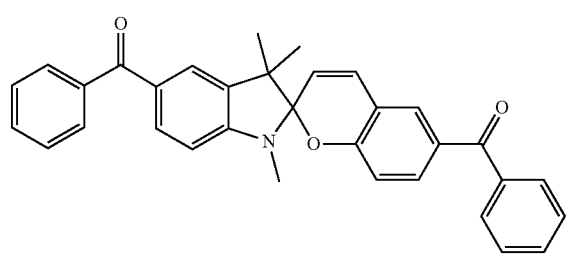
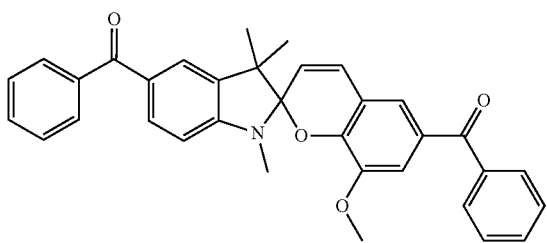
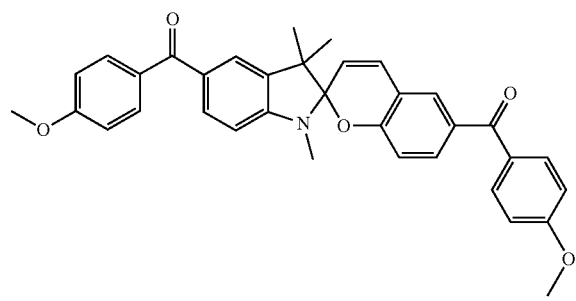

13
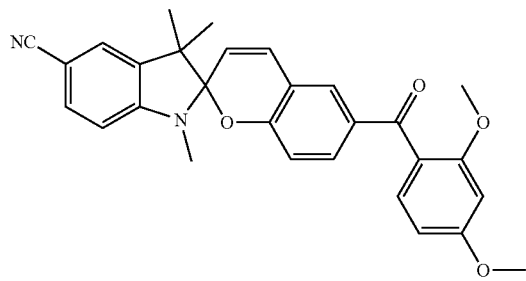
14
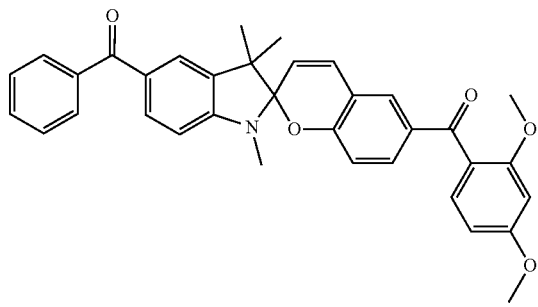
15
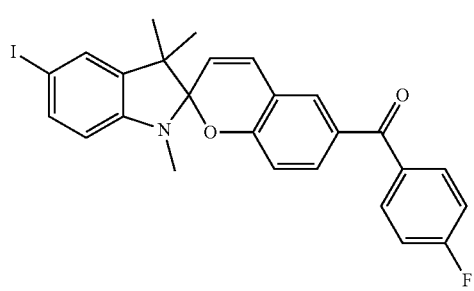
16
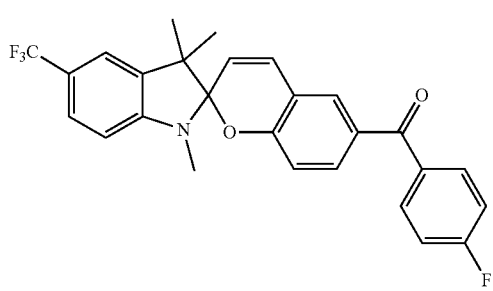
17
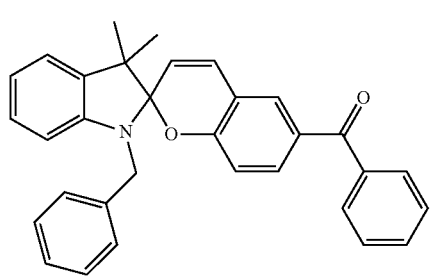
18
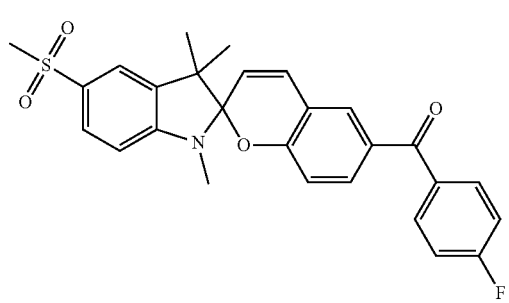
19
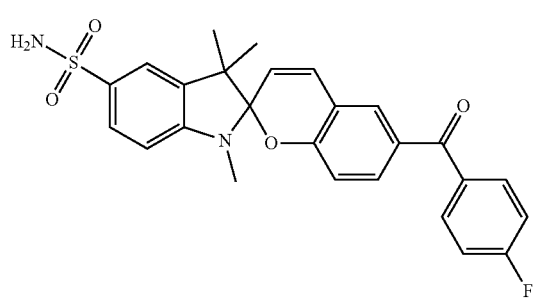
20
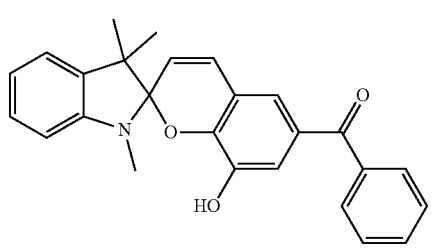
21
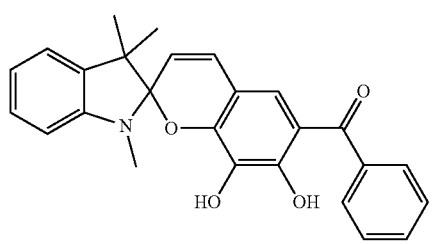
22
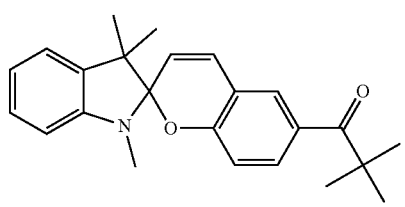

-continued
23
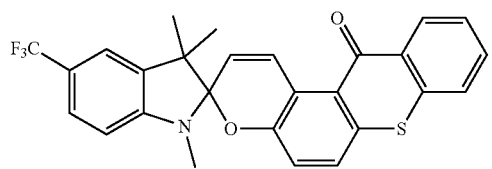
24
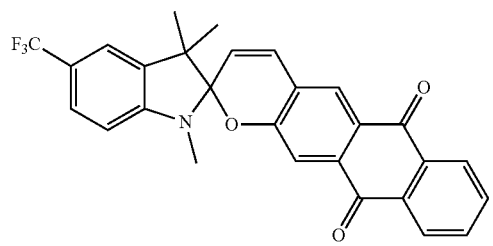
25
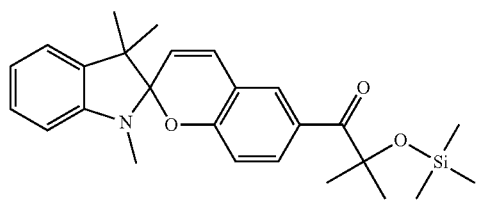
26
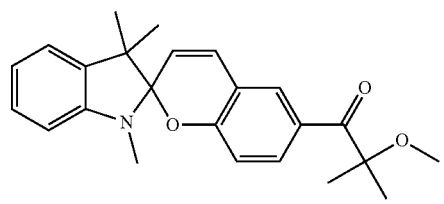
27
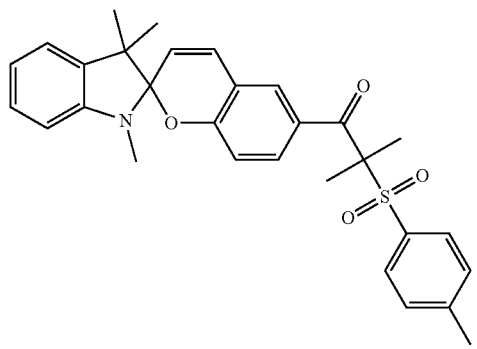
28
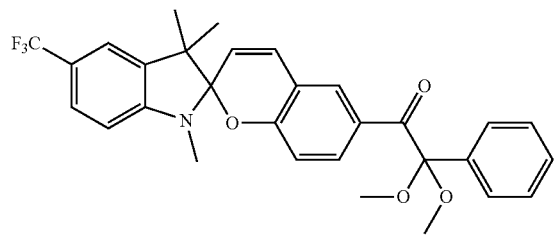
29
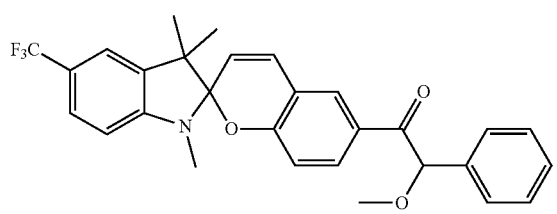
30
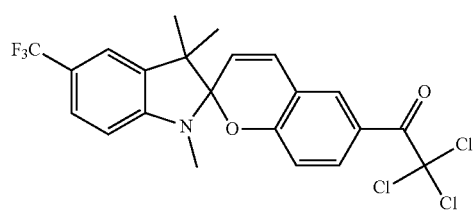
31
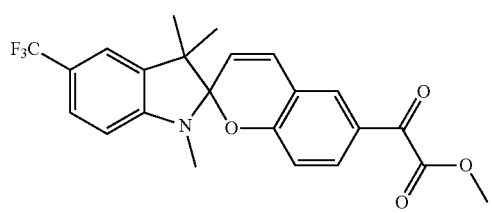
32
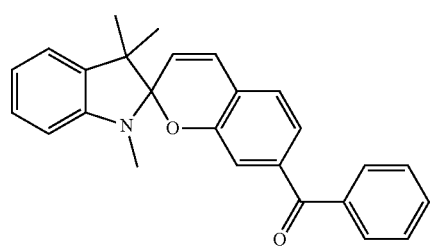
33
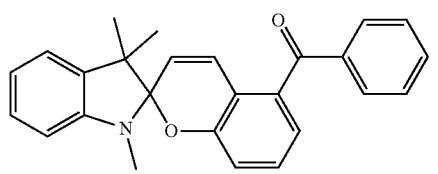
34
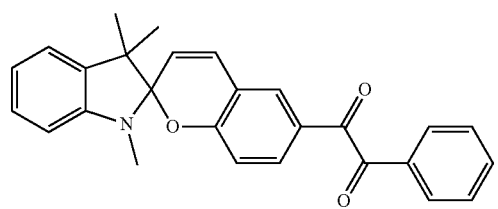

35 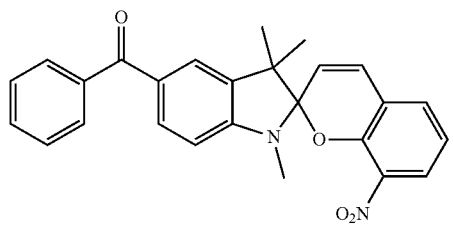
36 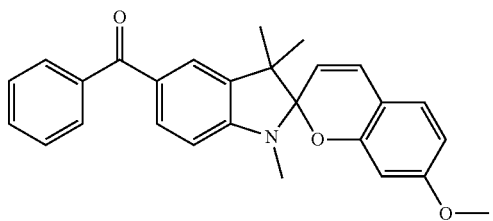
37 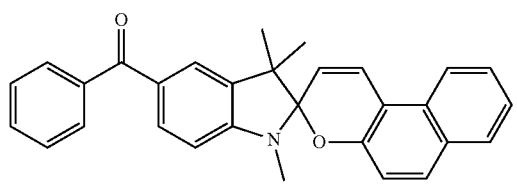
38 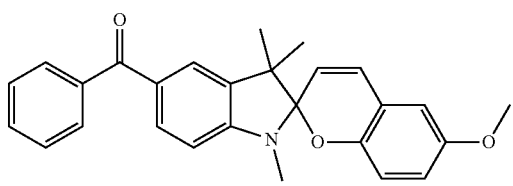
39 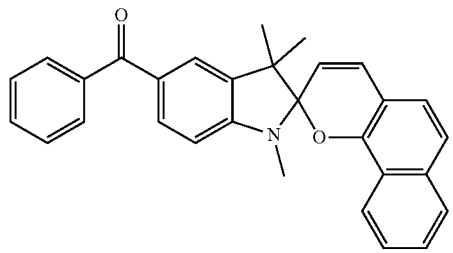
40 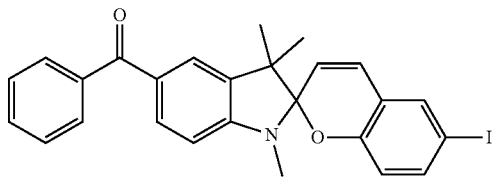
41 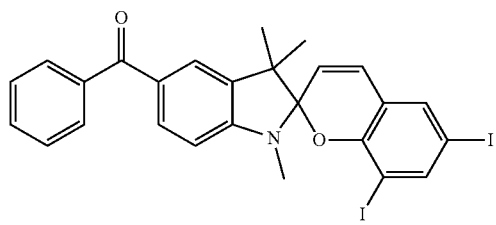
42 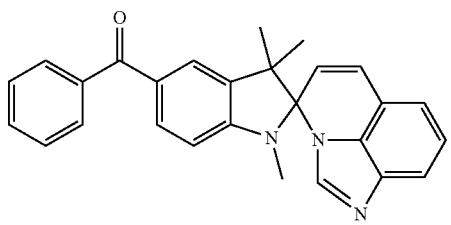
43 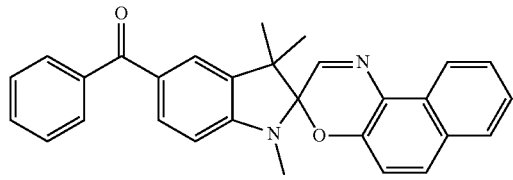
44 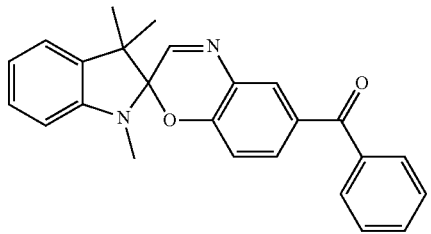
45 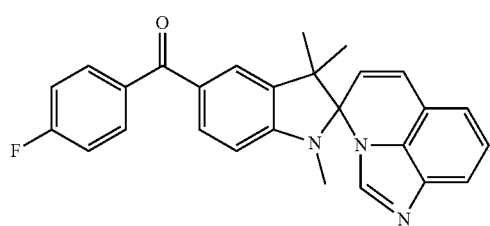
46 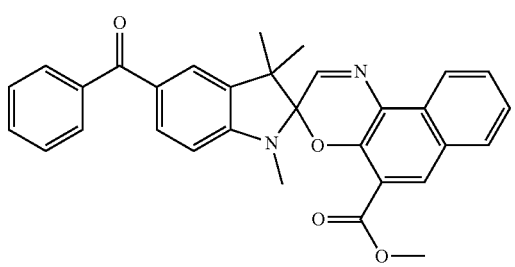
47 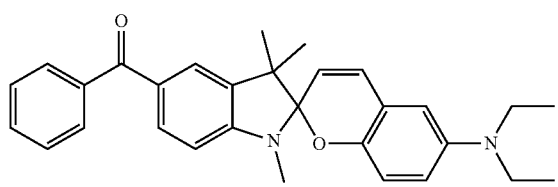
48 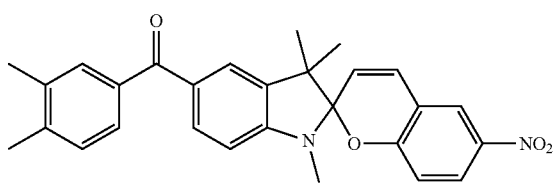

-continued
49
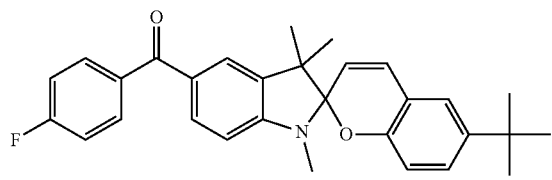
50
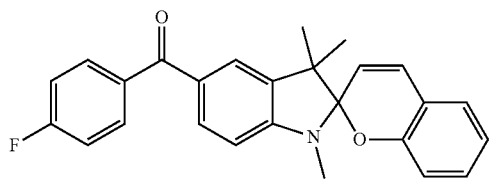
51
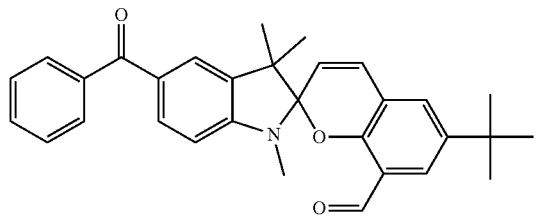
52
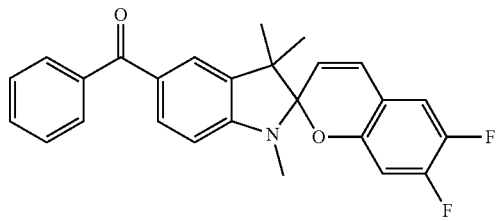
53
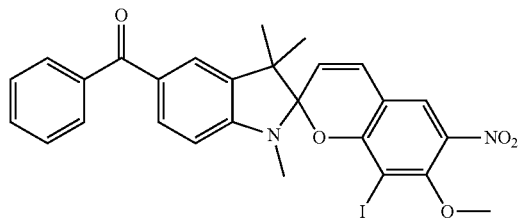
54
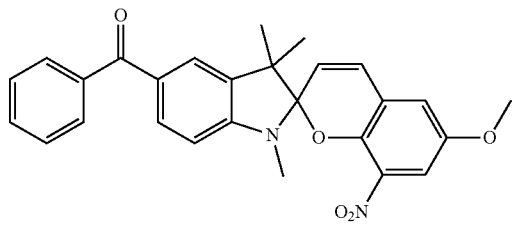
55
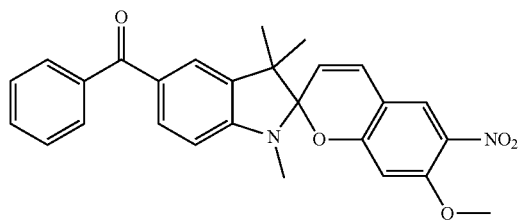
56
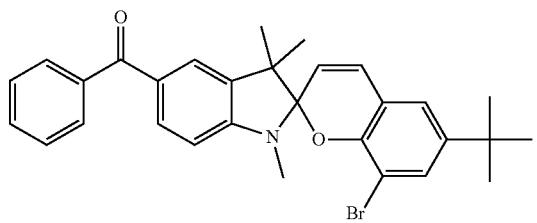
57
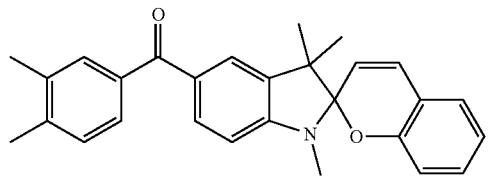
58
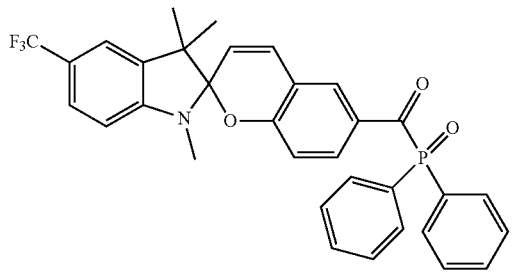
59
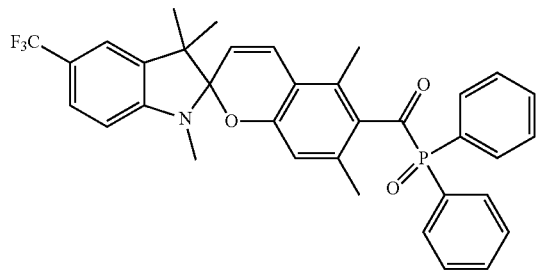
60
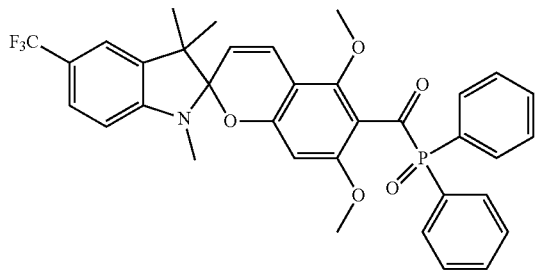

61
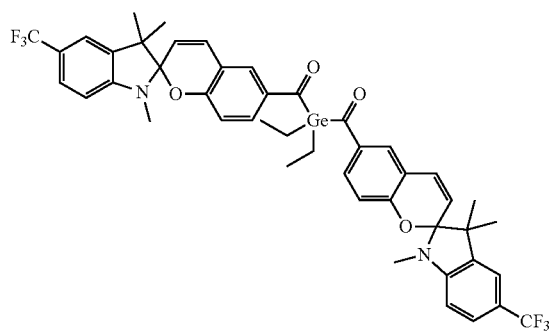
62
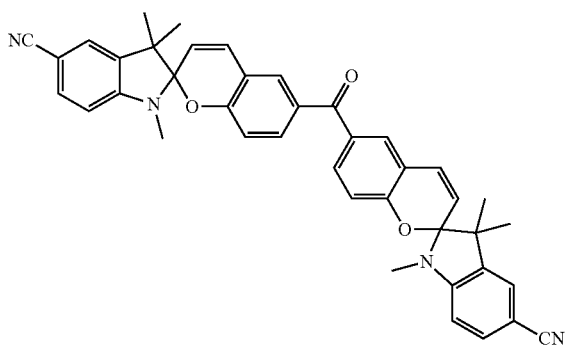
63
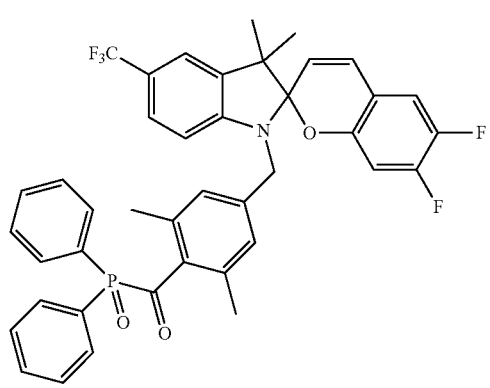
64
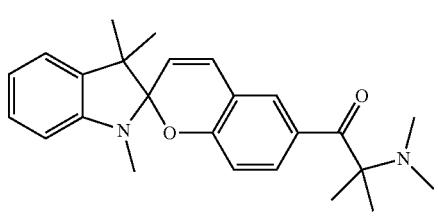
65
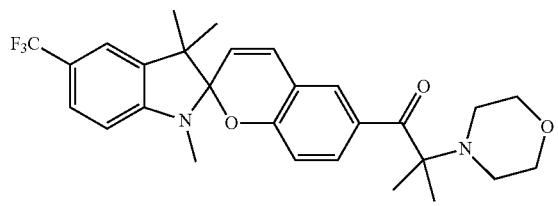
66
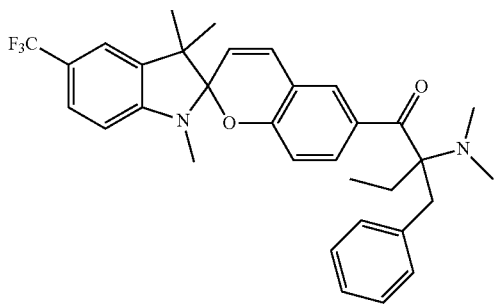
67
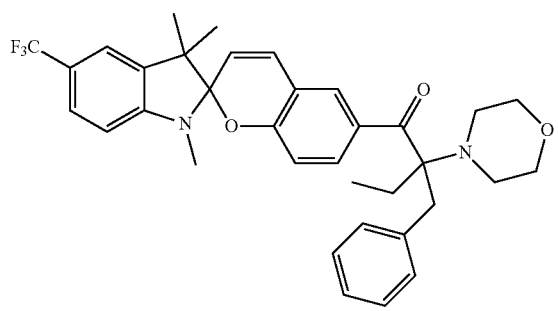
68
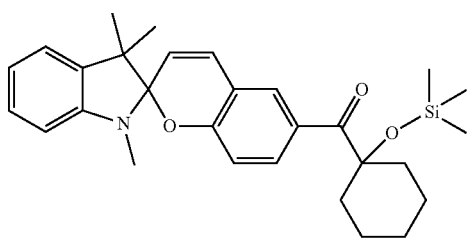
69
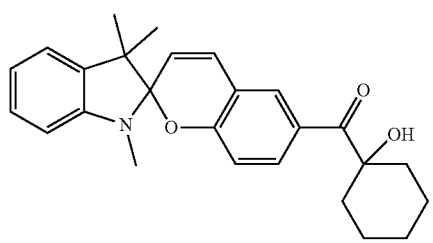
70
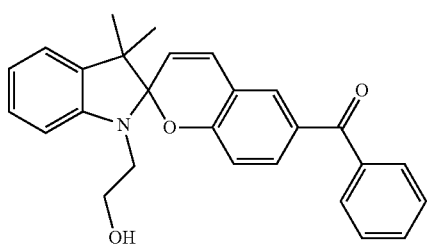

-continued
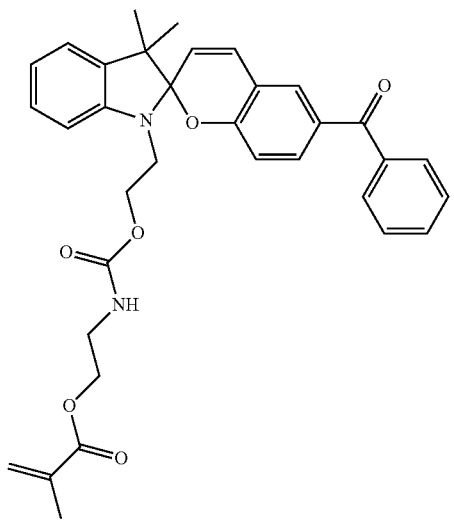
71
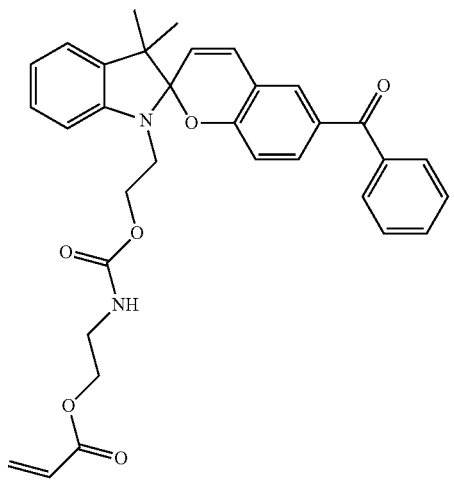
72
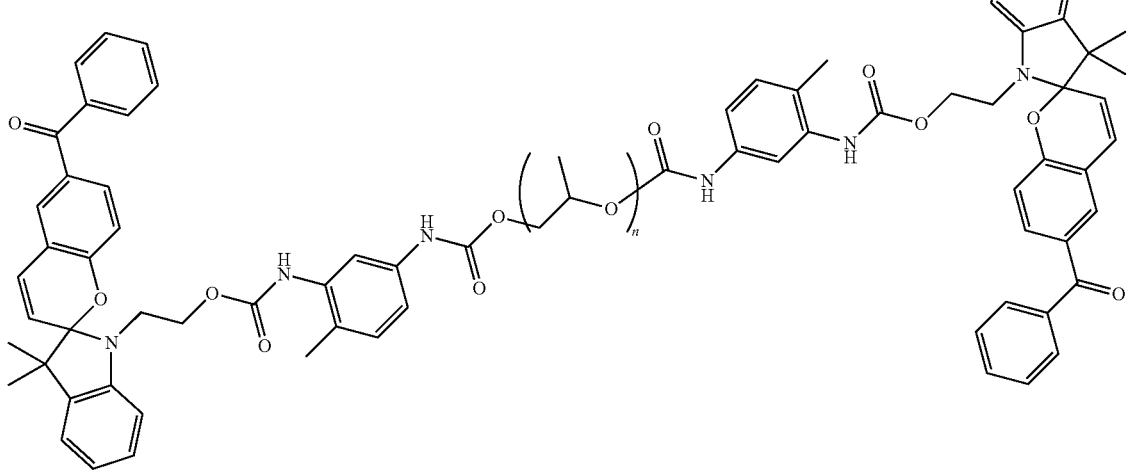
73
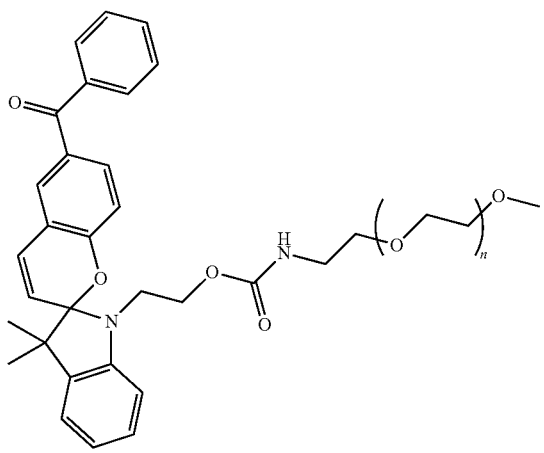
74
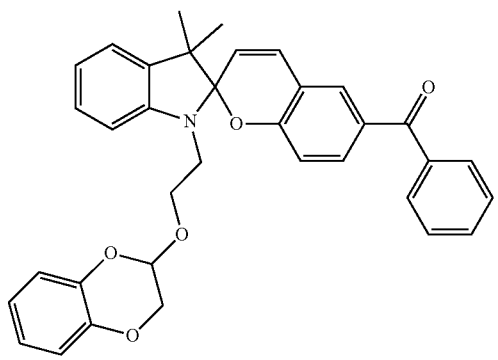
75

-continued

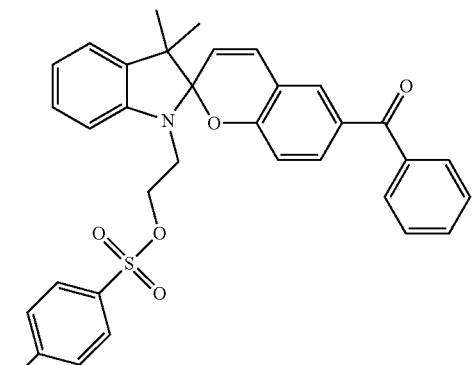
76

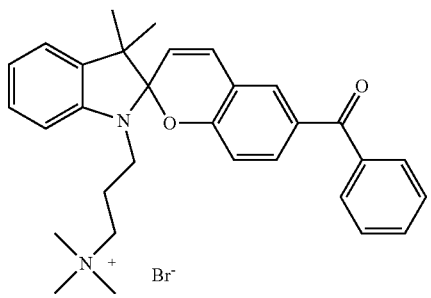
77

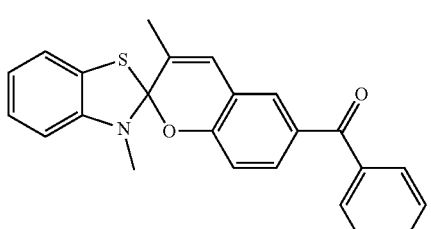
78

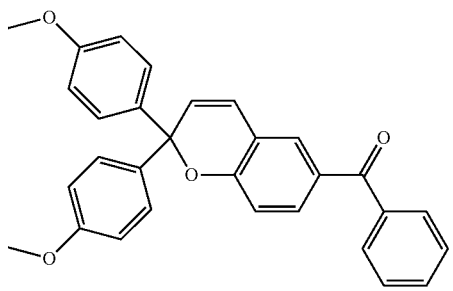
79

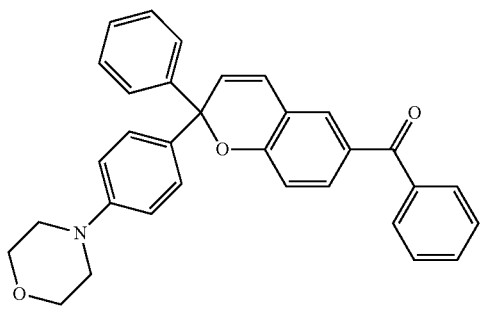
80

Alternatively, the photoinitiator molecules comprise one or more of the compounds, or the photoinitiator molecules consist of one or more of the compounds.

According to the invention, it may be intended that two or more of the above-mentioned embodiments are combined with each other.

Due to the absorption of the light of the second wavelength, the photoinitiator molecules can be converted into a reactive state which triggers a radical polymerization in the local volume.

A light beam of light of the first wavelength and a light beam of light of the second wavelength can be irradiated in the local volume at least partially overlapping.

The starting material can be polymerized in several local volumes by means of photo polymerization and thus a three-dimensional shaped body can be produced in the starting material.

In conjunction with the apparatus for local polymerisation of the starting material, the compounds shown above may be used in connection with the process for locally polymerizing a starting material by dual color photopolymerization. The same applies to the process for 3D-printing of the moulded body or the method for volumetric printing of a shaped body.

Formulations suitable for volumetric printing may contain the following parts by weight:

1-99.9999 wt %, preferably 5-99.99 wt %, more preferably 20-99.9 wt % of photopolymerizable compound(s), e.g. monomer(s);

0-99 wt %, preferably 1-50 wt %, more preferably 3-20 wt % co-initiator, when the co-initiator contains photopolymerizable groups, e.g. acrylates;

0-50 wt %, preferably 1-40 wt %, more preferably 3-10 wt % of co-initiator, when the co-initiator does not contain photopolymerizable groups;

0.0001-20 wt %, preferably 0.001-10 wt %, more preferably 0.01-5 wt %, most preferably 0.1-1 wt % of dual color photoinitiator;

0-20 wt %, preferably 1-0 wt %, more preferably 3-5 wt % of acids or bases;

0-90 wt %, preferably 1-70 wt %, more preferably 5-50 wt %, most preferably 10-30 wt % of other additives, such as organic or inorganic fillers, optical brighteners, inhibitors, chain transfer agents and others; and 0-80 wt %, preferably 5-50 wt %, more preferably 10-30 wt % of solvent.

All weight ratios are given with respect to the weight of the total formulation.

Typical curing parameters which are suitable for volumetric printing may be:

any setup which employs light of two different wavelengths;
a temperature of −2° C. to +100° C.; preferably 0° C. to +60° C., more preferably +20° C. to +60° C.
a first wavelength of: 250 nm to 500 nm; preferably, 300 nm to 450 nm and
a second wavelength of: 350 nm to 800 nm.

To prevent migration and release of remaining dual color initiators and/or their reaction products from the cured object the following measures are disclosed:
a) Substitution in away, that the molecular weight exceeds 1000 g/mol
b) Binding of the initiator to a structure of higher molecular weight, such as an oligomer or a polymer
c) Functionalization of the initiator with polymerizable groups, which are build in the polymer network during curing, these include but are not limited to: acrylates, acrylamides, methacrylates, thiol+ene, epoxides, oxiranes, oxetanes, vinylethers The dual color initiators are disclosed for curing any resin which contains molecules that bear a functional group which can be polymerized via a radical mechanism, these include but are not limited to derivatives of acrylate, methacrylate, acrylamide, thiol+ene, vinylacetate.

The disclosed dual color photoinitiators allow volumetric printing, both, due to their tunable thermal back reaction and their capability to initiate a polymerization only where light of both wavelengths interacts with the resin volume. The dual color initiators are not limited to a specific setup, but to give an illustrative example which shows the necessity of the thermal back reaction the following setup can be used: Volumetric printing can be conducted in a setup, which consists of a light sheet generator, a projector, a container that has four transparent sides and contains the resin including at least one of the disclosed dual color photoinitiators and a moveable stage to move either the container or the light sheet generator. Such a setup ensures a fast curing process over the whole volume, compared to the point by point setups described by Swainson [Swainson, U.S. Pat. Nos. 4,041,476, 4,078,229, 4,238,840, 4,466,080, 4,471,470, 4,333,165]. One layer of a volume is irradiated with electromagnetic radiation of a first wavelength to switch the dual color photoinitiators from A to B. An image is projected on that layer from a different direction, using electromagnetic radiation of the second wavelength, which induces a photopolymerization, where image and layer overlay. After a given amount of time, the electromagnetic radiation of the first wavelength is shifted to a neighboring layer and the next image is projected on this layer with electromagnetic radiation of the second wavelength. In the previous layer no further polymerization occurs due to the fast thermal back reaction to the A form, which causes a deactivation for electromagnetic radiation of the second wavelength. After a number of iteration steps, the 3-dimensional object is cured in the volume and can be taken out, or the residual resin can be washed away. The remaining object can be subjected to a post-processing.

In another aspect of the invention a sensitizer can be used to induce the switching from A to B. The sensitizer absorbs at a wavelength, where both forms A and B of the dual color initiators show minimal or no absorption. When the sensitizer is excited by electromagnetic radiation of a first wavelength, energy transfer to the dual color initiator in form A occurs. The excited dual color initiator form A then switches to the B form. B absorbs electromagnetic radiation of the second wavelength and initiates the polymerization via form C. The usage of a sensitizer is beneficial, where the absorbance at the first wavelength changes during the irradiation process, so that a homogenous switching and curing can be assured over the whole light path of the first wavelength. Furthermore, utilizing a sensitizer allows to apply higher concentrations of the dual color initiator without increasing the absorbance at the first wavelength. A sensitizer can also allow for a larger object size, due to the more homogenous curing. Typical sensitizers known in the field can be used and include but are not limited to derivatives of
a) transition metal complexes such as trisbipyridine ruthenium complexes, zinc porphyrin complexes, iridium complexes, rhenium complexes, or platinum complexes;
b) boron dipyrromethene:
c) iodo or bromo substituted organic chromophores, such as Rose Bengal or Eosin B;
d) carbonyl compounds, such as naphthalene diimides, acetophenone, anthraquinone, thioxanthone, camphor quinone, benzophenone, diacetyl compounds, coumarin, benzylideneacetone, dibenzylideneacetone; and
e) polycyclic aromatic compounds, such as anthracene, pyrene, or fullerene.

Sensitizers according to d) and e) are particularly preferred.

Where type 2 dual color initiators are employed the co-initiator can be chosen from typical hydrogen donors or electron donors known in the field, which include but are not limited to derivatives of ethanolamine, aminobenzoic acid, germanes, thiols, alcohols, ethers, thioethers, silanes, phosphines, acetals, dialkylanilines, N-phenylglycine, arylsulfinates, iodonium salts, sulfonium salts, and organoborate salts.

The co-initiator can be of high molecular weight, such as >1000 g/mol, or bound to a polymer to prevent migration in the cured object. The co-initiator can contain polymerizable groups, such as acrylates or methacrylates which are built into the polymer network during curing to prevent later migration of the co-initiator. A typical example is the following:

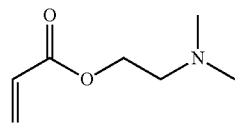

For the dual color volumetric printing approach, it is advantageous to control the viscosity of the resin. For type 2 initiators a high amount of co-initiator influences the viscosity of the resin. Therefore, it is beneficial in some cases to use co-initiators with a specific viscosity or mixtures of common co-initiators with low viscosity and highly viscous co-initiators. While co-initiators of low viscosity are commercially available, there is a lack for highly viscous co-initiators.

A highly viscous co-initiator is composed of a moiety which causes the high viscosity and a part which serves as a hydrogen donor. To achieve high viscosity one structural motif relies on a backbone, which is geometrically unable to build up enough intermolecular interactions to become solid. Due to the high molecular weight, the movement is restricted, which results in high viscosity. Another structural motif is based on multiple hydrogen bonds as in urethane containing mixtures. To ensure on the one hand well mixing with the monomer composition and on the other hand high reactivity the backbone of the co-initiator may be of a similar structure as the backbone which bears the monomer functionalities. Therefore, it can be beneficial to utilize a co-initiator which is based on a urethane structure together with a monomer composition that contains urethane moieties. It can be beneficial to utilize a co-initiator which is based on a bisphenol structure in combination with a monomer composition that also contains bisphenol moieties.

Typical structures of highly viscous and reactive co-initiators in bisphenol containing resins suitable for volumetric printing are the following:

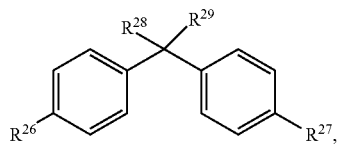

wherein $R^{28}$ and $R^{29}$ may be independently selected from H, D, alkyl, branched alkyl, substituted alkyl, and cycloalkyl, preferably one or both are methyl, ethyl and/or hydrogen. $R^{26}$ and $R^{27}$ may be independently selected from OH, OD, alkyl ether, aryl ether, ester, or the following structures:

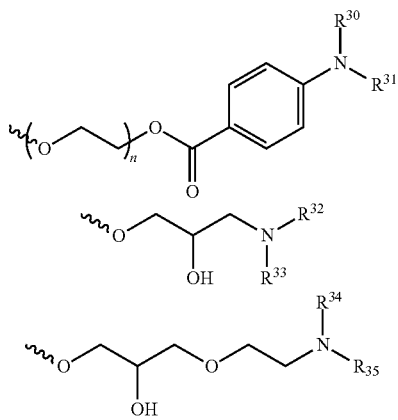

wherein $R^{30}$ to $R^{35}$ are independently selected from H, D, alkyl, aryl, more specifically $R^{30}$ to $R^{35}$ are independently selected from methyl, ethyl, ethyl-OH, (—CH$_2$—CH$_2$—OH), and phenyl; or $R^{30}$ and $R^{31}$, $R^{32}$ and $R^{33}$, $R^{34}$ and $R^{35}$ may contain the atoms necessary to form a cyclic structure, more specific examples include but are not limited to: morpholine, pyrrolidine, piperidine, piperazine, thiomorpholine, thiomorpholine dioxide, indoline, hydroquinolines, azaadamantane, diarylamine, carbazole, phenoxazine, and phenothiazine.

Where the monomer composition consists of urethane moieties, typical structures are the following:

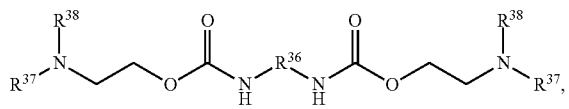

wherein $R^{36}$ is selected from substituted or unsubstituted aryl, substituted or unsubstituted alkyl, cyclic alkyl, polyester, and polyether, $R^{37}$ and $R^{38}$ are independently selected from substituted or unsubstituted aryl, substituted or unsubstituted alkyl, cyclic alkyl, preferably —CH$_2$—CH$_2$—OH (ethanol), H, D, methyl, butyl, ethyl-hexyl, and phenyl. Furthermore, $R^{37}$ can have the following structure:

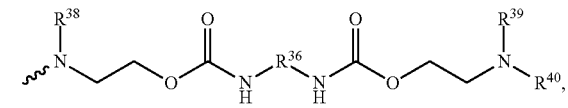

wherein $R^{39}$ and $R^{40}$ are independently selected from substituted or unsubstituted aryl, substituted or unsubstituted alkyl, cyclic alkyl, preferably —CH$_2$—CH$_2$—OH (ethanol), H, D, methyl, butyl, ethyl-hexyl, and phenyl. Alternatively, $R^{40}$ can be the same as $R^{37}$.

The co-initiators described above can be used as mixtures which result from a different degree of functionalization. The reactivity and viscosity can be controlled by application of suitable ratios of backbone precursor (bisphenol diglycidyl ether, bisphenol ethoxylate, diisocyanate) and amine source, wherein the amine source has at least two reactive functionalities, such as triethanolamine or any diethanolamines.

Suitable acids may be weak acids, such as acetic acid, formic acid, benzoic acid, or strong acids, such as trifluoroacetic acid.

Suitable bases may be amines, such as diisopropylethylamine, triethylamine, 1,8-diaza-bicyclo[5.4.0]undec-7-ene (DBU, 1,5-diazabicylo[4.3.0]non-5-ene (DBN), 1,5,7-triazabicyclo[4.4.0]dec-5-en (TBD), 2,6-di-tert-butylpyridine, and 1,4-diazabicycle-[2.2.2]octan (DABCO).

Suitable solvents may be water or ethyl acetate. The formulation suitable for volumetric printing may be preferably free of solvent.

Any combinations of embodiments, preferred ranges and/or moieties, in particular, preferred moities of the invention are particularly preferred.

BRIEF DESCRIPTION OF DRAWINGS

In the following, further design examples are explained with reference to figures in a drawing, wherein

FIG. 1 schematically shows an embodiment of the invention. By means of a first light source 10 a light with a first wavelength is generated and irradiated onto a structure comprising a curable composition 14. The assembly is a layered assembly comprising a light-blocking layer 11 and two transparent layers 12. The assembly further comprises a spacer 13. In the space formed by the two transparent layers 12 and the spacer 13, the curable composition 14 corresponding to the polymerizable starting material and containing one or more photoinitiator molecules according to the invention is introduced. The layered structure further comprises two light-blocking layers 11 arranged so that at least a portion of the curable composition 14 can be irradiated by both the light of the first wavelength generated by the first light source 10 and a light of a second wavelength generated by the second light source 15. The region of the curable composition 14 which can be irradiated both by light from the first light source 10 and by light from the second light source 15 is cured according to the mechanism described herein.

FIGS. 2 and 3 show a further embodiment of the invention in which a part of a curable composition 24, 34, is cured, which is simultaneously irradiated both by light from a first light source 20, 30 and light from a second light source 25, 35 through holes 23, 33 in light-blocking layers 21, 31 which partially shield the curable composition 24, 34 from the respective light sources 20, 30 and 25, 35, respectively. The curable composition 24, 34 is here arranged in a transparent container 22, 32. In this version it is provided that the light source 20, 30 is arranged orthogonally with respect to the second light source 25, 35. In principle, however, other angles are also provided here according to the invention.

Figure 1:
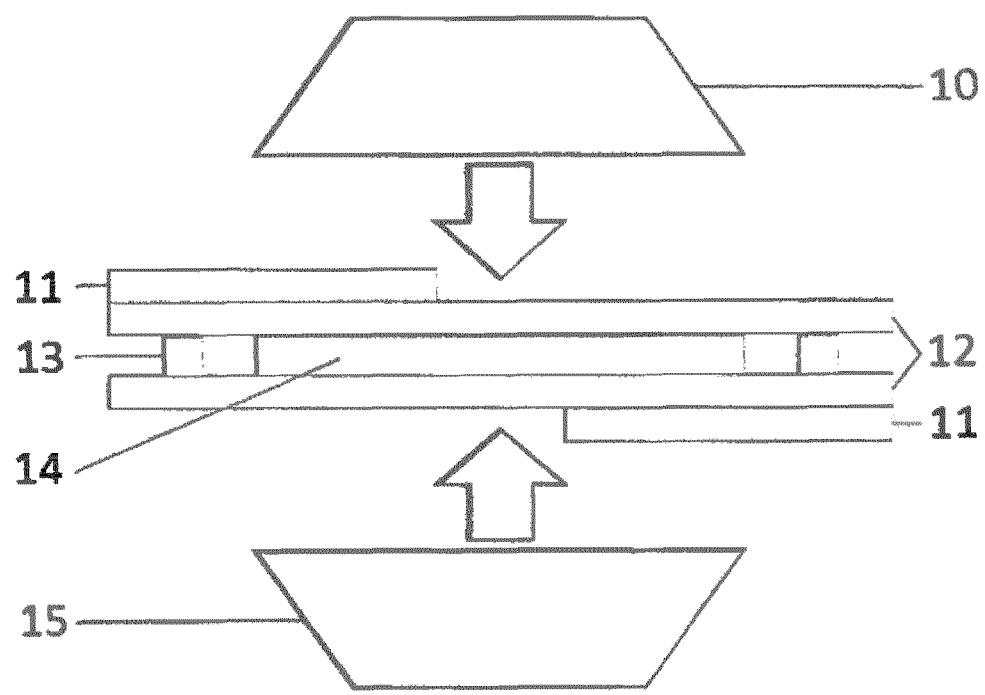
FIG. 1 shows a schematic representation of an embodiment of the process according to the invention.

In one embodiment, a process for local polymerization of a polymerizable starting material by means of dual color polymerization is provided. In dual color polymerization, photoinitiator molecules, which can also be designated as mediator molecules, absorb photons of light of different wavelengths in order to convert the photoinitiator molecules from the initial state via an intermediate state into a reactive state which is suitable for locally initiating or initiating a polymerization reaction in the polymerizable starting material so that the starting material is polymerized, up to hardening or curing, in particular in the case of plastics.

The mediator molecule, in the following also called photoinitiator molecule, and its necessary function can be produced in different ways. One example provides the following:

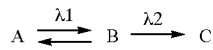

The photoinitiator can exist in three different states, which are characterized as follows:

Initial State (A):
  Without light irradiation the photoinitiator molecules are present in this state.
Intermediate State (B):
  The B state is an electronic ground state.
  The intermediate state is created from the initial state A by absorption of light of wavelength $\lambda_1$.
  The photoinitiator molecules have a new or more intense absorption band for light of wavelength $\lambda_2$.
  Alternatively, the absorption band for $\lambda_1$ disappears. The photoinitiator molecule returns to the initial state A spontaneously in the absence of light or by absorption of light of wavelength $\lambda_3$.
Reactive State (C):
  The reactive state is generated from the intermediate state B by absorption of light of wavelength 4.
  The reactive state initiates a polymerization reaction in the immediate vicinity of the molecule.
  A back reaction to B is not intended.

EXAMPLES

Hereinafter, the action and effect of the invention will be described in detail through specific examples of the invention. However, the examples are provided only to illustrate the present invention, and the scope of the invention is not limited thereto.

Synthesis

Numbering Scheme for Spiropyrans

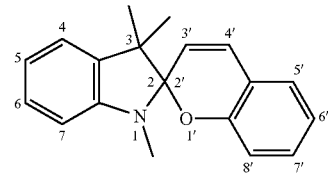

General synthesis of spiropyrans, spirooxazines, spiro-imidazoquinoline-indolines, benzothiazoles (Compounds 1-1, 13-21, 28, 29, 31-57, 62, 64, 70, 77, 78)

The indolene (1 mmol) or benzothiazole precursor (1 mmol) is dissolved in ethanol (5 mL). Where the indolenium salt or benzothiazolium salt is used, the salt (1 mmol) and piperidine (1.5 mmol) are dissolved in ethanol (5 mL) and stirred for 15 min. The salicylaldehyde (mmol) or the ortho-nitrosophenol (1 mmol), or the 1H-benzo[d]imidazole-4-carbaldehyde (1 mmol) is added and the mixture is heated to 70° C. until consumption of starting materials. After cooling to room temperature, the product precipitates or water is added to precipitate the product. The solid is filtered and washed with ethanol or water. Where the filtration procedure does not yield pure product, the aqueous mixture is extracted with dichloromethane. The combined organic layers are dried over anhydrous $MgSO_4$ and the solvent is evaporated under reduced pressure. The solid residue is purified by recrystallization from ethanol or silica gel column chromatography using acetone/petroleum ether mixtures as eluent.

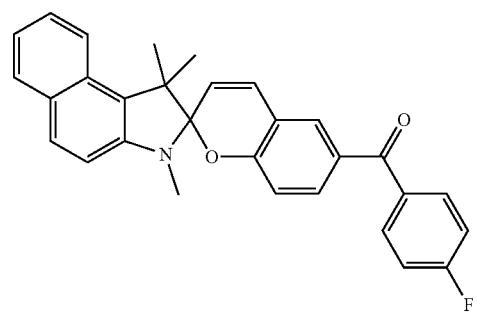

1

$^1$H NMR (500 MHz, Chloroform-d) δ 7 (dd, J=8.6, 1.0 Hz, 1H), 7.86-7.76 (m, 4H), 7.64 (d, J=2.1 Hz, 1H), 7.58 (dd, J=8.5, 2.2 Hz, 1H), 743 (ddd, J=8.5, 6.7, 1.4 Hz, 1H), 7.28-7.23 (m, 1H), 7.16 (t, J 8.6 Hz, 2H), 7.03-6.95 (m, 2H), 6.75-6.71 (m, 1H), 5.87 (d, J=10.3 Hz, 1H), 2.87 (s, 3H), 1.68 (s, 3H), 1.38 (s, 3H). ESI-MS [M+H]$^+$ m/z calculated for $C_{30}H_{25}FNO_2^+$: 450.186 measured: 450.197.

2

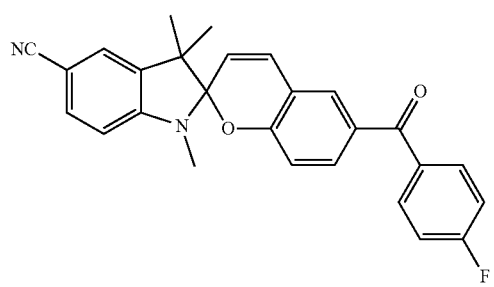

¹H NMR (500 MHz, Chloroform-d), δ 7.83-7.77 (m, 2H), 7.64-7.57 (s, 2H), 7.51 (dd, J=8.2, 1.7 Hz, 1H), 7.29 (d, J=1.7 Hz, 1H), 7.19-7.12 (m, 2H), 6.96 (d, J=10.3 Hz, 1H), 6.77 (d, J=8.4 Hz, 1H), 6.54 (d, J=8.2 Hz, 1H), 5-75 (d, J=10.3 Hz, 1H), 2.82 (s, 3H), 1.32 (s, 3H), 1.19 (s, 3H). ESI-MS [M+H]⁺ m/z calculated for $C_{27}H_{22}FN_2O_2^+$: 425.166 measured: 425.172.

3

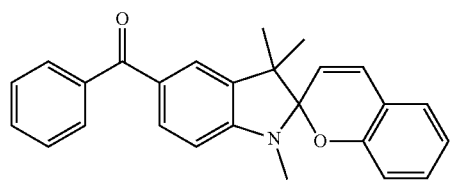

¹H NMR (500 MHz, Chloroform-d) δ 7.80-7.74 (m, 2H), 7.74-7.68 (m, 2H), 7.58-7.52 (m, 1H), 7.50-7.44 (mu, 2H), 7.12 (ddd, J=8.1, 7.4, 1.7 Hz, 1H), 7.07 (dd, J=7.5, 1.7 Hz, 1H), 6.89 (dd, J=10.2, 0.7 Hz, 1H), 6.85 (td, J=7.4, 1.1 Hz, 1H), 6.73 (d, J=7.9 Hz, 1H), 6.50 (d, J=8.1 Hz, 1H), 5.67 (d, J=10.1 Hz, 1H), 2.83 (s, 3H), 1.5 (s, 3H), 1.20 (s, 3H). ESI-MS [M+H]⁺ m/z calculated for $C_{26}H_{24}NO_2^+$: 382.180 measured: 382.190.

4

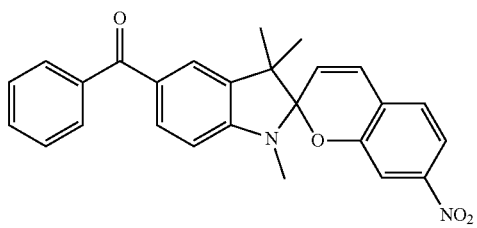

¹H NMR (500 MHz, Chloroform-d) δ 7.81-7.75 (m, 2H), 7.75-7.69 (m, 3H), 7.60 (dd, J=2.3, 0.7 Hz, 1H), 7.58-7.53 (m, 1H), 7.51-7.46 (m, 2H), 7.21 (d, J=8.3 Hz, 1H), 6.98 (dd, J=10.3, 0.8 Hz, 1H), 6.54 (d, J=8.6 Hz, 1H), 5.92 (d, J=10.3 Hz, 1H), 2.83 (s, 3H), 1.36 (s, 3H), 1.22 (s, 3H). ESI-MS [M+H]⁺ m/z calculated for $C_{26}H_{22}N_2O_4^+$: 427.165 measured: 427.173.

5

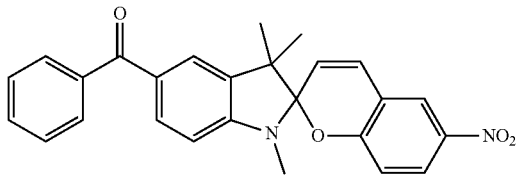

¹H NMR (500 MHz, Chloroform-d) δ 8.07-8.01 (m, 2H), 7.79-7.74 (m, 2H), 7.72 (d, J=7.1 Hz, 2H), 7.59-7.53 (m, 1H), 7.48 (dd, J=8.2, 6.8 Hz, 2H), 6.97 (d, J=10.3 Hz, 1H), 6.80 (d, J=8.7 Hz, 1H), 6.55 (d, J=8.8 Hz, 1H), 5.87 (d, J=10.3 Hz, 1H), 2.84 (s, 3H), 1.34 (s, 3H), 1.22 (s, 3H). ESI-MS [M+H]⁺ m/z calculated for $C_2H_{23}N_2O_4^+$: 427.165 measured: 427.172.

6

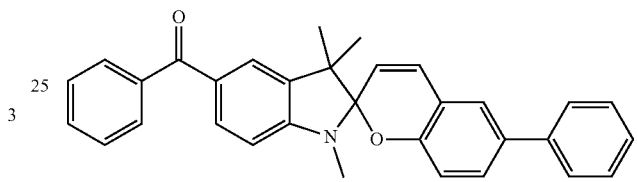

¹H NMR (500 MHz, Chloroform-d) δ 7.81-7.75 (m, 2H), 7.75-7.69 (m, 2H), 7.58-7.51 (m, 3H), 7.51-7.46 (s, 2H), 7.42 (dd, J=8.4, 7.1 Hz, 2H), 7.37 (dd, J=8.4, 2.3 Hz, 1H), 7.33-7.29 (m, 2H), 6.97 (dd, J=10.2, 0.7 Hz, 1H), 6.81 (d, J=8.4 Hz, 1H), 6.52 (d, J=8.1 Hz, 1H), 5.73 (d, J=10.1 Hz, 1H), 2.86 (s, 3H), 1.39 (s, 3H), 1.22 (s, 3H). ESI-MS [M+H]⁺ m/z calculated for $C_{32}H_{28}NO_2^+$: 458.212 measured: 458.223.

7

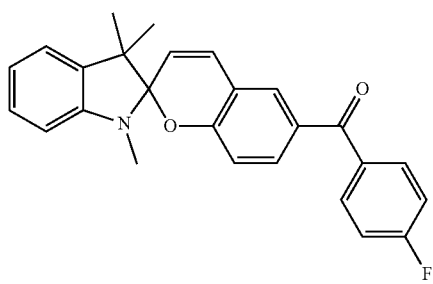

¹H NMR (500 MHz, Methylene Chloride-d₂) δ 7.81-7.76 (m, 2H), 7.61-7.56 (m, 2H), 7.21-7.14 (n 31), 7.08 (dd, J=7.3, 1.3, 0.5 Hz, 1H), 6.94 (dd, J=10.4, 0.7 Hz, 1H), 6.85 (td, J=7.4, 1. Hz, 1H), 6.77 (dt, J=8.3, 0.7 Hz, 1H), 6.54 (dt, J=7.8, 0.7 Hz, 1H), 5.80 (d, J=10.3 Hz, ill), 2.75 (s, 3H), 1.31 (s, 3), 118 (s, 3H).

ESI-MS [M+H]⁺ m/z calculated for $C_{26}H_{23}FNO_2^+$: 400.171 measured: 400.175.

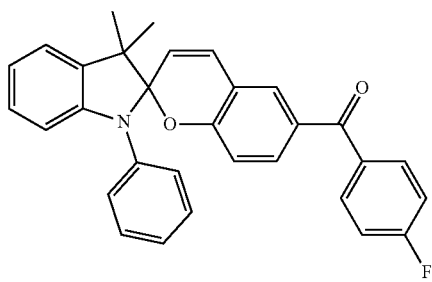

8

¹H NMR (500 MHz, Methylene Chloride-d₂) δ 7.79-7.73 (m, 2H), 7.58 (dd, J=8.5, 2.2 Hz, 1H), 7.47 (d, J=2.2 Hz, 1H), 7.34-7.26 (m, 4H), 7.21-7.14 (m 4H), 7.09 (td, J=7.7, 1.3 Hz, 1H), 6.89 (td, J=7.4, 1. Hz, 1H), 6.83 (d, J=8.5, 0.7 Hz, 1H), 6.74 (dd, J=10.3, 0.7 Hz, 1H), 6.58 (dt, J=7.8, 0.7 Hz, 1H), 5.76 (d, J=10.3 Hz, 1H), 0.53 (s, 3H), 1.38 (s, 3H), 1.27 (s, 3H). ESI-MS [M+1]⁺ m/z calculated for $C_{31}H_{25}FNO_2^+$: 462.186 measured: 462.190.

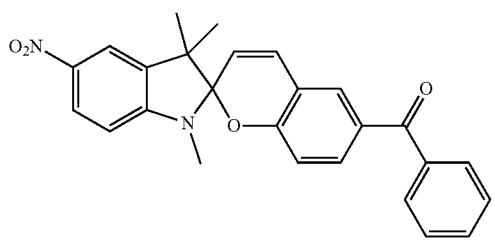

9

¹H NMR (500 MHz, Chloroform-d) δ 8.01 (d, J=2.1 Hz, 1H), 7.97 (dd, J=8.4, 2.1 Hz, 1H), 7.62-7.46 (m, 2H), 7.51-7.43 (m, 2H), 7.33-7.24 (m, 2H), 7.42 (dd, J=2.0, 1.0 Hz, 1H), 6.74 (d, J=8.4 Hz, 1H), 6.77 (d, J=8.3 Hz, 1H), 6.40 (dd, J=8.6, 1.0 Hz, 1H), 5-74 (d, J=8.6 Hz, 1H), 2.86 (s, 3H), 1.28 (s, 3H), 1.19 (s, 3H).

ESI-MS [M+H]⁺ m/z calculated for $C_{26}H_{23}N_2O_4^+$: 427.165 measured: 427.155.

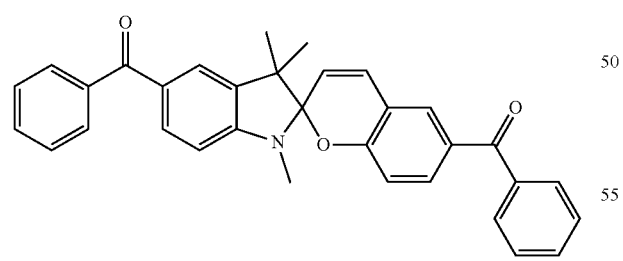

10

¹H NMR (500 MHz, Methylene Chloride-d₂) δ 7.74 (ddd, J=8.4, 3.1, 1.4 Hz, 4H), 7.70 (d, J=8.0 Hz, 2H), 7.66-7.60 (m, 2H), 7.60-7.55 (m, 2H), 7.49 (td, J=7.5, 7.0, 1.4 Hz, 4H), 6.98 (dd, J=10.4, 0.7 Hz, 1H), 6.80 (dd, J=8.2, 0.8 Hz, 1H), 6.57 (dd, J=8.0, 0.7 Hz, 1H), 5.80 (d, J=10.2 Hz, 1H), 2.86 (s, 3H), 1.37 (s, 3H), 1.22 (s, 3H).

ESI-MS [M+H]⁺ m/z calculated for $C_{33}H_{28}NO_3^+$: 486.206 measured: 486.199.

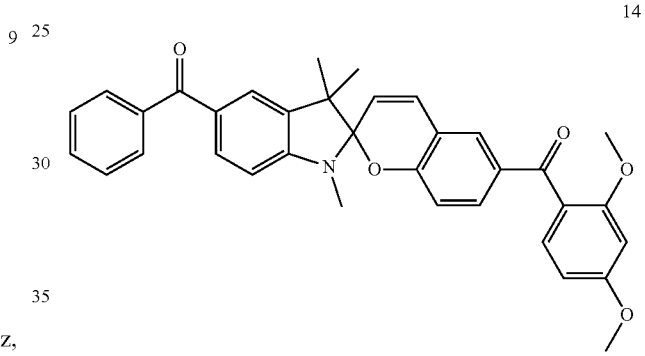

13

¹H NMR (500 MHz, Methylene Chloride-d₂) δ7.59 (d, J=2.1 Hz, 1H), 7.54 (dd, J=8.5, 2.2 Hz, 1H), 7.50 (dd, =8.2, 1.7 Hz, 1H), 7.32-7.27 (m, 2H), 6.96 (dd, J=10.3, 0.7 Hz, 1H), 6.70 (dd, J=8.5, 0.6 Hz, 1H), 6.60-6.52 (m, 3H), 5.73 (d, J=10.3 Hz, 1H), 3.86 (s, 3H), 3.71 (8, 3H), 2.81 (s, 3H), 1.30 (s, 3H), 1.17 (s, 3H).

ESI-MS [M+H]⁺ m/z calculated for $C_{29}H_{27}N_2O_4^+$: 467.197 measured: 467.215.

14

¹H NMR (500 MHz, Methylene Chloride-d₂) δ 7.86-7.76 (m, 2H), 7.64 (d, J=2.1 Hz, 1H), 7.58-7.47 (m, 2H), 7.47-7.35 (m, 5H), 7.17 (dd, J=8.4, 2.2 Hz, 1H), 6.88-6.85 (m, 2H), 6.48 (dd, J=8.6, 0.9 Hz, 1H), 6.38 (d, J=2.4 Hz, 1H), 5.84 (d, J=8.8 Hz, 1H), 3-85 (s, 3H), 3.71 (a, 3H), 2.87 (s, 3H), 1.43 (s, 3H), 1.14 (s, 3H).

ESI-MS [M+H]⁺ m/z calculated for $C_{35}H_{32}NO_5^+$: 546.227 measured: 546.236.

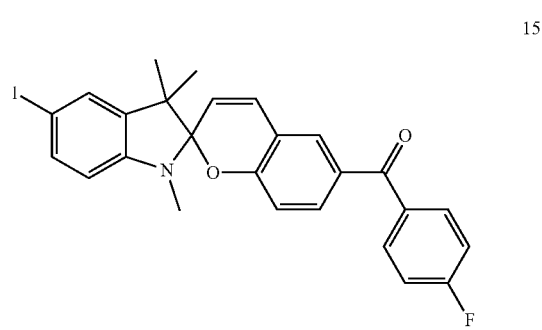

15

¹H NMR (500 MHz, Toluene-d₂) δ 7.51 (d, J=2.1 Hz, 1H), 7.48 (dd, J=8.8, 5.5 Hz, 2H), 7.35 (ddd, J=8.4, 5.0, 2.0 Hz, 2H), 7.31 (d, J=1.7 Hz, 1H), 6.66 (t, J=8.6 Hz, 2H), 6.45-6.40 (m, 2H), 6.33 (dd, J=10.3, 0.7 Hz, 1H), 5.95 (d, J=8.1 Hz, 1H), 5.26 (d, J=10.2 Hz, 1H), 2.43 (s, 3H), 1.10 (8, 3H), 0.87 (s, 3H).

ESI-MS [M+H]$^+$ m/z calculated for C$_{26}$H$_{22}$FlNO$_2^+$: 526.369 measured: 526.354.

16

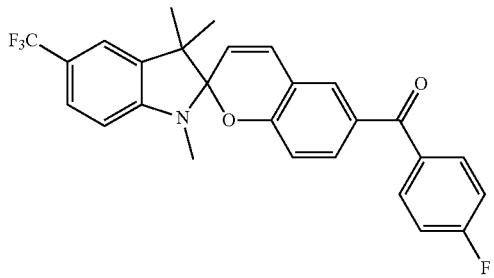

$^1$H NMR (500 MHz, Chloroform-d$_6$) δ 7.69 (d, J=2.2 Hz, 1H), 7.61 (dd, J=8.8, 5.5 Hz, 2H), 7.51 (ddd, J=8.1, 1.9, 0.9 Hz, 1H), 7.47 (d, J=1.8 Hz, 1H), 7.44 (dd, J=8.4, 2.2 Hz, 1H), 6.76 (s, 1H), 6.55 (d, J=8.4 Hz, 1H), 6.39 (d, J=10.2 Hz, 1H), 6.22 (d, J=8.1 Hz, 1H), 5.30 (d, J=10.3 Hz, 1H), 2.52 (s, 3H), 1.23 (s, 3H), 0.95 (s, 3H).

ESI-MS [M+H]$^+$ m/z calculated for C$_{27}$H$_{22}$F$_4$NO$_2^+$: 468.158 measured: 468.150.

17

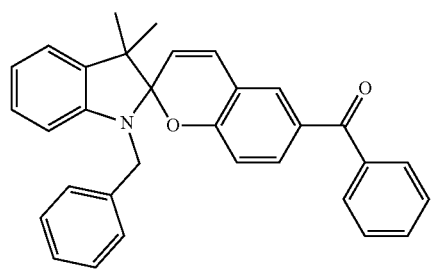

$^1$H NMR (500 MHz, Chloroform-d) δ 7.75-7.70 (m, 2H), 7.61-7.55 (m, 2H), 7.54-7.49 (m, 1H), 7.42 (t, J=7.6 Hz, 2H), 7.25 (s, 3H), 7.22-7.16 (m, 1H), 7.08 (dd, J=7.3, 1.3 Hz, 1H), 7.06-6.98 (m, 2H), 6.85-6.78 (m, 2H), 6.74 (d, J=8.4 Hz, 1H), 6.28 (d, J=7.7 Hz, 1H), 5.79 (d, J=10.3 Hz, 1H), 4.55-4.46 (m, 1H), 4.16 (d, J=16.5 Hz, 1H), 1.33 (s, 3H), 1.26 (s, 3H).

ESI-MS [M+H]$^+$ m/z calculated for C$_{32}$H$_{28}$NO$_2^+$: 458.211 measured: 458.223.

18

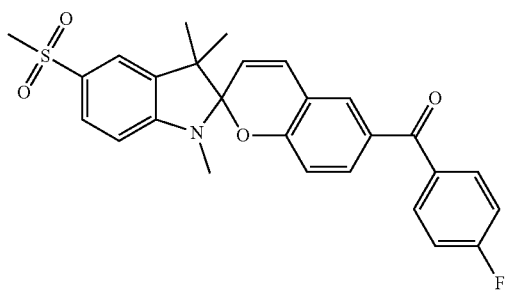

$^1$H NMR (500 MHz, Chloroform-d) δ 7.70-7.64 (m, 3H), 7.61 (d, J=2.1 Hz, 1H), 7.54 (dd, J=8.4, 1.8 Hz, 1H), 7.27 (dd, J=1.9, 1.1 Hz, 1H), 7.18-7.05 (m, 2H), 6.85 (d, J=8.4 Hz, 1H), 6.71 (d, J=8.5 Hz, 1H), 6.43 dd, J=8.6, 1.0 Hz, 1H), 5.86 (d, J=8.5 Hz, 1H), 2.99 (s, 3H), 2.83 (s, 3H), 1.28 (s, 3H), 1.14 (s, 3H).

ESI-MS [M+H]$^+$ m/z calculated for C$_{27}$H$_{25}$FNO$_4$S+: 478.148 measured: 478.122.

19

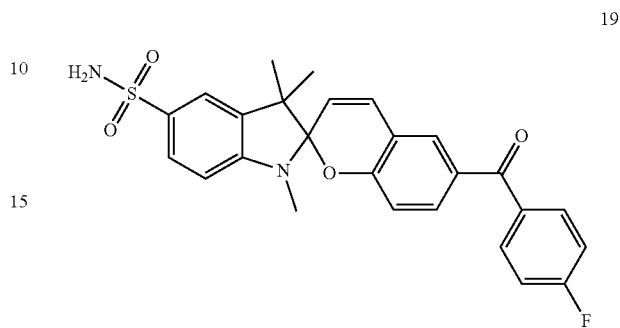

$^1$H NMR (400 MHz, Chloroform-d) δ 7.65-7.58 (m, 3H), 7.48 (dd, J=8.3, 2.1 Hz, 1H), 7.44 (dd, J=8.3, 2.0 Hz, 1H), 7.32 (dd, J=0.8, 0.1 Hz, 1H), 7.15-7.09 (m, 2H), 6.78 (d, J=8.3 Hz, 1H), 6.65-6.50 (m, 2H), 6.31 (dd, J=8.5, 1.0 Hz, 1H), 6.28 (d, J=9.7 Hz, 1H), 5.89 (d, J=8.7 Hz, 1H), 2.96 (s, 3H), 1.26 (s, 3H), 1.8 (s, 3H).

ESI-MS [M+H]$^+$ m/z calculated for C$_{26}$H$_{24}$FN$_2$O$_4$S$^+$: 479.144 measured: 479.163.

20

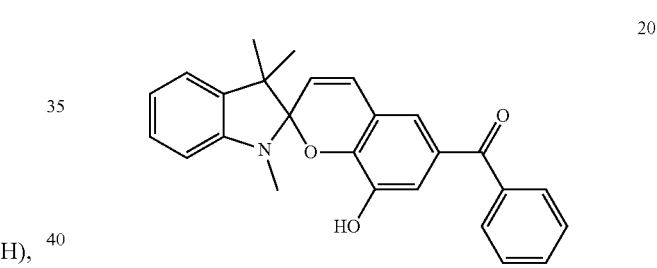

$^1$H NMR (400 MHz Methylene Chloride-d$_2$) δ 9.40 (s, 1H), 7.73-7.66 (mu, 2H), 7.48-7.41 (m, 1H), 7.40-7.35 (m, 2H), 7.25-7.17 (m, 2H), 7.12-7.04 (m, 2H), 6.77 (td, J=7.8, 1.4 Hz, 1H), 6.62 (dd, J=7.7, 1.4 Hz, 1H), 6.38 (dd, J=8.7, 1.0 Hz, 1H), 5.82 (d, J=8.7 Hz, 1H), 2.90 (s, 3H), 1.31 (s, 3H), 1.09 (s, 3H).

ESI-MS [M+H]$^+$ m/z calculated for C$_{26}$H$_{24}$NO$_3^+$: 398.175 measured: 398.189.

21

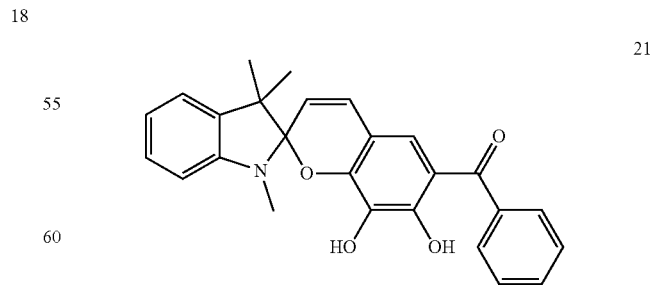

$^1$H NMR (500 MHz, Methylene Chloride-d$_2$) 8.99 (s, 1H), 7.70-7.63 (m, 2H), 7.52-7.44 (m, 1H), 7.40-7.32 (m, 2H), 7.23 (dd, J=8.0, 1.4 Hz, 1H), 7.05-6.97 (m, 2H), 6.72 (d, J=1.0 Hz, 1H), 6.65 (td, J=7.8, 1.5 Hz, 1H), 6.54 (dd, J=7.8, 1.5 Hz, 1H), 6.45 (dd, J=8.6, 1.0 Hz, 1H), 5.82 (d, J=8.6 Hz, 1H), 2.86 (s, 3H), 1.29 (s, 3H), 1.11 (s, 3H).

ESI-MS [M+H]$^+$ m/z calculated for $C_{26}H_{24}NO_4^+$: 414.170 measured: 414.161.

28

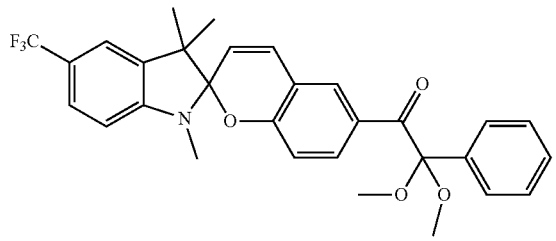

$^1$H NMR (500 MHz, Chloroform-d) δ 7.51 (dd, J=1.8, 1.0 Hz, 1H), 7.47-7.43 (m, 1H), 7.28 (d, J=2.2 Hz, 1H), 7.25-7.17 (m, 4H), 7.15 (dd, J=8.3, 2.2 Hz, 1H), 7.14-7.09 (m, 1H), 6.59 (dd, J=8.4, 6.7 Hz, 2H), 6.30 (dd, J=8.6, 1.0 Hz, 1H), 5.87 (d, J=8.9 Hz, 1H), 3.36 (s, 6H), 2.81 (s, 3H), 1.29 (s, 3H), 1.17 (s, 3H).

ESI-MS [M+H]$^+$ m/z calculated for $C_{30}H_{29}F_3NO_4^+$: 524.204 measured: 524.216.

29

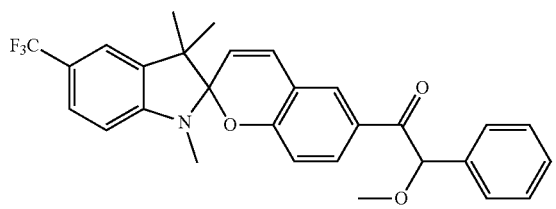

$^1$H NMR (400 MHz, Chloroform-d) δ 7.58 (dd, J=8.1, 1.8 Hz, 2H), 7.51 (dd, J=1.8, 1.1 Hz, 2H), 7.48-7.42 (m, 6H), 7.29-7.21 (m, 6H), 7.32-7.28 (m, 2H), 6.66 (dd, J=8.5, 3.4 Hz, 4H), 6.50 (dd, J=8.6, 1.0 Hz, 2H), 5.77 (d, J=8.5 Hz, 2I), 5.61 (s, 1H), 3.28 (s, 3H), 2.77 (s, 3H), 1.29 (s, 3H), 1.08 (s, 3H).

ESI-MS [M+H]$^+$ m/z calculated for $C_{29}H_{27}F_3NO_3^-$: 494.194 measured: 494.181.

31

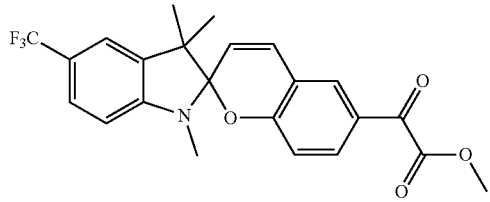

$^1$H NMR (400 MHz, Chloroform-d) δ 7.48 (dd, J=8.3, 2.1 Hz, 1H), 7.41 (dd, J=2.0, 1.0 Hz, 1H), 7.35 (d, J=2.2 Hz, 1H), 7.17 (dd, J=8.4, 2.1 Hz, 1H), 6.75 (d, J=8.3 Hz, 1H), 6.65 (d, J=8.5 Hz, 1H), 6.41 (dd, J=8.7, 1.0 Hz, 1H), 5.79 (d, J=8.8 Hz, 1H), 3.79 (s, 3H), 2.79 (s, 3H), 1.21 (s, 3), 1.11 (s, 3H).

ESI-MS [M+H]$^+$ m/z calculated for $C_{23}H_{21}F_3NO_4^+$: 432.142 measured: 432.151.

32

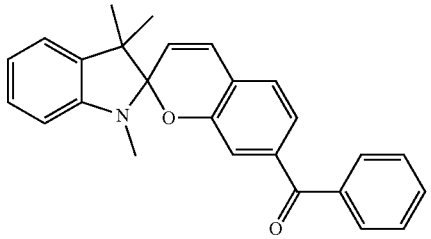

$^1$H NMR (500 MHz, Chloroform-d) δ 7.60-7.55 (m, 2H), 7.47-7.41 (m, 1H), 7.40-7.34 (m, 2H), 7.18-7.07 (m, 2H), 6.98 (dd, J=7.8, 1.1 Hz, 1H), 6.88 (td, J=7.5, 1.1 Hz, 1H), 6.75 (dd, J=7.5, 1.5 Hz, 1H), 6.64 (d, J=8.7 Hz, 1H), 6.52-6.43 (m, 2H), 5.81 (d, J=8.7 Hz, 1H), 2.81 (s, 3H), 1.27 (s, 3H), 1.19 (s, 3H).

ESI-MS [M+H]$^+$ m/z calculated for $C_{16}H_{24}NO_2^+$: 382.180 measured: 382.162.

33

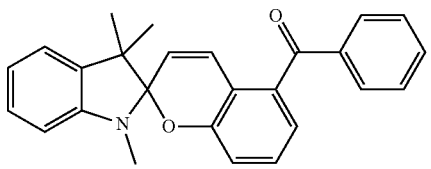

$^1$H NMR (500 MHz, Chloroform-d) δ 7.75-7.64 (m, 2H), 7.49-7.41 (m, 1H), 7.39-7.31 (m, 2H), 7.21-7.10 (m, 2H), 7.08-7.00 (m, 2H), 6.88 (td, J=7.5, 1.2 Hz, 1H), 6.57-6.47 (m, 2H), 6.34 (dd, J=8.5, 1.0 Hz, 1H), 5.89 (d, J=8.7 Hz, 1H), 2.87 (s, 3H), 1.20 (s, 2H), 1.15 (s, 2H).

ESI-MS [M+H]$^+$ m/z calculated for $C_{26}H_{24}NO_2^+$: 382.180 measured: 382.184.

34

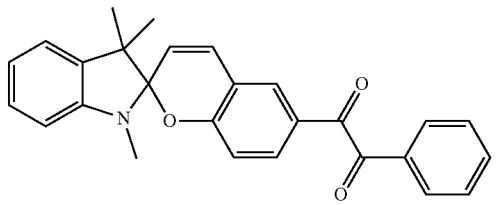

$^1$H NMR (500 MHz, Benzene-d$_6$) δ 8.45 (dd J=2.3, 1.1 Hz, 1H), 7.96 (dd, J=8.4, 1.3 Hz, 2H), 7.89 (dd, J=8.6, 2.2 Hz, 1H), 7.28 (dd, J=7.6, 1.4 Hz, 1H), 7.25-7.22 (m, 1H), 7.09-7.01 (m, 2H), 6.98 (ddd, J=7.3, 3.6, 1.1 Hz, 2H), 6.94-6.89 (m, 2H), 6.67 (d, J=8.5 Hz, H), 6.60 (d, J=7.7 Hz, 1H), 6.41 (d, J=7.8 Hz, 1H), 2.68 (d, J=375 Hz, 3H), 1.53 (d, J=25.3 Hz, 3H), 1.38 (d, J=61.9 Hz, 3H).

ESI-MS [M+H]$^+$ m/z calculated for $C_{27}H_{24}NO_3^+$: 410.175 measured: 410.188.

35

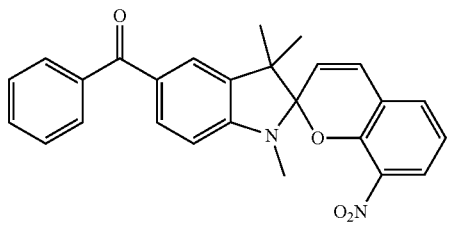

¹H NMR (500 MHz, Chloroform-d) δ 7.79-7.74 (m, 2H), 7.72-7.65 (m, 3H), 7.57-7.52 (n, 1H), 747 (dd, J=8.2, 6.8 Hz, 2H), 7.29 (dd, J=7.5, 1.6 Hz, 1H), 6.96 (d, J=10.3 Hz, 1H), 6.91 (dd, J=8.3, 7.5 Hz, 1H), 6.51 (d, J=8.2 Hz, 1H), 5.85 (d, J=10.3 Hz, 1H), 2.83 (s, 3H), 1.40 (s, 3H), 1.22 (s, 3H).

ESI-MS [M+H]⁺ m/z calculated for $C_{26}H_{23}N_2O_4^+$: 427.165 measured: 427-154.

36

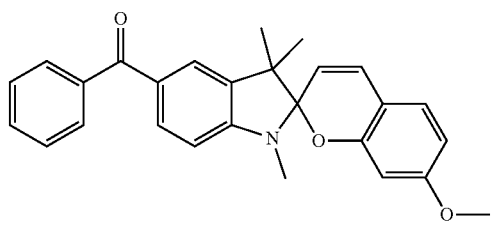

¹H NMR (400 MHz, Chloroform-d) δ 7.69-7.60 (m, 2H), 7.57-7.47 (m, 2H), 7.43-7.33 (m, 3H), 7.00 (dd, J=9.0, 1.0 Hz, 1H), 6.73 (d, J=8.5 Hz, 1H), 6.43 (dd, J=9.1, 2.4 Hz, 1H), 6.30 (dd, J=8.6, 1.0 Hz, 1H), 6.17 (d, J=2.4 Hz, 1H), 5.70 (d, J=8.5 Hz, 1H), 3.73 (s, 3H), 2.91 (s, 3H), 1.33 (s, 3H), 1.25 (s, 3H).

ESI-MS [M+H]⁺ m/z calculated for $C_{27}H_{26}NO_3^+$: 412.191 measured: 412.184.

37

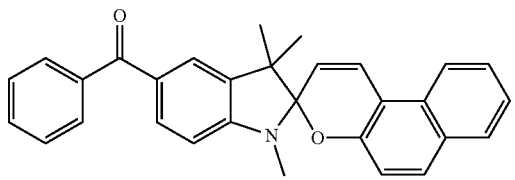

¹H NMR (500 MHz, Chloroform-d) δ 8.04 (d, J=8.5 Hz, 1H), 7.82-7.71 (m, 4H), 7.64 (dd, J=9.7, 5.0 Hz, 2H), 7.62-7.57 (m, 1H), 7.57-7.43 (m, 3H), 7.35 (ddd, J=8.0, 6.8, 1.1 Hz, 1H), 6.99 (d, J=8.8 Hz, 1H), 6.89 (d, J=8.1 Hz, 1H), 6.51 (d, J=8.2 Hz, 1H), 5.79 (d, J=10.4 Hz, 1H), 2.84 (s, 3H), 1.38 (8, 3H), 1.25 (s, 3H).

ESI-MS [M+H]⁺ m/z calculated for $C_{30}H_{26}NO_2^+$: 432.196 measured: 432-201.

38

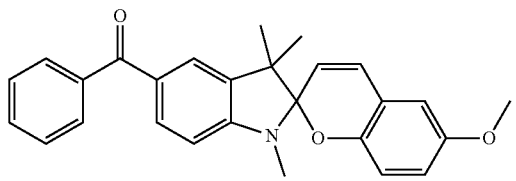

¹H NMR (500 MHz, Chloroform-d) δ 7.73-7.60 (m, 2H), 7.62-7.54 (m, 2H), 7.50-7.39 (m, 3H), 6.95 (d, J=8.5 Hz, 1H), 6.80-659 (m, 3H), 6.30 (dd, J=8.6, 0.9 Hz, 1H), 5.69 (d, J=8.6 Hz, 1H), 3.64 (s, 3H), 2.80 (s, 3H), 1.43 (s, 3H), 1.19 (s, 3H).

ESI-MS [M+H]⁺ m/z calculated for $C_{27}H_{26}NO_3^+$: 412.191 measured: 412.184.

39

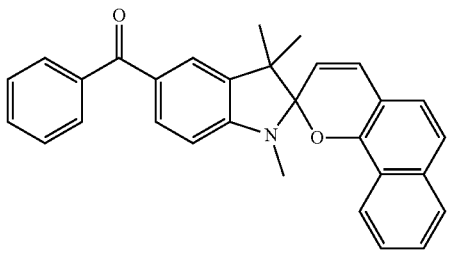

¹H NMR (50 MHz, Chloroform-d) δ7.97 (d, J=8.3 Hz, 2H), 7.77 (m, 2H), 7.76-7.72 (m, 3H), 7.41 (d, J=8.6 Hz, 2H), 7.38 (d, J=4.7 Hz, 2H), 7.20 (m, 2H), 7.06-6.98 (m, 1H), 6.51 (d, J=8.1 Hz, 1H), 5.71 (d, J=10.1 Hz, 1H), 2.82 (s, 3H), 1.37 (s, 3H), 1.26 (s, 3H).

ESI-MS [M+H]⁺ m/z calculated for $C_{30}H_{26}NO_2^+$: 432.196 measured: 432.203.

40

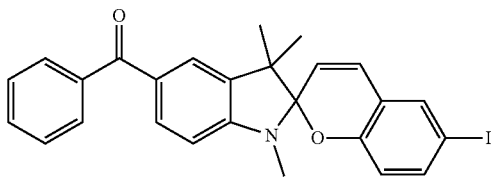

¹H NMR (500 MHz, Methylene Chlorid d₂) δ 7.75-7.71 (m, 2H), 7.70-7.65 (m, 2H), 7.60-7.54 (m, 1H), 7.51-7.45 (m, 2H), 7.42-7.36 (m, 2H), 6.85 (dd, J=10.3, 0.7 Hz, 1H), 6.52 (dd, J=8.2, 7.2 Hz, 2H), 5.74 (d, J=10.2 Hz, 1H), 2.82 (s, 3H), 1.32 (s, 3H), 1.19 (s, 3H).

ESI-MS [M+H]⁺ m/z calculated for $C_{26}H_{23}NO_2^+$: 508.077 measured: 508.069.

41

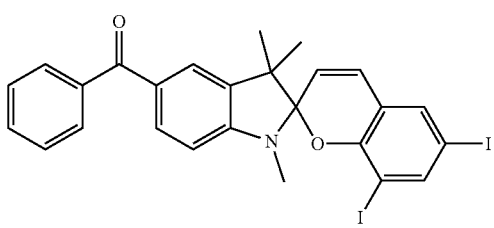

¹H NMR (500 MHz, Methylene Chloride-d₂) δ 7.86 (d, J=2.0 Hz, 1H), 7.76-7.67 (m, 4H), 7.59-7.54 (m, 1H), 7.51-7.45 (m, 2H), 7.39 (d, J=2.0 Hz, 1H), 6.78 (d, J=10.2 Hz, 1H), 0.60-6.53 (m, 1H), 5.76 (d, J=10.1 Hz, 1H), 2.79 (s, 3H), 1.34 (s, 3H), 1.21 (s, 3H).

ESI-MS [M+H]⁺ m/z calculated for $C_{26}H_{22}I_2N_2^+$: 633.973 measured: 633.971.

42

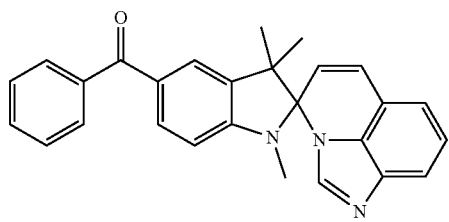

¹H NMR (500 MHz, Methylene Chloride-d₂) δ 7.76 (dd, J=83, 1.7 Hz, 1H), 7.74-7.71 (m, 3H), 7.62 (d, J=1.7 Hz, 1H), 7.59-7.53 (m, 3H), 7.48 (dd, J=8.2, 6.8 Hz, 21), 7.42 (dt, J=75, 1.0 Hz, 1H), 7.33 (s, 1H), 7.27 (t, J=7.7 Hz, 1H), 6.66 (d, J=8.2 Hz, 1H), 2.89 (s, 3H), 1.42 (s, 3H), 0.72 (s, 3H).

ESI-MS [M+H]⁺ m/z calculated for $C_{27}H_{24}N_3O^+$: 406.191 measured: 406.202.

43

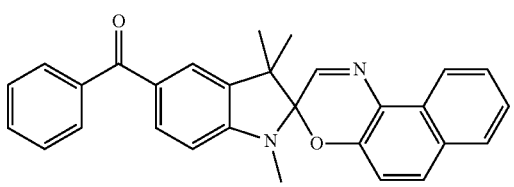

¹H NMR (500 MHz, Chloroform-d) δ 8.09-8.02 (m, 1H), 7.78-7.70 (m, 4H), 7.64-7.57 (m, 3H), 7.54-7.45 (m, 5H), 7.20 (d, J=8.2 Hz, 1H), 6.97 (d, J=8.3 Hz, 1H), 2.80 (s, 3H), 1.26 (s, 3H), 1.12 (s, 3H).

ESI-MS [M+H]⁺ m/z calculated for $C_{29}H_{25}N_2O_2^+$: 433.191 measured: 433.196.

44

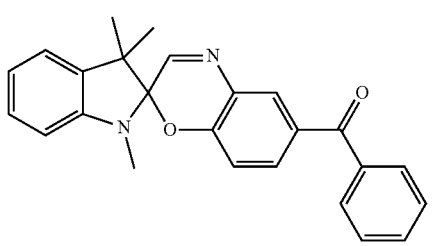

¹H NMR (500 MHz, Methylene Chloride-d₂) δ 7.95 (s, 1H), 7.70-7.63 (m, 2H), 7.54-7.45 (m, 2H), 7.42-7.34 (m, 2H), 730 (d, J=1.7 Hz, 1H), 7.22 (dd, J=7.8, 1.6 Hz, 1H), 7.02 (td, J=7.4, 1.6 Hz, 1H), 6.91 (d, J=8.4 Hz, 1H), 6.85-6.73 (n 2H), 2.85 (3, 3H), 1.39 (s, 3H), 1.24 (s, 3H).

ESI-MS [M+H]⁺ m/z calculated for $C_{25}H_{23}N_2O_2^+$: 383.175 measured: 383.169.

45

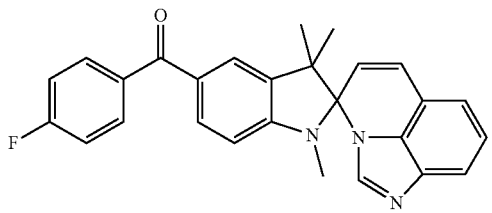

¹H NMR (400 MHz, Chloroform-d) δ 8.95 (s, 1H), 7.75-7.68 (m, 3H), 7.51-7.44 (m, 2H), 7.37-7.31 (s, 3H), 7.14-7.06 (m, 2H), 6.97 (d, J=8.5 Hz, 1H), 2.86 (s, 3H), 1.31 (s, 3H), 1.14 (s, 3H).

ESI-MS [M+H]⁺ m/z calculated for $C_{27}H_{23}FN_3O^+$: 424.182 measured: 424.199.

46

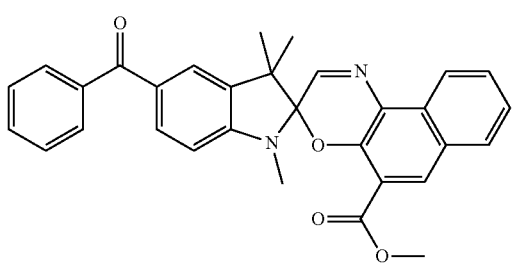

¹H NMR (500 MHz, Chloroform-d) δ 8.11-8.06 (s, 1H), 7.93-7.90 (s, 2H), 7.81-7.74 (m, 3H), 7.44-7.37 (m, 2H), 7.35-7.22 (m, 5H), 6.75 (d, J=8.3 Hz, 1H), 3.78 (s, 3H), 2.91 (s, 3H), 1.31 (s, 3H), 1.16 (s, 3H).

ESI-MS [M+H]⁺ m/z calculated for $C_{31}H_{27}N_2O_4^+$: 491.197 measured: 491.192.

47

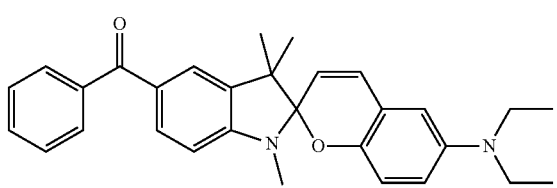

¹H NMR (500 MHz, Chloroform-d) δ 7.75-7.71 (m, 2H), 7.51-7.37 (m, 5H), 6.92 (d, J=8.3 Hz, 1H), 6.47-6.39 (m, 2H), 6.40-6.31 (m, 2H), 5.86 (d, J=8.6 Hz, 1H), 3.60-3.32 (m, 4H), 2.87 (s, 3H), 1.30 (s, 3H), 1.24 (s, 3H), 1.21 (t, J=7.1 Hz, 6H).

ESI-MS [M+H]⁺ m/z calculated for $C_{30}H_{33}N_2O_2^{30}$: 453.254 measured: 453.256.

48

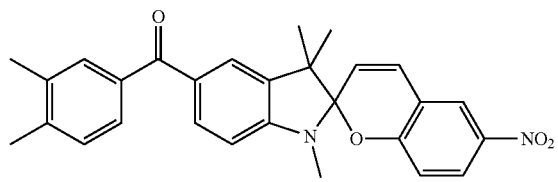

¹H NMR (500 MHz, Chloroform-d) δ 8.07-7.99 (m, 1H), 7.76-7.68 (m, 2H), 7.60-7.55 (m, 1H), 7.49 (td, J=7.3, 1.9 Hz, 1H), 7.23 (dd, J=7.8, 2.4 Hz, 1H), 6.97 (d, J=10.4 Hz, 1H), 6.80 (d, J=8.8 Hz, 1H), 6.59 (t, J=8.6 Hz, 1H), 6.54 (d, J=8.0 Hz, 1H), 5.86 (d, J=10.3 Hz, 1H), 2.83 (s, 3H), 2.35 (s, 3H), 2.33 (s, 3H), 1.33 (s, 3H), 1.22 (s, 3H).

ESI-MS [M+H]⁺ m/z calculated for $C_{28}H_{27}N_2O_4^+$: 455.197 measured: 455.185.

51

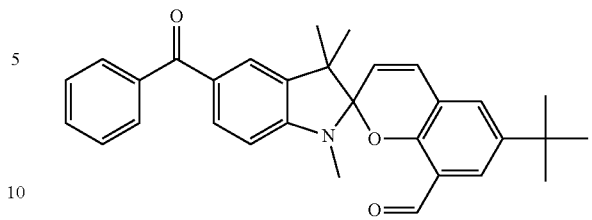

¹H NMR (500 MHz, Toluene-d₈) δ 10.40 (s, 1H), 7.93 (dd, J=15.6, 2.1 Hz, 2H), 7.75 (d, J=6.8 Hz, 1H), 7.68 (dd, J=8.1, 1.7 Hz, 1H), 7.19-7.15 (m, 1H), 7.13 (dd, J=6.0, 1.4 Hz, 2H), 7.11 (m, 1H), 7.08 (d, J=2.5 Hz, 1H), 6.40 (d, J=10.3 Hz, 1H), 6.13 (d, J=8.1 Hz, 1H), 5.29 (d, J=10.3 Hz, 1H), 2.44 (s, 3H), 1.13 (m, J=2.1 Hz, 12H), 0.93 (s, 3H).

ESI-MS [M+H]⁺ m/z calculated for $C_{31}H_{31}NO_3^+$: 465.230 measured: 465.241.

49

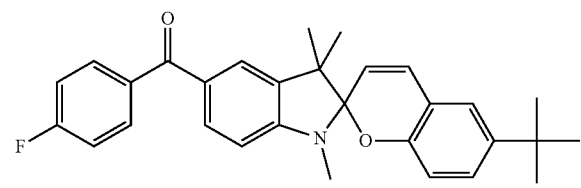

¹H NMR (500 MHz, Chloroform-d) δ 7.69-7.59 (m, 2H), 7.55 (d, J=1.7 Hz, 1H), 7.49 (dd, J=8.3, 1.8 Hz, 1H), 7.15 (t, J=8.2 Hz, 2H), 7.06-6.99 (m, 2H), 6.80 (d, J=8.5 Hz, 1H), 6.61-6.52 (m, 1H), 6.47 (dd, J=8.6, 1.0 Hz, 1H), 5.80 (d, J=8.6 Hz, 1H), 2.90 (s, 3H), 1.31 (s, 3H), 1.18 (s, 3H), 1.11 (s, 9H).

ESI-MS [M+H]⁺ m/z calculated for $C_{30}H_{31}FNO_2^+$: 456.233 measured: 456.240

52

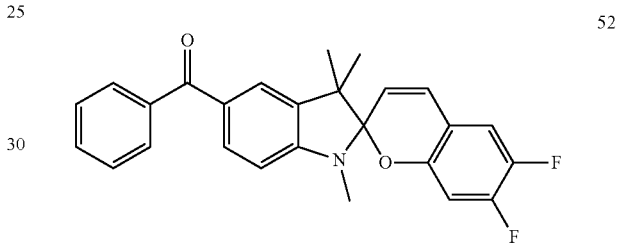

¹H NMR (500 MHz, Chloroform-d) δ 7.79-7.74 (m, 2H), 7.73-7.67 (m, 2H), 7.59-7.53 (m, 1H), 7.51-7.45 (m, 2H), 6.88 (dd, J=10.0, 8.6 Hz, 1H), 6.79 (dd, J=10.2, 0.6 Hz, 1H), 6.56 (dd, J=11.2, 6.7 Hz, 1H), 6.51 (dd, J=7.9, 0.8 Hz, 1H), 5.70 (d, J=10.2 Hz, 1H), 2.81 (s, 3H), 1.34 (s, 3H), 1.19 (s, 3H).

ESI-MS [M+H]⁺ m/z calculated for $C_{26}H_{22}F_2NO_2^+$: 418.161 measured: 418.169.

50

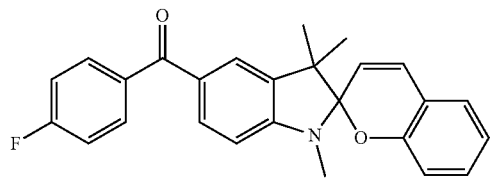

¹H NMR (50 MHz, Benzene-d₆) δ 7.94 (d, J=1.7 Hz, 1H), 7.66 (dd, J=8.1, 1.8 Hz, 1H), 7.61 (dd, J=8.7, 5.6 Hz, 2H), 6.85 (td, J=7.8, 1.7 Hz, 1H), 6.79 (dd, J=7.7, 1.7 Hz, 1H), 6.71 (t, J=8.7 Hz, 2H), 6.69-6.64 (m, 2H), 6.42 (d, J=10.2 Hz, 1H), 6.19 (d, J=8.1 Hz, 1H), 5.27 (d, J=10.2 Hz, 1H), 2.51 (s, 3H), 1.24 (s, 3H), 0.96 (s, 3H).

ESI-MS [M+H]⁺ m/z calculated for $C_{26}H_{23}FNO_2^+$: 400.171 measured: 400.175.

53

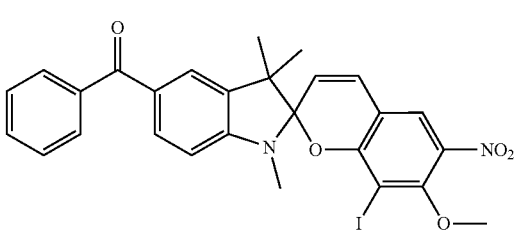

¹H NMR (500 MHz, Chloroform-d) δ 7.68 (s, 1H), 7.64-7.56 (m, 3H), 7.46-7.39 (m, 2H), 7.35 (t, J=7.5 Hz, 2H), 6.77 (d, J=10.3 Hz, 1H), 6.44 (d, J=8.1 Hz, 1H), 5.68 (d, J=10.3 Hz, 1H), 3.80 (s, 3H), 2.67 (s, 3H), 1.22 (s, 3H), 1.10 (s, 3H).

ESI-MS [M+H]⁺ m/z calculated for $C_{27}H_{24}IN_2O_5^+$: 583.072 measured: 583.084.

54

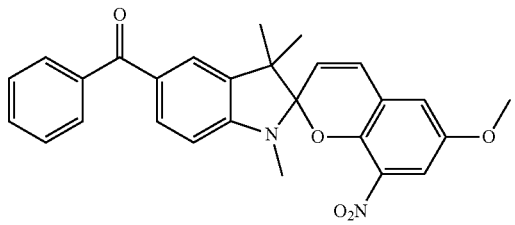

¹H NMR (500 MHz, Chloroform-d) δ 7.79-7.74 (m, 2H), 7.70 (d, J=1.6 Hz, 1H), 7.67 (dd, J=8.1, 1.8 Hz, 1H), 7.55-7.51 m, 1H), 7.49-7.43 (m, 2H), 7.23 (d, J=3.1 Hz, 1H), 6.93-6.85 (m, 2H), 6.50 (d, J=8.2 Hz, 1H), 5.88 (d, J=10.3 Hz, 1H), 3.79 (s, 3H), 2.81 (s, 3H), 1.38 (s, 3H), 1.21 (s, 3H).

ESI-MS [M+H]⁺ m/z calculated for $C_{27}H_{25}N_2O_5^+$: 457.176 measured: 457.168.

57

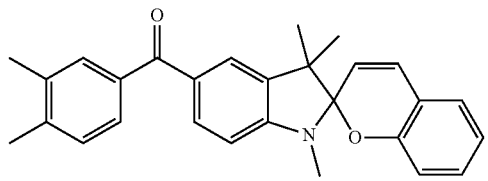

¹H NMR (500 MHz, Chloroform-d) δ 7.71 (td, J=4.3, 1.8 Hz, 21), 7.59 (d, J=1.8 Hz, 1H), 7.51 (dd, J=7.7, 1.8 Hz, 1H), 7.23 (d, J=7.7 Hz, H), 7.12 (ddd, J=8.1, 7.4, 1.7 Hz, 1H), 7.07 (dd, J=7.5, 1.7 Hz, 1H), 6.89 (dd, J=10.2, 0.7 Hz, 1H), 6.86 (td, J=7.4, 1.1 Hz, 1H), 6.74 (dt, J=8.3, 0.9 Hz, 1H), 6.50 (d, J=8.6 Hz, 1H), 5.68 (d, J=10.2 Hz, 1H), 2.83 (s, 3H), 2.35 (s, 3H), 2.34 (s, 3H), 1.36 (s, 3H), 1.20 (s, 3H).

ESI-MS [M+H]⁺ m/z calculated for $C_{28}H_{28}NO_2^+$: 410.211 measured: 410.222.

55

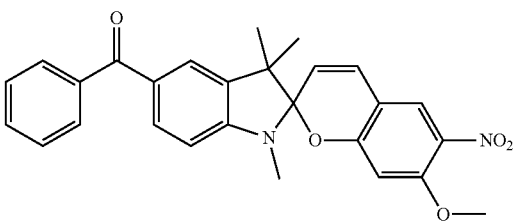

¹H NMR (500 MHz, Chloroform-d) δ 7.83 (s, 1H), 7.77-7.73 (m, 2H), 7.73-7.70 (m, 2H), 7.58-7.53 (m, 1H), 7.50-7.45 (m, 2H), 6.91-6.85 (m, 1), 6.55 (d, J=8.1 Hz, 1H), 6.41 (s, 1H), 5.72 (d, J=10.3 Hz, 1H), 3.86 (s, 3H), 2.84 (s, 3H), 1.34 (s, 3H), 1.21 (s, 3H).

ESI-MS [M+H]⁺ m/z calculated for $C_{27}H_{25}N_2O_5^+$: 457.176 measured: 457.165.

62

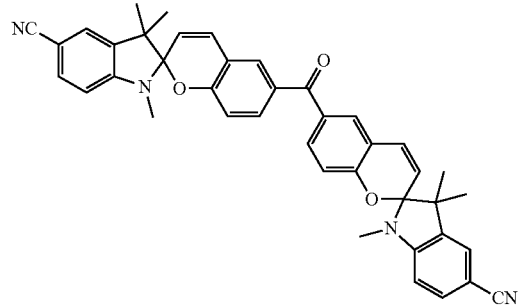

¹H NMR (400 MHz, Chloroform-d) δ 7.45 (dd, J=8.4, 2.2 Hz, 2H), 7.40-7.31 (m, 6H), 6.85 (d, J=8.5 Hz, 2H), 6.75 (d, J=84 Hz, 2H), 6.48-6.42 (m, 2H), 0.85 (d, J=8.4 Hz, 2H), 2.81 (s, 6H), 1.32 (s, 6H), 1.20 (s, 6H).

ESI-MS [M+H]⁺ m/z calculated for $C_{41}H_{35}N_4O_3^+$: 631.270 measured: 631.284.

56

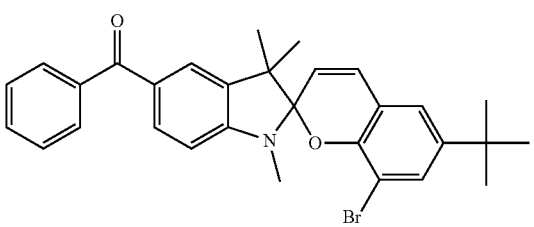

¹H NMR (500 MHz, Chloroform-d) δ 7.74-7.67 (m, 3H), 7.65 (dd, J=8.1, 1.8 Hz, 1H), 7.54-7.49 (m, 11H), 7.48-7.41 (m, 2H), 7.32 (d, J=23 Hz, 1H), 6.99 (d, J=2.3 Hz, 1H), 6.82 (d, J=10.2 Hz, 1H), 6.47 (d, J=8.2 Hz, 1H), 5.66 (d, J=1.1 Hz, 1H), 2.79 (s, 3H), 1.33 (s, 3H), 1.25 (s, 9H), 1.18 (s, 3H).

ESI-MS [M+H]⁺ m/z calculated for $C_{30}H_{31}BrNO_2^+$: 516.153 measured: 516.171.

64

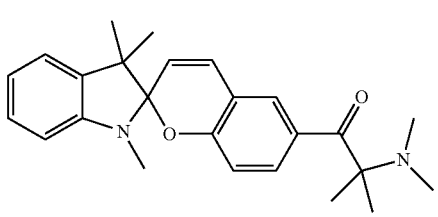

¹H NMR (500 MHz, Methylene Chloride-d₂) δ 7.72 (dd, J=8.4, 1.9 Hz, 1H), 7.51 (dd, J=2.0, 1.0 Hz, 1H), 7.15-7.09 (m, 1H), 7.08 (td, =7.8, 1.5 Hz, 1H), 6.80 (d, J=8.5 Hz, 1H), 6.66-6.59 (m, 1H), 6.54 (dd, J=7.9, 1.4 Hz, 1H), 6.46 (dd, J=8.6, 1.0 Hz, 1H), 5.84 (d, J=8.6 Hz, 1H), 2.81 (s, 3H), 2.28 (s, 6H), 1.36 (s, 3H), 1.30-1.26 (m, 6H), 1.19 (s, 3H).

ESI-MS [M+H]⁺ m/z calculated for $C_{25}H_{31}N_2O_2^+$: 391.238 measured: 391.230.

70

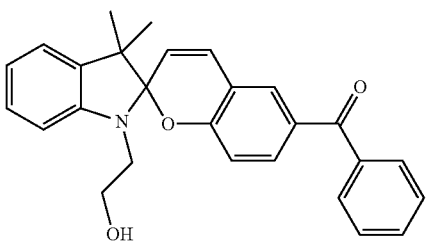

¹H NMR (500 MHz, Chloroform-d) δ 7.80-7.73 (m, 2H), 7.69-7.62 (m, 1H), 7.49-7.39 (m, 3H), 7.26 (dd, J=2.0, 1.0 Hz, 1H), 7.11 (dd, J=8.2, 1.7 Hz, 1H), 7.04 (td, J=7.7, 1.4 Hz, 1H), 6.61 (d, J=8.4 Hz, 1H), 6.54-6.44 (m, 3H), 5.90 (d, J=8.8 Hz, 1H), 4.11-4.00 (m, 2H), 3.58-3.49 (m, 2H), 1.35 (s, 3H), 1.25 (s, 3H).

ESI-MS [M+H]⁺ m/z calculated for $C_{27}H_{26}NO_3^+$: 412.508 measured: 412.499.

77

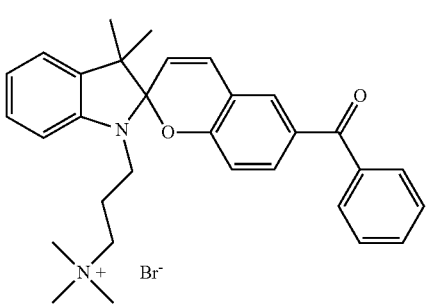

¹H NMR (500 MHz, Acetonitrile-d₃) δ 7.87-7.79 (m, 2H), 7.65-7.57 (m, 1H), 7.56-7.48 (m, 2H), 7.48-7.41 (m, 2H), 7.21 (dd, J=7.7, 1.5 Hz, H), 7.11-7.06 (m, 1H), 6.97 (d, J=8.1 Hz, 1H), 6.88 (td, J=7.8, 1.6 Hz, 1H), 6.65 (dd, J=7.8, 14 Hz, 1H), 6.54 (dd, J=8.6, 1.0 Hz, 1H), 5.83 (d, J=8.5 Hz, 1H), 3.80-3.72 (m, 1H), 3.62-3.51 (m, 1H), 3.50-3.42 (m, 2H), 3.09 (s, 9H), 2.21-2.10 (m, 2H), 1.3 (s, 3H), 1.14 (s, 3H).

ESI-MS [M]⁺ m/z calculated for $C_{31}H_{35}N_2O_2^+$: 467.269 measured: 467.278.

78

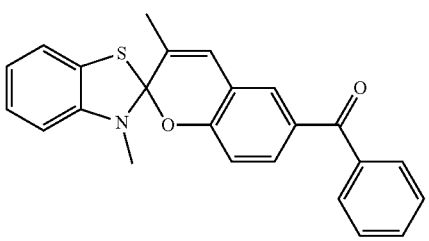

¹H NMR (500 MHz, Methylene Chloride-d₂) δ 7.80-7.71 (m, 2H), 7.53-7.45 (m, 1H), 7.40-7.31 (s, 4H), 7.25 (dd, J=7, 1.5 Hz, 1H), 7.17 (dd, J=7.7, 1.8 Hz, 1H), 7.01 (td, J=7, 1.6 Hz, 1H), 6.77-6.67 (m, 2H), 6.60-6.58 (m, 1H), 2.99 (s, 3H), 2.31 (d, J=1.1 Hz, 3H).

ESI-MS [M+H]⁺ m/z calculated for $C_{24}H_{20}NO_2S^+$: 386.121 measured: 386.125.

Synthesis of compounds 10-12

The corresponding acid chloride derivative (15 mmol) and unsubstituted spiropyran (5 mmol) or 8'-methoxyspiropyran (5 mmol) are dissolved in dichloromethane (50 mL) and cooled to 0° C. AlCl₃ (17 mmol) is added in small portions over 1 h. The resulting mixture is stirred at room temperature for 2 h. The mixture is poured on ice (200 g) and extracted with dichloromethane. The combined organic layers are dried over anhydrous MgSO₄ and the solvent is evaporated under reduced pressure. The solid residue is purified by recrystallization from ethanol or silica gel column chromatography using acetone/petroleum ether mixtures as eluent.

11

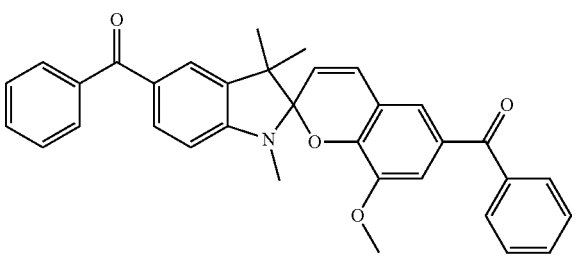

¹H NMR (500 MHz, Methylene Chloride-d₂) δ 7.87-7.81 (m, 4H), 7.70 (d, J=1.9 Hz, 1H), 7.64-7.55 (m, 2H), 7.43-7.35 (m, 5H), 7.11-7.04 (m, 2H), 6.79 (d, J=8.3 Hz, 1H), 6.44 (dd, J=8.6, 1.0 Hz, 1H), 6.05 (d, J=8.5 Hz, 1H), 3.81 (s, 3H), 2.83 (s, 3H), 1.31 (s, 3H), 1-14 (s, 3H).

ESI-MS [M+H]⁺ m/z calculated for $C_{34}H_{30}NO_4^+$: 516.217 measured: 516.210.

12

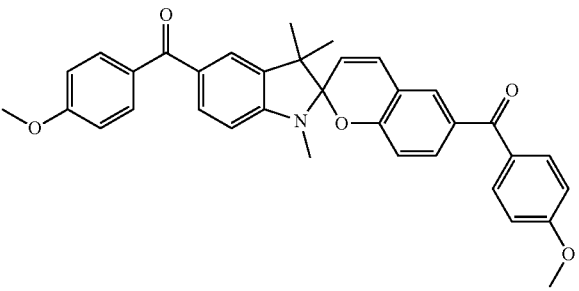

¹H NMR (500 MHz, Methylene Chloride-d₂) δ 7.75-7.67 (m, 4H), 7.59 (d, J=1.8 Hz, 1H), 7.43-7.31 (m, 3H), 6.96-6.90 (m, 4H), 6.74 (dd, J=8.5, 5.4 Hz, 2H), 6.34 (dd, J=8.7, 0.9 Hz, 1H), 5.84 (d, J=8.6 Hz, 1H), 3.74 (s, 6H), 2.80 (s, 3H), 1.34 (s, 3H), 1.14 (s, 3H).

ESI-MS [M+H]⁺ m/z calculated for $C_{35}H_{32}NO_5^+$: 546.227 measured: 546.218.

Synthesis of Compounds 22, 25, 64, 68

6'-Bromospiropyran (3 mmol) is dissolved in dry tetrahydrofuran (15 mL) and cooled to −78° C. n-Butyllithium (3.1 mmol) is added drop-wise and the solution is stirred for 30 min. The corresponding nitrile derivative (5 mmol) is added over 15 min and the reaction is allowed to warm to room temperature. Stirring is continued at room temperature for 2 h, after which water is added and the reaction mixture is extracted with dichloromethane. The combined organic layers are dried over anhydrous MgSO₄ and the solvent is evaporated under reduced pressure. The solid residue is purified by recrystallization from ethanol or silica gel column chromatography using acetone/petroleum ether mixtures as eluent.

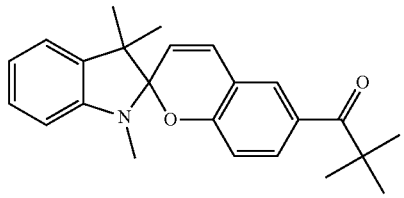

22

¹H NMR (400 MHz, Chloroform-d) δ 7.70 (dd, J=8.6, 2.3 Hz, 1H), 7.64 (d, J=2.2 Hz, 1H), 7.24-7.16 (m, 1H), 7.10 (dd, J=7.3, 1.3 Hz, 1H), 6.94-6.85 (m, 2H), 6.71 (d, J=8.6 Hz, 1H), 6.56 (d, J=7.7 Hz, 1H), 5.75 (d, J=10.3 Hz, 1H), 2.75 (s, 3H), 1.39 (s, 9H), 1.32 (s, 3H), 1.19 (s, 3H).

ESI-MS [M+H]⁺ m/z calculated for $C_{24}H_{28}NO_2^+$: 362.21 measured: 362.219.

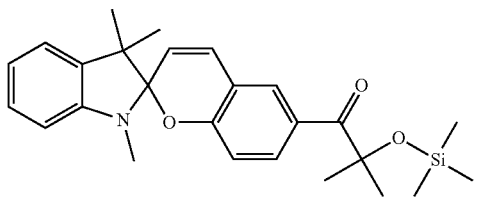

25

¹H NMR (500 MHz, Chloroform-d) δ 7.30-7.26 (m, 1H), 7.20 (dd, =8.3, 1.8 Hz, 1H) 7.15-7.09 (m, 2H), 7.00-6.94 (m, 1H), 6-75 (d, J=8.3 Hz, 1H), 6.56-6.50 (m, 1H), 6.30 (dd, J=8.6, 1.0 Hz, 1H), 5.78 (d, J=8.5 Hz, 1H), 2.99 (s, 3H), 130 (s, 3H), L25 (s, 6H), 1.14 (s, 3H), 0.12 (s, 9H).

ESI-MS [M+H]⁺ m/z calculated for $C_{26}H_{34}NO_3Si^+$: 436.230 measured: 436.238.

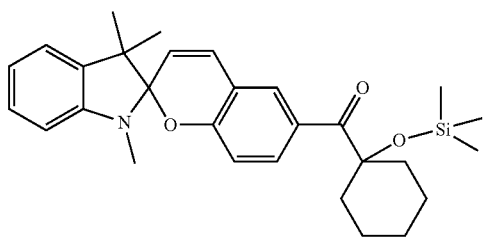

68

¹H NMR (500 MHz, Chloroform-d) δ 7.45-7.37 (m, 2H), 7.21-7.13 (m, 2H), 6.99-6.92 (m, 1H), 6.65 (d, J=8-3 Hz, 1H), 6.62-6.58 (m, 1H), 6-54 (dd, J=8.6, 1.0 Hz, 1H), 5.80 (d, J=8.6 Hz, 1H), 2.81 (s, 3H), 2.69-2.52 (m, 2H), 1.83-1.74 (m, 2H), 1.62-1.46 (m, 4H), 1.33 (s, 3H), 1.17 (s, 2H), 0.19 (s, 6H).

ESI-MS [M+H]⁺ m/z calculated for $C_{29}M_{38}NO_3Si^+$: 476.262 measured: 476.269.

Synthesis of Compounds 23, 24

2-Mercaptobenzoic acid (0.5 mmol) or phthalic acid anhydride (0.5 mmol) is slowly dissolved in sulfuric acid (1 mL) and stirred for 15 min. 5-Trifluoromethylspiropyran (0.5 mmol) is added slowly over 30 min and stirring is continued for 2 h. Ice (10 g) is added and the mixture is neutralized with aqueous Na₂CO₃ (10%). The reaction mixture is extracted with ethyl acetate. The combined organic layers are dried over anhydrous MgSO₄ and the solvent is evaporated under reduced pressure. The residue is purified by silica gel column chromatography using a ethyl acetate/petroleum ether mixture as eluent.

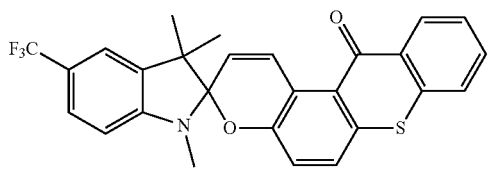

23

¹H NMR (400 MHz, Benzene-d₆) δ 8.99 (dd, J=10.8, 0.7 Hz, 1H), 8.84-8.75 (m, 1H), 7.51 (ddd, J=8.1, 1.9, 0.9 Hz, 1H), 7.47 (d, J=1.8 Hz, 1H), 7.15-7.11 (m, 1H), 7.11-7.03 (m, 2H), 6.81 (d, J=8.7 Hz, 1H), 6.67-6.59 (m, 1H), 6.21 (d, J=8.1 Hz, 1H), 5.7 (d, J=10.8 Hz, 1H), 2.54 (s, 3H), 1.24 (s, 3H), 0.99 (s, 3H).

ESI-MS [M+H]⁺ m/z calculated for $C_{27}H_{21}F_3NO_2S^+$: 480.124 measured: 480.116.

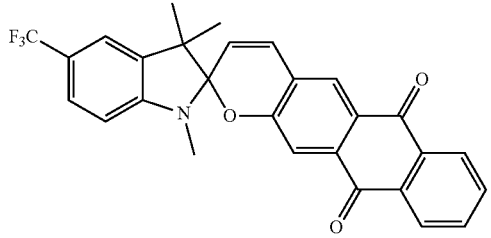

24

¹H NMR (500 MHz, Chloroform-d) δ 8.06-7.98 (m, 3H), 7.91-7.84 (m, 2H), 7.64 (s, 1H), 7.34 (d, J=2.1 Hz, 1H), 7.26 (dd, J=8.3, 2.2 Hz, 1H), 6.62 (d, J=8.5 Hz, 1H), 6.34 (dd, J=8.6, 1.0 Hz, 1H), 5.91 (d, J=8.6 Hz, 1H), 2.81 (s, 2H), 1.39 (s, 2H), 1.19 (s, 2H).

ESI-MS [M+H]⁺ m/z calculated for $C_{28}H_{21}F_3NO_3^+$: 476.147 measured: 476.152.

Synthesis of Compound 26

Compound 25 (3 mol) is dissolved in tetrahydrofuran, tetrabutylammonium fluoride (1 M in THF, 4.5 mol) is added. The mixture is stirred for 1 h and extracted with ethyl acetate. The combined organic layers are washed with water dried over anhydrous MgSO₄. The solvent is evaporated under reduced pressure and the residue is purified silica gel column chromatography using an ethyl acetate/petroleum ether mixture as eluent. The obtained alcohol is dissolved in acetonitrile. Iodomethane (6 mmol) and Cs₂CO₃ (6 mmol) are added and the mixture is heated to 70° C. over night. After cooling to room temperature, water is added, and the mixture is extracted with ethyl acetate. The combined organic layers are dried over anhydrous MgSO$_4$ and the solvent is evaporated under reduced pressure. The residue is purified by silica gel column chromatography using an acetone/petroleum ether mixture as eluent.

26

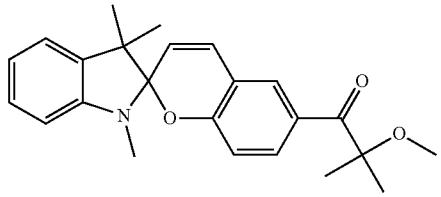

$^1$H NMR (400 MHz, Chloroform-d) δ 7.48-7.44 (m, 1H), 7.41 (dd, J=8.2, 1.9 Hz, 1H), 7.00 (dd, J=8.0, 1.0 Hz, 1H), 6.91 (td, J=7.6, 1.2 Hz, 1H), 6.70 (d, J=8.3 Hz, 1H), 6.55-6.46 (m, 2H), 6.40 (dd, J=8.8, 1.0 Hz, 1H), 5.78 (d, J=8.8 Hz, 1H), 3.30 (s, 3H), 2.78 (s, 3H), 1.48 (s, 6H), 1.29 (s, 3H), 1.18 (s, 3H).

ESI-MS [M+H]$^+$ m/z calculated for $C_{24}H_{27}NO_3^+$: 378.206 measured: 378.219.

Synthesis of compound 27

2-Bromo-2-ethylpropionyl bromide (5.25 mmol) is dissolved in dichloromethane (50 mL) and cooled to 0° C. AlCl$_3$ (5.5 mmol) is added in small portions and stirring is continued for 15 min. 5-Trifluoromethylspiropyran (5 mmol) is added over 30 mi and stirring is continued for 2 h. The reaction is poured on ice (50 g) and extracted with dichloromethane. The combined organic layers are dried over anhydrous MgSO$_4$ and the solvent is evaporated under reduced pressure. The residue is purified by silica gel column chromatography using an ethyl acetate/petroleum ether mixture as eluent.

The obtained alpha-bromobutyrate (2 mmol) is dissolved in acetonitrile (25 mL) and sodium tolylsulfinate (2.5 mmol) is added. The mixture is heated to reflux for 4 h. After cooling to room temperature, water is added, and the mixture is extracted with ethyl acetate. The combined organic layers are dried over anhydrous MgSO$_4$ and the solvent is evaporated under reduced pressure. The residue is purified by silica gel column chromatography using an acetone/ petroleum ether mixture as eluent.

27

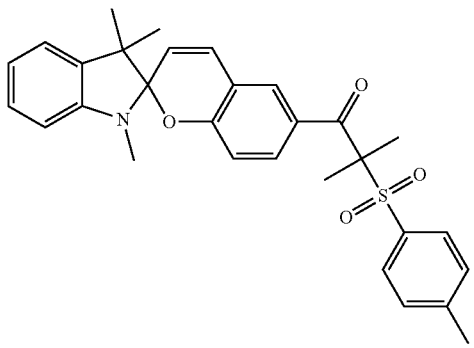

$^1$H NMR (400 MHz, Chloroform-d) δ 7.43 (dd, J=1.8, 1.1 Hz, 1H), 7.40-7.33 (m, 3H), 7.28-7.22 (m, 2H), 7.01 (dd, J=7.8, 1.0 Hz, 1H), 6.89 (td, J=7.5, 1.0 Hz, 1H), 6.73 (d, J=8.3 Hz, 1H), 6.46-6.35 (m, 3H), 5.74 (d, J=8.6 Hz, 1H), 2.78 (s, 3H), 2.35 (s, 3H), 1.49 (s, 6H), 1.29 (s, 3H), 1.17 (5, 3H).

ESI-MS [M+H]$^+$ m/z calculated for $C_{30}H_{32}NO_4S^{30}$: 502.205 measured: 502.216.

Synthesis of Compound 30

2,2,2-Trichloroacetyl chloride (2.1 mmol) is dissolved in dichloromethane (20 mL) and cooled to 0° C. AlCl$_3$ (2.2 mmol) is added in small portions and stirring is continued for 15 min. 5-Trifluoromethylspiropyran (2 mmol) is added over 30 min and stirring is continued for 2 h. The reaction is poured on ice (20 g) and extracted with dichloromethane. The combined organic layers are dried over anhydrous MgSO$_4$ and the solvent is evaporated under reduced pressure. The residue is purified by silica gel column chromatography using an ethyl acetate/petroleum ether mixture as eluent.

30

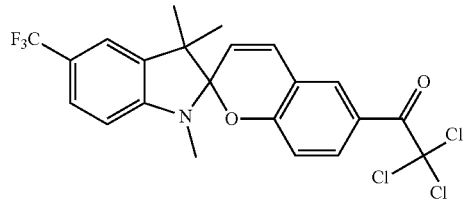

$^1$H NMR (500 MHz, Chloroform-d) δ 7.59 (dd, J=84, 1.7 Hz, 1H), 7.44 (dd, J=1.9, 1.0 Hz, 1H), 7.34 (d, J=2.1 Hz, 1H), 7.19 (dd, J=8.3, 2.1 Hz, 1H), 0.69 (d, J=0.4 Hz, 1H), 0.60 (d, J=8.5 Hz, 1H), 6.37 (dd, J=8.6, 1.0 Hz, 1H), 5.86 (d, J=85 Hz, 1H), 2.80 (s, 3H), 1.21 (s, 3H), 0.09 (s, 3H).

ESI-MS [M+H]$^+$ m/z calculated for $C_{22}H_{18}Cl_3F_3NO_2^+$: 490.035 measured: 490.180.

Synthesis of Compounds 58-60, 63

5-Trifluoromethylspiropyran (5 mmol), MgCl$_2$ (75 mmol), triethylamine (18-75 mmol), and paraformaldehyde 7 mmol) are dissolved in THF and heated to 70° C. for 3 days. The mixture is cooled to room temperature, neutralized with 1 M aqueous HCl, and is extracted with ethyl acetate. The combined organic layers are dried over anhydrous MgSO$_4$ and the solvent is evaporated under reduced pressure. The residue is purified by silica gel column chromatography using an ethyl acetate/petroleum ether mixture as eluent. The reaction is performed in the same manner using 5-trifluoromethyl-5',7'-dimethylspiropyran, 5-trifluoromethyl-5',7'-dimethoxyspiropyran, or 5-trifluoromethyl-6',7'-difluoro-N-(3,5-dimethylbenzyl)-spiropyran.

5-Trifluoromethyl-6'-formylspiropyran (2.5 mmol) and diphenylphosphinoxide (2.5 mmol) are dissolved in THF (25 mL) under an argon atmosphere. Triethylamine (2.5 mmol) is added dropwise and stirring is continued for 18 h. Water is added and the mixture is extracted with ethyl acetate. The combined organic layers are dried over anhydrous MgSO$_4$ and the solvent is evaporated under reduced pressure. The residue is purified by silica gel column chromatography using an ethyl acetate/petroleum ether mixture as eluent. The reaction is performed in the same manner using 5-trifluoromethyl-5',7'-dimethyl-6'-formylspiropyran, 5-trifluoromethyl-5',7'-dimethoxy-6'formylspiropyran, or 5-trifluoromethyl-6',7'-difluoro-N-(3,5-dimethyl-4-formyl-benzyl)-spiropyran.

The corresponding formylspiropyran derivative (1.5 mmol) and MnO₂ (30 mmol) are mixed in dichloromethane and stirred over night. The reaction is filtered over celite and the solvent is evaporated under reduced pressure. Silica gel column chromatography is performed using ethyl acetate/petroleum ether mixtures as eluent to yield the desired products.

58

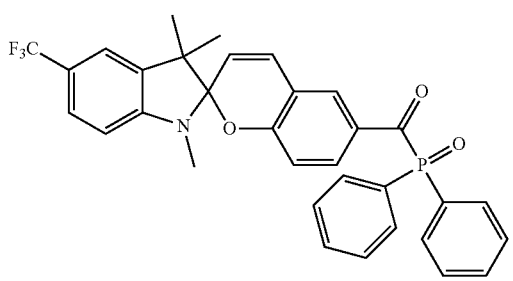

$^1$H NMR (400 MHz, Chloroform-d) δ 8.47 (d, J=2.2 Hz, 1H), 8.32 (dd, J=8.7, 2.2 Hz, 1H), 7.92-7.83 (m, 5H), 7.56 (td, J=7.3, 1.5 Hz, 2H), 7.48 (tdd, J=10.3, 7.5, 4.8 Hz, 6H), 6.98 (d, J=10.4 Hz, 1H), 6.81-6.75 (m, 1H), 6.54 (d, J=8.2 Hz, 1H), 5-74 (d, J=10.4 Hz, 1H), 2.75 (s, 3H), 1.28 (s, 3H), 1.17 (s, 3H).

ESI-MS [M+H]⁺ m/z calculated for $C_{33}H_{28}F_3NO_3P^+$: 574.175 measured: 574-189.

59

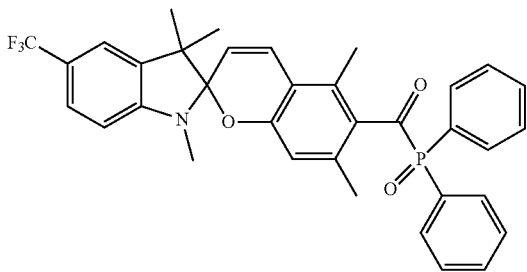

$^1$H NMR (400 MHz, Chloroform-d) δ 8.01-7.94 (m, 4H), 7.61-7.52 (m, 2H), 7.44-7.32 (m, 5H), 7.28 (dd, J=8.3, 1.8 Hz, 1H), 6.75-6.63 (m, 2H), 6.5 (d, J=8.7 Hz, 1H), 5.80 (d, J=−5 Hz, 1H), 2.87 (s, 3H), 2.44 (s, 6H), 1.31 (s, 3H), 1.11 (s, 3H).

ESI-MS [M+H]⁺ m/z calculated for $C_{35}H_{32}F_3NO_3P^+$: 602.207 measured: 602.199.

60

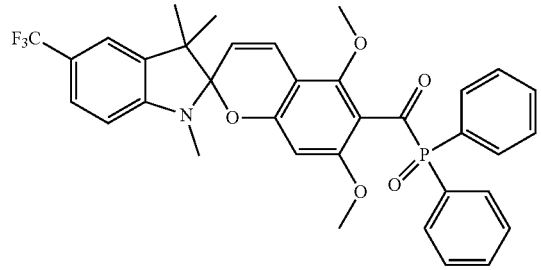

$^1$H NMR (400 MHz, Chloroform-d) δ 8.01-7.95 (m, 4), 7.58-7.50 (m, 2H), 7.42-7.35 m, 5H), 7.31 (dd, J=8.4, 1.7 Hz, 1H), 6.80 (d, J=8.3 Hz, 1H), 6.74 (d, J=8.9 Hz, 1H), 6.44 (s, 1H), 5.82 (d, J=8.8 Hz, 1H), 3.84 (s, 6H), 2.87 (s, 3H), 1.29 (s, 3H), 1.14 (s, 3H).

ESI-MS [M+H]⁺ m/z calculated for $C_{35}H_{32}F_3NO_5P^+$: 634.196 measured: 634.182.

63

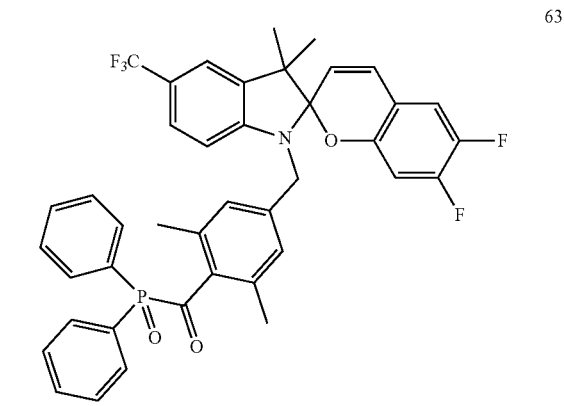 [SMILES: Cc1cc(CN2c3ccc(C(F)(F)F)cc3C(C)(C)C23C=Cc2cc(F)c(F)cc2O3)cc(C)c1C(=O)P(=O)(c1ccccc1)c1ccccc1]

$^1$H NMR (400 MHz, Chloroform-d) δ 7.87-7.81 (m, 41), 7.54-7.47 (m, 2H), 7.42-7.34 (m, 5H), 7.30-7.20 (m, 1H), 7.18 (ddd, J=7.9, 4.9, 1.0 Hz, 1H), 7.15 (t, J=1.0 Hz, 2H), 6.89 (d, J=8.3 Hz, 1H), 6.62 (dd, J=8.0, 5.0 Hz, 1H), 6.53 (dd, J=8.7, 0.9 Hz, 1H), 5.82 (d, J=8.5 Hz, 1H), 4.80 (dt, J=13.0, 1.0 Hz, 1H), 4.41 (dt, J=13.0, 1.0 Hz, 1H), 2.41 (s, 6H), 1.34 (s, 2H), 1.23 (s, 2H).

ESI-MS [M+H]⁺ m/z calculated for $C_{41}H_{34}F_5NO_3P^+$: 714.219 measured: 714.211.

Synthesis of Compound 61

5-Trifluoromethyl-6'-formylspiropyran (5 mmol) and 1,3-propanedithiol (5 mmol) are dissolved in chloroform (10 mL) and cooled to −10° C. Gaseous HCl is passed through the solution for 45 mi and stirring is continued for 30 min at 0° C. and over night at room temperature. The solvent is evaporated under reduced pressure and the residue is suspended in methanol (5 mL). The slurry is stirred over night and filtered. The solid residue is dried under reduced pressure.

The dithian derivative (5 mmol) is dissolved in dry tetrahydrofuran (10 mL) under an argon atmosphere and cooled to −78° C. n-butyl lithium (1.6 M in hexanes, 5 mmol) is added dropwise. The solution is warmed to 0° C. and stirred for 30 min. Dimethylgermanium dicholoride (2 mmol) in dry tetrahydrofuran (5 mL) is added dropwise and stirred for 3 h at 0° C. and continued over night at room temperature.

Water is added and the mixture is extracted with ethyl acetate. The combined organic layers are washed with water and dried over anhydrous MgSO$_4$. The solvent is removed under reduced pressure. Ethyl acetate (2.5 mL) is added to the solid residue to give a suspension. After stirring over night, methanol (5 mL) is added stirring is continued for 24 h. The suspension is filtered, washed with ethyl acetate/methanol (1/1), and dried under reduced pressure.

The dithian diethylgermanium derivative (1.5 mmol) is dissolved in tetrahydrofuran (10 mL) and water is added (2 mL). CaCO$_3$ (1.8 mmol) and iodine (1.8 mmol) are added in portions over 4 h accompanied by intermittent ice-cooling. The reaction mixture is stirred over night at room temperature and filtered over silica gel. Saturated aqueous sodium dithionite solution is added until the color of the resulting suspension changes to yellow. The mixture is filtered and washed with water. The residue is taken up in ethyl acetate and washed with water. The organic phase is dried over anhydrous MgSO$_4$ and the solvent is evaporated under reduced pressure. Silica gel column chromatography is performed using ethyl acetate/petroleum ether as eluent to yield the desired product.

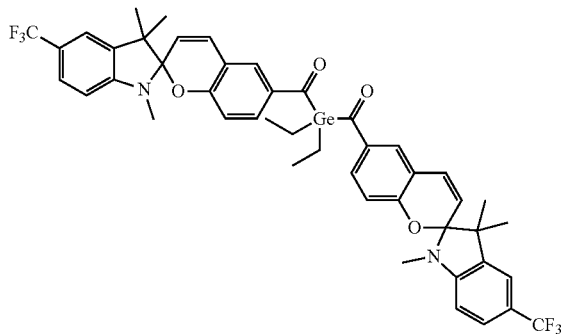

61

$^1$H NMR (500 MHz, Chloroform-d) δ 8.15-8.03 (m 4H), 7.51 (dd, J=8.4, 2.1 Hz, 2H), 7.45 (d, J=2.0 Hz, 2H), 7.32 (d, J=8.4 Hz, 2H), 7.12 (d, J=8.2 Hz, 2H), 6.48-6.42 (m, 2H), 5.80 (d, J=8.7 Hz, 2H), 2-75 (s, 6H), 2.08 (q, J=6.7 Hz, 4H), 1.39 (s, 6H), 1.33 (t, J=6.8 Hz, 6H), 1.19 (s, 6H).

ESI-MS [M+H]$^+$ m/z calculated for C$_{46}$H$_{45}$F$_6$GeN$_2$O$_4$$^+$: 877.249 measured: 877.221.

Synthesis of Compound 65

2-Bromo-2-methylpropionyl bromide (5.25 mmol) is dissolved in dichloromethane (50 mL) and cooled to 0° C. AlCl$_3$ (5.5 mmol) is added in small portions and stirring is continued for 15 min. 5-Trifluoromethylspiropyran (5 mmol) is added over 30 min and stirring is continued for 2 h. The reaction is poured on ice (50 g) and extracted with dichloromethane. The combined organic layers are dried over anhydrous MgSO$_4$ and the solvent is evaporated under reduced pressure. The residue is purified by silica gel column chromatography using an ethyl acetate/petroleum ether mixture as eluent.

The obtained alpha-bromobutyrate (2 mmol) is dissolved in morpholine (10 mL) and heated to 80° C. for 2 days. After cooling to room temperature, water is added, and the mixture is extracted with ethyl acetate. The combined organic layers are dried over anhydrous MgSO$_4$ and the solvent is evaporated under reduced pressure. The residue is purified by silica gel column chromatography using an acetone/petroleum ether mixture as eluent.

Alternatively, the obtained alpha-bromobutyrate (2 mmol) is dissolved in toluene (2 mL) and added dropwise to a solution of sodium methylate in methanol (30%, 10 mL at 0° C. and stirred for 8 h. The suspension is filtered, morpholine (20 mL) is added to the solid residue and the mixture is heated to 13° C. for 24 h. After cooling to room temperature, water is added, and the mixture is extracted with ethyl acetate. The combined organic layers are dried over anhydrous MgSO$_4$ and the solvent is evaporated under reduced pressure. The residue is purified by silica gel column chromatography using an acetone/petroleum ether mixture as eluent.

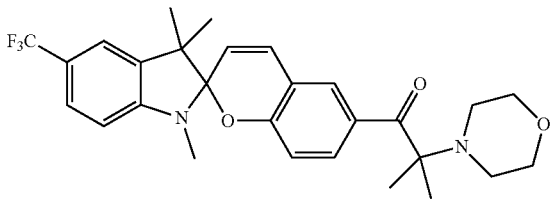

65

$^1$H NMR (400 MHz, Chloroform-d) δ 7.50 (dd, J=8.4, 1.9 Hz, 1H), 7.48-7.41 (m, 2H), 7.37 (dd, J=8.4, 1.9 Hz, 1H), 6.85 (d, 8.4 Hz, 1H), 6.83 (d, 8.4 Hz, 1H), 6.52 (dd, J=8.6, 1.0 Hz, 1H), 5.84 (d, J=8.6 Hz, 1H), 3.72-3.65 (m, 2H), 3.64-3.58 (m, 2H), 2.88 (s, 3H), 2.70-2.63 (m, 4H), 1.35 (s, 3H), 1.30 (s, 6H), 1.19 (s, 3H).

ESI-MS [M+H]$^+$ m/z calculated for C$_{28}$H$_{32}$F$_3$N$_2$O$_3$$^+$: 501.236 measured: 501.240.

Synthesis of Compound 66 and 67

2-Bromobutyryl bromide (5.25 mmol) is dissolved in dichloromethane (50 mL) and cooled to 0° C. AlCl$_3$ (5.5 mmol) is added in small portions and stirring is continued for 15 min. 5-Trifluoromethylspiropyran (5 mmol) is added over 30 min and stirring is continued for 2 h. The reaction is poured on ice (50 g) and extracted with dichloromethane. The combined organic layers are dried over anhydrous MgSO$_4$ and the solvent is evaporated under reduced pressure. The residue is purified by silica gel column chromatography using an ethyl acetate/petroleum ether mixture as eluent.

The obtained alpha-bromobutyrate (2 mmol) is dissolved in tetrahydrofuran and added dropwise to a solution of the corresponding amine in tetrahydrofuran (2 M, 10 mmol) at 0° C. The mixture is stirred at 0° C. for 2 h and for a further 4 h at room temperature. The solvent is evaporated under reduced pressure to yield an alpha-aminobutyrate which is directly used in the next step.

The obtained alpha-aminobutyrate (2 mmol) is dissolved in acetonitrile (10 mL), benzyl bromide (2.5 mmol) and heated to 70° C. for 2 h. After cooling to room temperature, the solvent is evaporated under reduced pressure and the remaining crude product is suspended in ethanol (to mL). NaOH in water (30%, 10 mL) is added, and the mixture is heated to 60° C. for 4 h. After cooling to room temperature, the mixture is neutralized with 1 M aqueous HCl and extracted with ethyl acetate. The combined organic layers are dried over anhydrous MgSO$_4$ and the solvent is evaporated under reduced pressure. The residue is purified by silica gel column chromatography using an acetone/petroleum ether mixture as eluent.

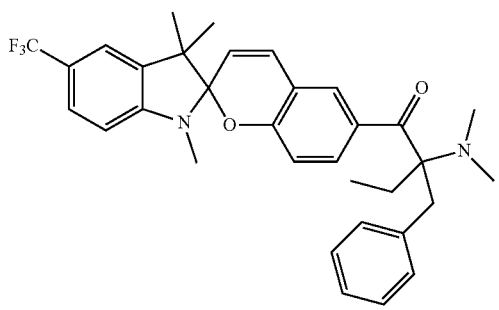

66

$^1$H NMR (500 MHz, Chloroform-d) δ 7.65-7.56 (m, 2H), 7.44 (d, J=1.8 Hz, 1H), 7.38-7.28 (m, SH), 7.27-7.15 (m, 3H), 6.82 (dd, J=8.3, 0.9 Hz, 2H), 6.54 (dd, J=8.6, 1.0 Hz, 1H), 5.81 (d, J=8.6 Hz, 1H), 3.50 (t, J=1.0 Hz, 2H), 2.82 (s, 3H), 2.42 (s, 6H), 1.98-188 (m, 2H1), 1.35 (s, 3H), 1.19 (s, 2H), 0.91 (t, J=7.2 Hz, 3H).

ESI-MS [M+H]$^+$ m/z calculated for C$_{33}$H$_{36}$F$_3$N$_2$O$_2$$^+$: 549.272 measured: 549.284.

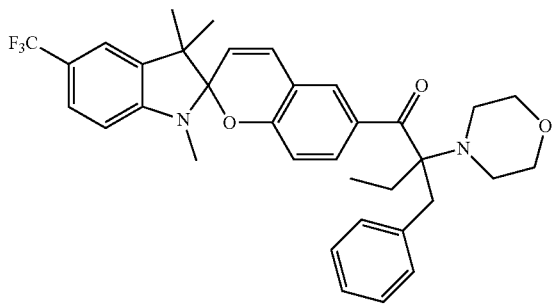

67

$^1$H NMR (400 MHz, Chloroform-d) δ 7.56 (d, J=1.8 Hz, 1H), 7.44-7.38 (m, 2H), 7.37-7.28 (m, 2H), 7.31-7.21 (m, 41), 6.65 (dd, J=8-5, 0.9 Hz, 2H), 6.35 (dd, J=8.6, 1.0 Hz, 1H), 5.81 (d, J=8.5 Hz, 1H), 3.61 (t, J=5.9 Hz, 4H), 3.51 (t, J=0.9 Hz, 2H), 2.84 (s, 3H), 3.06-2.93 (m, 3H), 2.44-2.38 (m, 2H), 1.93-1.82 (m, 2H), 1.32 (s, 3H), 1.20 (s, 3H), 0.96 (t, J=7.1 Hz, 3H).

ESI-MS [M+1]$^+$ m/z calculated for C$_{35}$H$_{38}$F$_3$N$_2$O$_3$$^+$: 591.283 measured: 591.288.

Synthesis of Compound 69

Compound 68 (3 mmol) is dissolved in tetrahydrofuran, tetrabutylammonium fluoride (1 M in THF, 4-5 mmol) is added. The mixture is stirred for 1 h and extracted with ethyl acetate. The combined organic layers are washed with water dried over anhydrous MgSO$_4$. The solvent is evaporated under reduced pressure and the residue is purified silica gel column chromatography using an ethyl acetate/petroleum ether mixture as eluent.

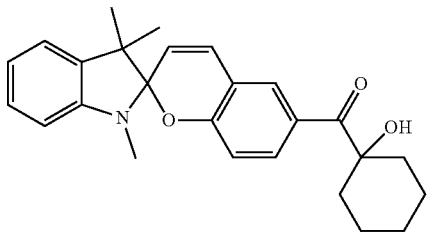

69

$^1$H NMR (400 MHz, Chloroform-d) δ 7.95 (dd, J=8.7, 2.2 Hz, 1H), 7.90 (d, J=2.2 Hz, 1H), 7.20 (td, J=7.7, 1.2 Hz, 1H), 7.09 (d, J=7.1 Hz, 1H), 6.92 (d, J=10.3 Hz, 1H), 6.87 (t, J=7.4 Hz, 1H), 6.73 (d, J=8.6 Hz, 1H), 6.55 (d, J=7.8 Hz, 1H), 5.76 (d, J=10.3 Hz, 1H), 3.54 (s, 1H), 2.74 (s, 3H), 2.13-1.98 (m, 2H), 1.89-1.63 (m, 8H), 1-30 (s, 3H), 1.18 (s, 3H).

ESI-MS [M+H]$^+$ m/z calculated for C$_{26}$H$_3$NO$_3$: 404.222 measured: 404.228.

Synthesis of Compounds 71-74

Compound 70 (2 mmol) is dissolved in dry dichloromethane (mL) and the corresponding isocyanane is added dropwise. The reaction mixture is stirred for 1 h and the solvent is removed under reduced pressure. The residue is purified silica gel column chromatography using an acetone/petroleum ether mixture or a methanol/dichloromethane mixture as eluent.

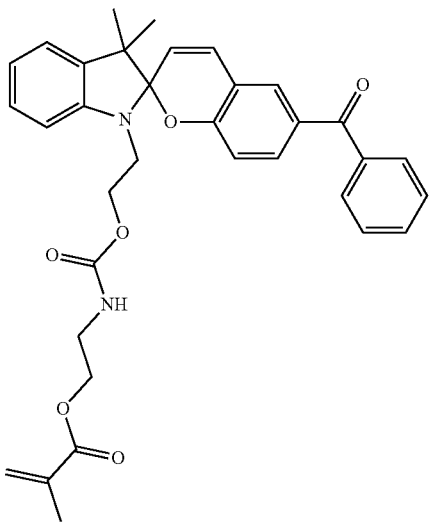

71

$^1$H NMR (500 MHz, Chloroform-d) δ 7.87-7.80 (m, 2H), 7.65-7.64 (m, 2H), 7.48-7.40 (m, 3H), 7.5-7.05 m, 2H), 7.04 (ddd, J=7.9, 7.2, 1.9 Hz, 1H), 6.76 (d, J=8.4 Hz, 1H), 0.5 (dd, J=7.9, 1.4 Hz, 1H), 6.28 (dd, J=8.6, 1.0 Hz, 1H), 6.18-6.14 (m 1H), 5.93-5.82 (m, 2H), 5.36 (t, J=4.2 Hz, 1H), 4.52-4.44 (m, 1H), 4.32-4.22 (m, 3H), 3.91-3.82 (m, 1H), 3.78-3.69 (m, 1H), 3.69-3.60 (m, 1H), 3.31-3.21 (m, 1H), 193 (t, J=0.9 Hz, 3H), 1.29 (s, 3H), 1.15 (s, 3H).

ESI-MS [M+H]$^+$ m/z calculated for C$_{34}$H$_{35}$N$_2$O$_6$$^+$: 567.249 measured: 567.241.

72

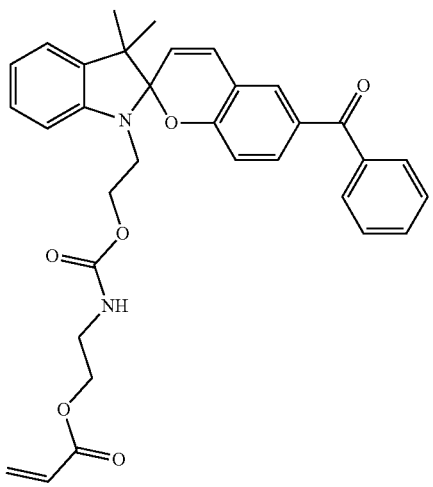

¹H NMR (500 MHz, Chloroform-d) δ 7.71-7.64 (m, 2H), 7.49-7.42 (m, 1H), 7.39-7.28 (m, 4H), 7.14-7.04 (m, 2H), 7.00 (ddd, J=7.9, 7.1, 1.9 Hz, 1H), 6.70 (d, J=8.3 Hz, 1H), 6.52 (dd, J=8.0, 1.4 Hz, 1H), 6.31 (dd, J=8.7, 1.0 Hz, 1=), 6.08 (dd, J=10.1, 9.4 Hz, 1H), 5.94 (d, J=8.8 Hz, 1H), 5.78 (d, J=9.9 Hz, 2H), 5.53 (t, J=4.4 Hz, 1H), 4.58-4.48 (m, 2H), 4.47-4.38 (m 1H), 4.33-4.26 (m, 1H), 3.82-3.73 (m, 1H), 3.71-3.62 (m, 1H), 3.60-3.50 (m, 2H), 1.29 (s, 3H), 1.21 (s, 3H).

ESI-MS [M+H]⁺ m/z calculated for $C_{33}H_{33}N_2O_6^+$: 553.233 measured: 553.245.

74

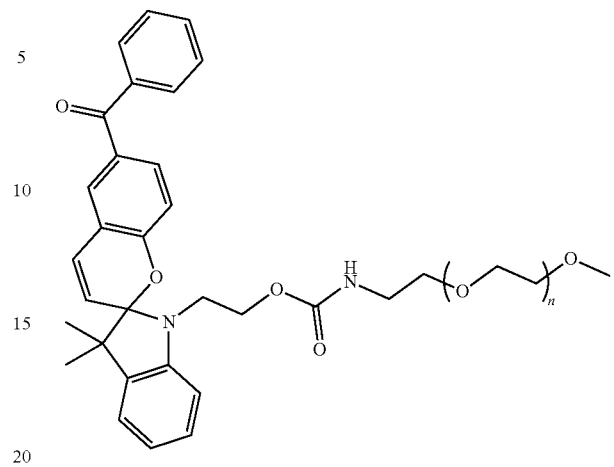

¹H NMR (500 MHz, Chloroform-d) δ 7.85-7.79 (m, 2H), 7.54-7.44 (m, 2H), 7.44-7.35 (m, 3H), 7.16-7.07 (m, 2H), 7.06-7.01 (m, 1H), 6.99-6.92 (m, 2H), 6.47 (dd, J=8.6, 1.0 Hz, 1H), 5.83 (d, J=8.5 Hz, 1H), 0.6 (t, J=4.4 Hz, 1H), 4.54 (d, J=3.1 Hz, 2H), 4.30-4.19 (m, 2H), 3.83-3.72 (m, 2H), 3.71-3.55 (m, 44H), 3.43-3.30 (m, 2H), 3.25 (s, 3H), 1.27 (s, 3H), 1.19 (s, 3H).

Synthesis of Compounds 75 and 76

Compound 70 (3 mmol) is dissolved in acetonitrile (25 mL) and cooled to 0° C. Tosyl chloride (10 mmol) or 2-bromomethyl-1,4-benzodioxane (10 mmol) and K₂CO₃ (11 mmol) are added and the mixture is heated to 70° C. for 2 days. The reaction mixture is stirred for 1 h and the solvent is removed under reduced pressure. The residue is purified silica gel column chromatography using an acetone/petroleum ether mixture or a methanol/dichloromethane mixture as eluent. Water is added and the mixture is extracted with ethyl acetate. The combined organic layers are dried over anhydrous MgSO₄ and the solvent is evaporated under

73

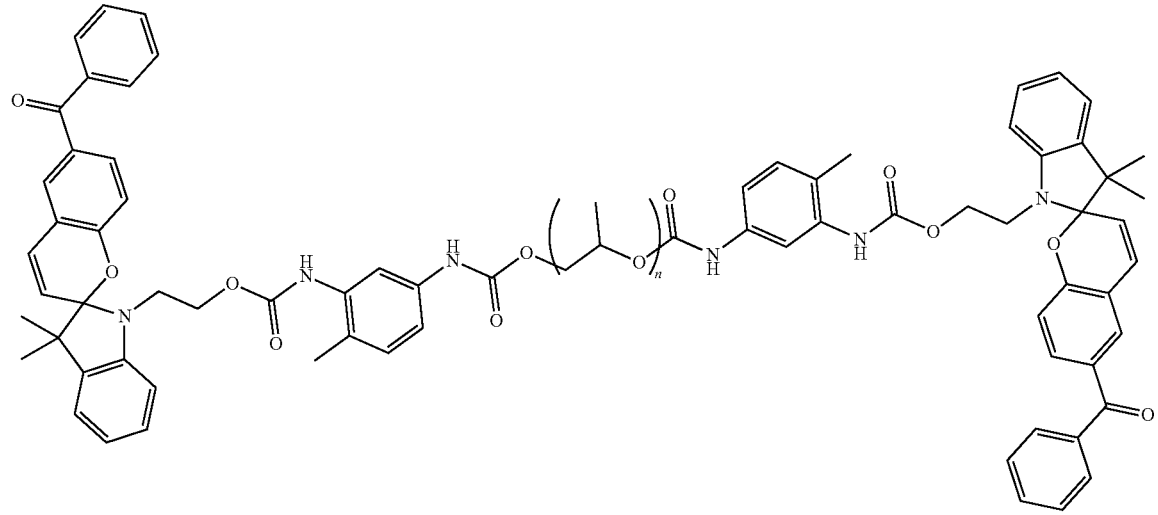

¹H NMR (500 MHz, Chloroform-d) δ 7.98 (d, J=2.3 Hz, 2H), 7.77 (s, 2H), 7.60 (s, 2H), 7.40-7.36 (m, 2H), 7.30-7.11 (m, 20H), 7.03-6.92 (m, 4H), 6.67 (dd, J=8.4, 2.1 Hz, 2H), 6.50 (d, J=8.3 Hz, 2H), 6.29 (dd, J=8.6, 0.9 Hz, 2H), 5.62-5 (m, 2H), 5.03-4.97 (m, 2H), 4.54-4.42 (m, 4H), 4.02-3.91 (m, 4H), 3.85-3.74 (m, 32H), 3.56-3.42 (m, 641), 3.42-3.35 (m, 4H), 2.30 (s, 6H), 1.39 (d, J=6.4 Hz, 6H), 1.32-1.24 (m, 96H), 1.24 (s, 6H), 1.14 (s, 6H).

ESI-MS [M+2H]²⁺ m/z calculated for $C_{174}H_{270}N_6O_{45}^{2+}$: 1582.452 measured: 1582.436, reduced pressure. The residue is purified by silica gel column chromatography using an acetone/petroleum ether mixture as eluent.

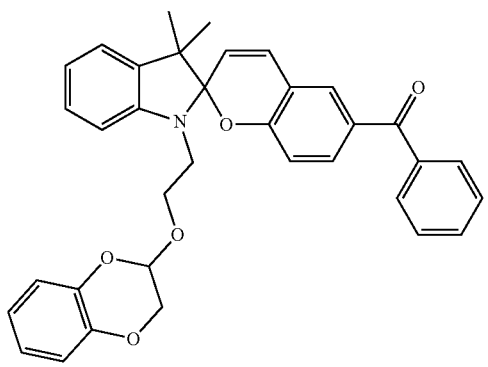

75

¹H NMR (500 MHz, Chloroform-d) δ 7.71-7.64 (m, 2H), 7.61-7.50 (m, 2H), 7.49-7.41 (m, 3H), 7.12-7.02 (m, 2H), 7.01 (td, J=7.5, 1.5 Hz, 1H), 6.97-6.79 (m, 5H), 6.66 (dd, J=7.7, 1.6 Hz, 1H), 6.32 (dd, J=8.7, 1.1 Hz, 1H), 5.84 (d, J=8.6 Hz, 1H), 5.54 (t, J=4.8 Hz, 1H), 4.31 (dd, J=12.3, 4.9 Hz, 1H), 4.11 (dd, J=12.1, 4.9 Hz, 1H), 3.89-3.76 (m, 2H), 3.75-3.67 (m, 1H), 3.51-3.45 (m, 1H), 1.31 (s, 3H), 1.16 (s, 3H).

ESI-MS [M+H]⁺ m/z calculated for $C_{35}H_{32}NO_5^+$: 546.227 measured: 546.239.

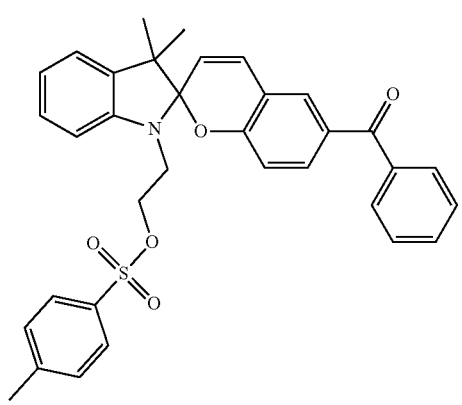

76

¹H NMR (500 MHz, Chloroform-d) δ 7.87-7.80 (m, 2H), 7.69-7.63 (m, 2H), 7.58-7.50 (m, 2H), 7.51-7.42 (m, 5H), 7.20 (dd, J=7.7, 1.5 Hz, 1H), 7.04 (td, J=7-5, 1.3 Hz, 1H), 6.99 (td, J=7.3, 1.5 Hz, 1H), 6.80 (d, J=8.4 Hz, 1H), 6.59 (dd, J=7.8, 1. Hz, 1H), 6.39 (dd, J=8.6, 0.9 Hz, 1H), 5.84 (d, J=8.8 Hz, 1H), 4.50-4.44 (m, 1H), 4.41-4.35 (m, 1H), 4.10-3.99 (m, 1H), 3.78-3.68 (m, 1H), 2.40 (s, 3H), 1.29 (s, 3H), 1.10 (s, 3H).

ESI-MS [M+H]⁺ m/z calculated for $C_{34}H_{32}NO_5S^+$: 566.200 measured: 566.208.

Synthesis of Compounds 79 and 80

4-Hydroxybenzophenone (4 mmol), the corresponding 1,1-diaryl-2-propyn-1-ol (4 mmol), and beta-cyclodextrin hydrate (320 mg) are dissolved in water (10 mL) and heated to 90° C. over night. The mixture is extracted with ethyl acetate. The combined organic layers are dried over anhydrous MgSO₄ and the solvent is evaporated under reduced pressure. The residue is purified by silica gel column chromatography using an acetone/petroleum ether mixture as eluent.

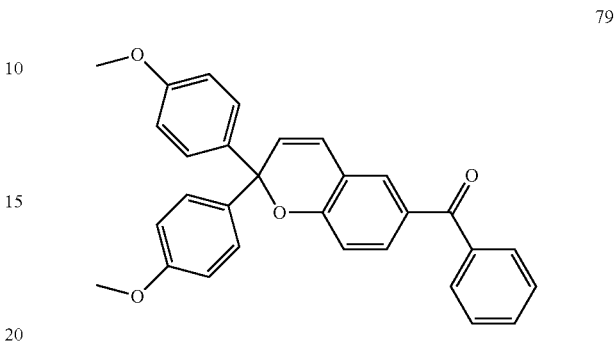

79

¹H NMR (500 MHz, Chloroform-d) δ 7.79-7.71 (In, 2H), 7.64 (dd, J=8.4, 2.2 Hz, 1H), 7.58-7.54 (m, 2H), 7.51-7.43 (m, 2H), 7.37-7.31 (m, 4H), 6.95 (dd, J=8.4, 0.7 Hz, 1H), 6.90-6.85 (m, 4H), 6.62 (dd, J=10.0, 0.7 Hz, 1H), 6.17 (d, J=9.9 Hz, 1H), 3.80 (s, 6H).

ESI-MS [M+H]⁺ m/z calculated for $C_{30}H_{25}O_4^+$: 449.175 measured: 49.184.

80

¹H NMR (500 MHz, Chloroform-d) δ 9.49 (d J=8.0 Hz, 1H), 9.33 (d, J=8.2 Hz, 1H), 7.42-7.30 (m, 4H), 7.28 (d, J=4.1 Hz, 3H), 7.24-7.17 (m, 4H), 7.12 (d, J=8.7 Hz, 1H), 6.83 (d, J=8.8 Hz, 1H), 6.75 (d, J=9.0 Hz, 2H), 6.48 (d, J=8.1 Hz, 1H), 6.38 (d, J=7.9 Hz, 1H), 3.83-3.71 (m, 4H), 3.21-3.12 (m, 4H).

ESI-MS [M+H]⁺ m/z calculated for $C_{32}H_{28}NO_3^+$: 474.206 measured: 474.220.

Synthesis of Precursors

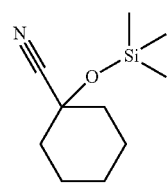

1-Hydroxy-1-carbonitrilecyclohexane (10 g) was dissolved in THF (50 ml), cooled to −20° C., and then Et₃N (13 mL) was added. A solution of trimethylsilyl chloride (12 g in 20 ml of THF) was added dropwise. The solution was stirred at −20° C. for 1.5 h and at rt overnight. The mixture was extracted with methy-tert-butyl ether and the combined organic layers were dried over anhydrous MgSO₄. The solvent was evaporated under reduced pressure and the product obtained after distillation as a clear liquid.

¹H NMR (500 MHz, Chloroform-d) 1.92 (dt, J=13.3, 3.3 Hz, 2H), 1.63 (dt, J=13.2, 3.8 Hz, 2H), 1.55-1.38 (m, 5H), 1.18-1.06 (m, 1H), 0.11 (s, 3H).

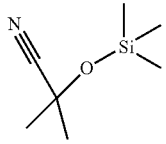

2-Hydroxy-2-carbonitrilepropane (25 g) was dissolved in THF (150 ml), cooled to −20° C., and then Et₃N (46 mL) was added. A solution of trimethylsilyl chloride (42 g in 65 ml of TH) was added dropwise. The solution was stirred at −20° C. for 1.5 h and at room temperature overnight. The mixture was extracted with methyl-tert-butyl ether and the combined organic layers were dried over anhydrous MgSO₄. The solvent was evaporated under reduced pressure and the product obtained after distillation as a clear liquid.

¹H NMR (500 MHz, Chloroform-d) δ 1.58 (s, 6H), 0.22 (s, 9H).

General Synthesis of Salicylaldehydes

The corresponding phenol derivative (5 mmol) and NaOH (105 mmol) are dissolved in water (55 L) and heated to 70° C. to 90° C. Chloroform (75 mmol) is added and heating is continued until consumption of starting materials. In cases where the reaction stops without completion, further chloroform (75 mol) is added. After cooling to room temperature, the mixture is acidified with aqueous hydrochloric acid (10%) and extracted with methyl-tert-butyl ether. The combined organic layers are mixed with water (100 mL) and KOH (7.5 g). The aqueous layer is washed with chloroform and then acidified with aqueous hydrochloric acid (10%). The aqueous phase is extracted with methyl-tert-butyl ether and the combined organic extracts from the last step are dried over anhydrous MgSO4. The solvent is removed under reduced pressure and the obtained product is used without further purification directly in the next step.

Synthesis of Ortho-Nitrosophenols

The corresponding phenol (25 mmol) is dissolved, in acetic acid (150 mL) and NaNO₂ (7 mmol) in water (17 mL) is added dropwise at 0° C. The mixture is stirred at 0° C. for 2 h and a further 4 h at room temperature. Water is added to precipitate the crude product, which is filtered off and used without further purification.

General Synthesis of Indolenium Salts

The corresponding aniline derivative (50 mmol) is dissolved in a mixture of concentrated aqueous hydrochloric acid (20 mL) and ice water (30 mL). NaNO₂ (100 mmol) in water is added at 0° C. After stirring for 30 min, SnCl₂ (28.4 g) in concentrated aqueous hydrochloric acid (35 mL) is added. The resulting mixture is stirred for 30 min, filtered, and washed with water or 1M aqueous hydrochloric acid to obtain the hydrazine hydrochloride which is used directly in the next step.

The corresponding hydrazine (as hydrochloride salt) (47.5 mmol), 3-methylbutan-2-one and concentrated aqueous sulfuric acid are dissolved in glacial acetic acid (68 mL). The mixture is refluxed for 24 h, after which the main fraction of the acetic acid is distilled of. After cooling to room temperature, the residue is neutralized with saturated aqueous NaHCO₃ solution. The mixture is extracted with dichloromethane and the combined organic phases are dried over anhydrous MgSO₄, followed by evaporation of the solvent under reduced pressure. Where the indole is not of sufficient purity for the next step, silicagel column chromatography is performed using petroleum ether/ethyl acetate mixtures as eluent.

The obtained indole (30 mmol) is dissolved in acetonitrile (150 mL) and the corresponding alkyl halide is added (60 mmol). The mixture is refluxed for 24 h. After cooling to room temperature, the product precipitates, is filtered and washed with acetonitrile. Where the product does not precipitate, the solvent is evaporated under reduced pressure. The indole is purified by recrystallization from acetonitrile or acetone.

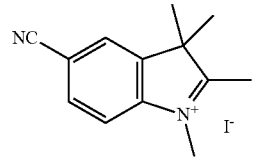

¹H NMR (500 MHz, DMSO-d₆) δ 7.43 (s, 1H), 7.24 (m, 2H), 4.03 (m, 6H), 0.85 (s, 6H).

ESI-MS [M]⁺ m/z calculated for $C_{13}H_{15}N_2^{30}$: 199.123 measured: 199.129.

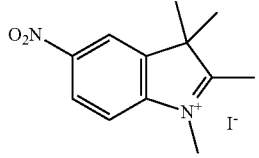 [SMILES: CC1=[N+](C)c2ccc([N+](=O)[O-])cc2C1(C)C ; [I-]]

¹H NMR (500 MHz, Acetonitrile-d₃) δ 9.15 (dd, J=2.2, 0.5 Hz, 1H), 9.05 (dd, J=8.8, 2.2 Hz, 1H), 8.50 (d, J=8.8 Hz, 1H), 4.56 (q, J=0.9 Hz, 3H), 3.37 (q, J=0.9 Hz, 3H), 2.20 (s, 6H).

ESI-MS [M]⁺ m/z calculated for $C_{12}H_{15}N_2O_2^+$: 219.113 measured: 219.119.

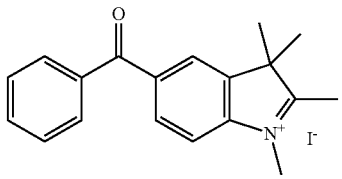 [SMILES: CC1=[N+](C)c2ccc(C(=O)c3ccccc3)cc2C1(C)C ; [I-]]

¹H NMR (500 MHz, DMSO-d₆) δ 7.35 (dd, J=1.6, 0.7 Hz, 1H), 7.24-7.15 (m, 2H), 7.04-6.97 (m, 2H), 6.94-6.85 (m, 1H), 6.82-6.73 (m, 2H), 4.04 (s, 3H), 3.31 (s, 3H), 0.85 (s, 6H).

ESI-MS [M]⁺ m/z calculated for $C_{19}H_{20}NO^+$: 278.154 measured: 278-158.

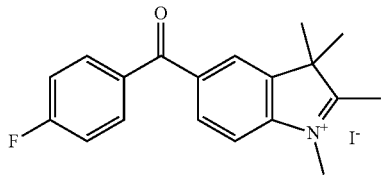 [SMILES: CC1=[N+](C)c2ccc(C(=O)c3ccc(F)cc3)cc2C1(C)C ; [I-]]

¹H NMR (500 MHz, DMSO-d₆) δ 7.33 (dd, J=1.7, 0.7 Hz, 1H), 7.22-7.14 (m, 2H), 7.06-6.99 (m, 2H), 6.78-6.69 (m, 1H), 6.57-6.48 (m, 2H), 4.04 (s, 3H), 3.31 (s, 3H), 0.85 (s, 6H).
ESI-MS [M]⁺ m/z calculated for $C_{19}H_{19}FNO^+$: 296.145 measured: 296.155.

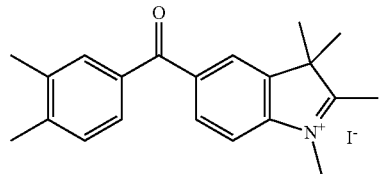

¹H NMR (500 MHz, Chloroform-d) δ 7.91 (dd, J=1.6, 0.6 Hz, 1H), 7.88 (dd, J=8-3, 1.5 Hz, 1H), 7.83 (dd, J=8.2, 0.6 Hz, 1H), 7-55 (dd, J=2.0, 0.9 Hz, 1H), 7.46 (dd, J=7.8, 1.9 Hz, 1H), 7.25-7.21 (s, 1H), 4.30 (d, J=1.0 Hz, 3H), 3.14 (d, J=1.0 Hz, 3H), 2.32 (d, J=14.8 Hz, 61), 1.98 (s, 2H), 1.69 (s, 6H).
ESI-MS [M]⁺ m/z calculated for $C_{21}H_{24}NO^+$: 306.185 measured: 306.181.

Synthesis of Co-Initiators

Example 1

Bisphenol A diglycidyl ether (10 g, 29.4 mmol) is added to triethanolamine (26.3 g, 176 mmol) and the mixture is stirred at room temperature overnight. The mixture is taken up in acetone/methanol (25/1) and filtered of silica gel. The solvent is removed under reduced pressure to yield the product as a viscous oil. Instead of triethanolamine other amines can be used, such as morpholine, dicyclohexylamine or dimethylamine.

Example 2

2-Isocyanatoethylacrylate (1 g, 7.1 mmol) is added dropwise at 0° C. to a solution of N-butyl-diethanolamine (3.3 g, 28.4 mmol) in dichloromethane (1 mL). After stirring for 1 h at room temperature, dichloromethane is added, and the mixture is washed with water. After evaporation of the solvent under reduced pressure, the product is obtained as a viscous oil. The procedure can be applied to other ethanolamine derivatives and ° isocyanatoethylmethacrylate.

Composition of Exemplary Formulations

Example Formulation 1

Initiator 2 (2 mg) is dissolved in ethylacetate (0.5 g) and added to a mixture of triethanolamine (1 g) and pentaerythritol tetraacrylate (10 g). The mixture is stirred until homogenization and can be directly used for printing.

Example Formulation 2

Initiator 2 (2 mg) is dissolved in ethylacetate (0.5 g) and added to a mixture of triethanolamine (i g) and diurethane dime acrylate, mixture of isomers, CAS 72869-86-4 (10 g). The mixture is stirred until homogenization and can be directly used for printing.

Example Formulation 3

Initiator 2 (2 mg) is dissolved in ethylacetate (0.5 g) and added to a mixture of triethanolamine (1 g), bisphenol A glycerolate (1 glycerol/phenol) diacrylate (g), and pentaerythritol tetraacrylate (5 g). The mixture is stirred until homogenization and can be directly used for printing.

Example Formulation 4

Initiator 2 (2 mg) is dissolved in ethylacetate (0.5 g) and added to a mixture of triethanolamine (0.25 g), triethylamine (0.75 g), and pentaerythritol tetraacrylate (10 g). The mixture is stirred until homogenization and can be directly used for printing.

Example Formulation 5

Initiator 2 (2 mg) is dissolved in ethylacetate (0.5 g) and added to a mixture of triethanolamine (0.75 g), acetic acid (0.25 g), and pentaerythritol tetraacrylate (10 g). The mixture is stirred until homogenization and can be directly used for printing.

Example Formulation 6

Initiator 65 (to mg) and 2-isopropylthioxanthone (too mg) are dissolved in ethylacetate (2 g) and added to a pentaerythritol tetraacrylate (10 g). The mixture is stirred until homogenization and can be directly used for printing.

Example Formulation 7

Initiator 66 (too mg) and 2-isopropylthioxanthone (too mg) are dissolved in ethylacetate (2 g) and added to a pentaerythritol tetraacrylate (to g). The mixture is stirred until homogenization and can be directly used for printing.

Example Formulation 8

Initiator 28 (too mg) and 2-isopropylthioxanthone (too mg) are dissolved in ethylacetate (2 g) and added to a pentaerythritol tetraacrylate (to g). The mixture is stirred until homogenization and cane directly used for printing.

Example Formulation 9

Initiator 2 (2 mg) is dissolved in ethylacetate (0.5 g) and added to a mixture of viscous co-initiator (Example 2, t g), and diurethane dimethacrylate, mixture of isomers, CAS 72869-864 (to g). The mixture is stirred until homogenization and can be directly used for printing.

Example Formulation to

Initiator 65 (2 mg) is dissolved in ethylacetate (0.5 g) and added to a pentaerythritol tetraacrylate (10 g). The mixture is stirred until homogenization and can be directly used for printing.

Example Formulation 11

Initiator 66 (2 mg) is dissolved in isobornyl acrylate (1 g) and added to diurethane dimethacrylate, mixture of isomers, CAS 72869-86-4 (10 g). The mixture is stirred until homogenization and can be directly used for printing.

Example Formulation 12

Initiator 2 (2 mg) is dissolved in ethanol (0.5 g) and added to a mixture of triethanolamine (1 g) and acrylamide/Bis-acrylamide (19/1; 40% solution in water, 10 g). The mixture is stirred until homogenization and can be directly used for printing.

Figure 2:
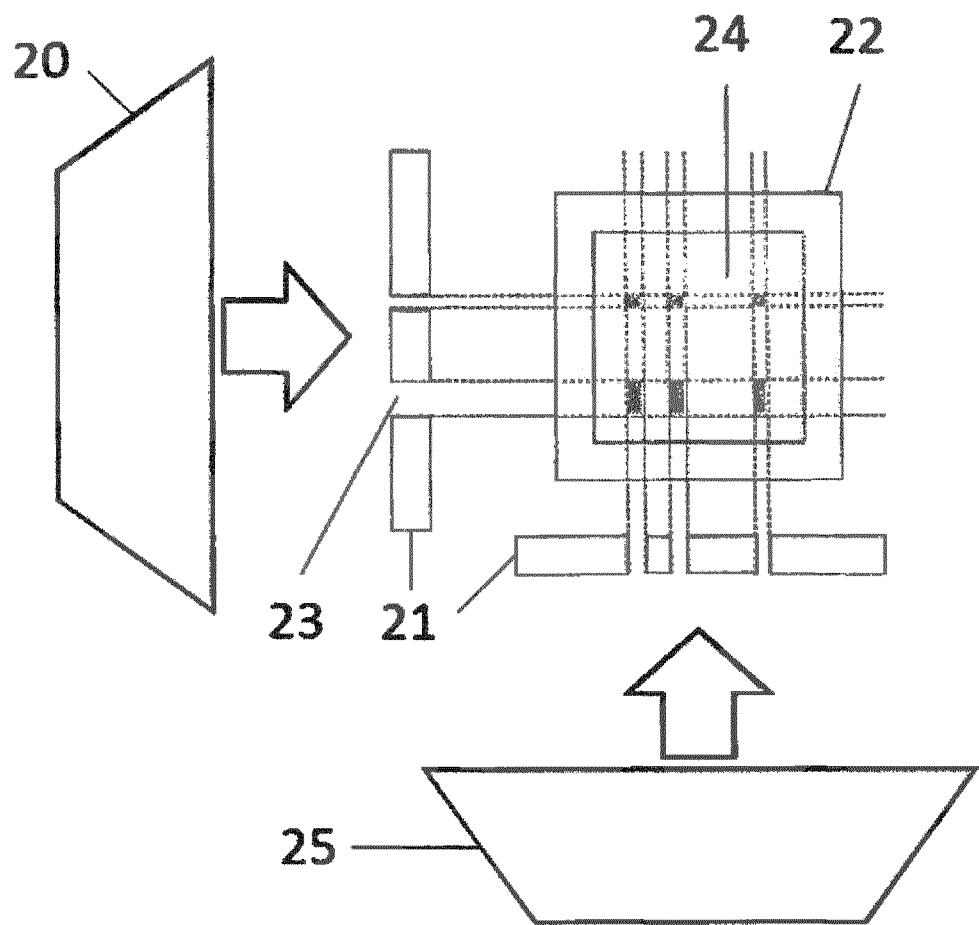
FIG. 2 shows a schematic representation of the process according to the invention.
Figure 3:
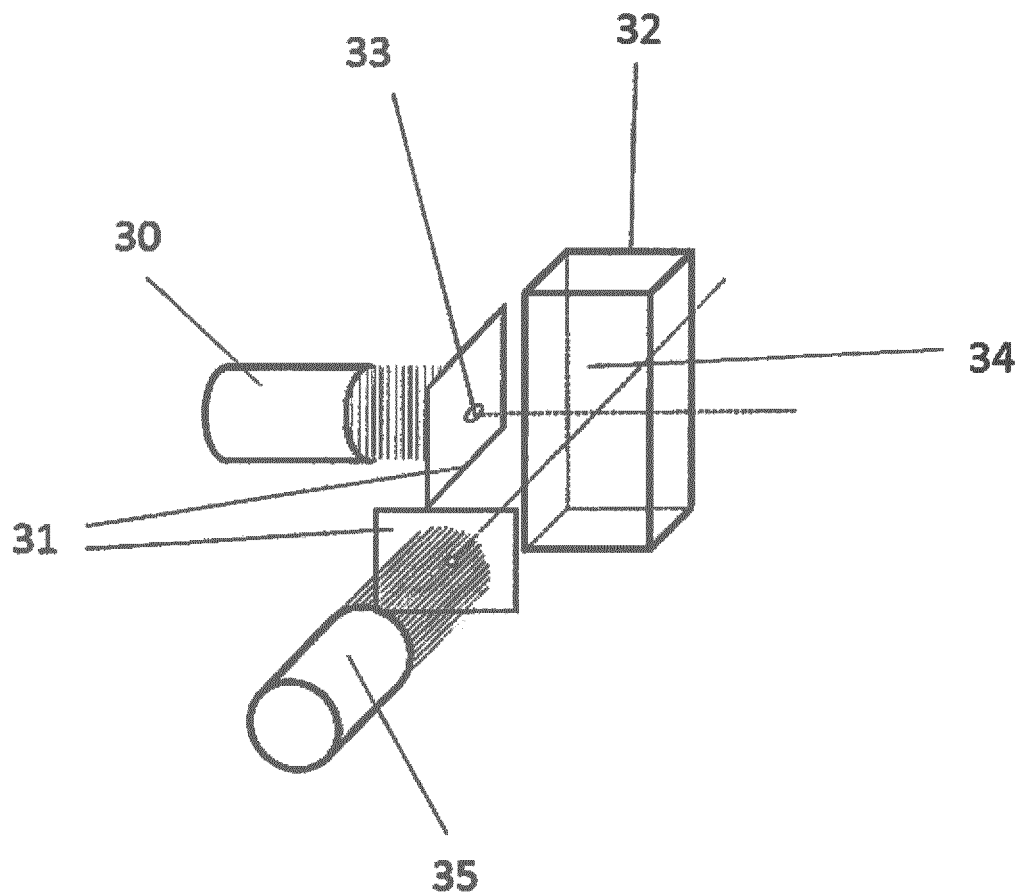
FIG. 3 shows a perspective view of the embodiment of the inventive step shown in FIG. 2.

The above described formulations are used for volumetric printing in a setup, where a cuvette with four transparent windows is irradiated in one direction with a light sheet of wavelength 1, while an image is projected onto the light sheet from a different angle with wavelength 2. The image is changed to produce a movie, while the cuvette or the light sheet is moved through the cuvette. The prints result in solidification only in volumes where the light of both wavelengths intersects. The residual uncured resin is removed to obtain the shaped body, which is further washed with solvent and post-cured. Specifically, the following conditions are used for the given example formulations:

Wavelength 1: 375 nm, wavelength 2: 565 nm, temperature 5°, 25° C., or 45° C.:
Formulation 1-5 and 9-12
Wavelength 1: 405 nm, wavelength 2: 6 nm, temperature 25° C.:
Formulation 6, 7, 8
Xolographic Experiments (FIGS. 1-3)

One part of a mixture of pentaerythritol tetraacrylate (20 g), triethanolamine (1 g) and initiator 2 (2.3 mg) in 1, ml ethanol is irradiated simultaneously by two LEDs with emission maxima of about 375 nm and 617 nm, respectively. The irradiation by the two LEDs is partially blocked by non-transparent layers. The non-transparent layers can be changed during irradiation, for example in their position. The material hardens at the points where both light beams hit the sample for a sufficient time. After irradiation is completed, the sample is washed with EtOH to obtain a solid three-dimensional body.

The features disclosed in the above description, claims and drawing may be relevant to the realisation of the various designs either individually or in any combination.

The invention claimed is:
1. A process for locally polymerizing a starting material by dual color photopolymerization, comprising:
providing a polymerizable starting material containing photoinitiator molecules which can be converted by sequential optical excitation into a reactive state in which the photoinitiator molecules locally trigger polymerization of the starting material; and
photopolymerizing the starting material in a local volume by irradiating light of a first wavelength and light of a second wavelength, different from the first wavelength, into the local volume, whereby in the local volume
the photoinitiator molecules are converted, due to the absorption of the light of the first wavelength, from an initial state in which the photoinitiator molecules substantially do not absorb the light of the second wavelength, into an intermediate state with changed optical properties compared to the initial state, such that the photoinitiator molecules in the intermediate state absorb the light of the second wavelength; and
the photoinitiator molecules are transferred from the intermediate state to the reactive state due to the absorption of the light of the second wavelength, which triggers the polymerization locally;
(A) characterized in that the photoinitiator molecule is represented by the following formula (I)—

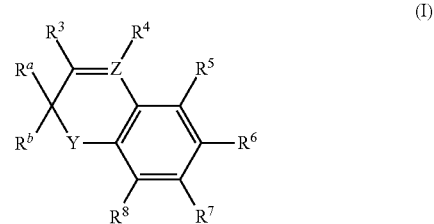

wherein $R^a$ and $R^b$ are selected independently from unsubstituted or substituted aryl, unsubstituted or substituted alkyne or a linked to each other to form a unsubstituted or substituted ring structure, Y is selected from O, S, or N; where Y is N, the substituent contains the atoms necessary to complete a cyclic structure with $R^8$ selected from the group consisting of benzimidazole, indoline, indole, dihydroquinoline, and tetrahydroquinoline; wherein Z is selected from N or $CR^4$; wherein $R^3$ to $R^8$ are independently selected from the group consisting of H; D; halogen; $NO_2$; CN; OH; SH; substituted or unsubstituted $C_1$-$C_{20}$-alkyl; substituted or unsubstituted $C_3$-$C_{20}$-cycloalkyl; substituted or unsubstituted $C_6$-$C_{48}$-aryl; substituted or unsubstituted $C_2$-$C_{42}$-heteroaryl; substituted or unsubstituted $C_2$-$C_{49}$-alkyl acyl; substituted or unsubstituted $C_2$-$C_{49}$-aryl acyl; substituted or unsubstituted $C_1$-$C_{20}$-alkoxy; substituted or unsubstituted $C_6$-$C_{48}$-aryloxy, and $NH_2$; substituted or unsubstituted $C_1$-$C_{20}$-alkyl ester; substituted or unsubstituted $C_6$-$C_{48}$-aryl ester; substituted or unsubstituted $C_1$-$C_{20}$ alkyl amide; substituted or unsubstituted $C_6$-$C_{48}$-aryl amide; $NR'_2$, $SiR'_3$, —O—$SiR'_3$ wherein R' is independently selected from the group consisting of substituted or unsubstituted $C_1$-$C_{20}$-alkyl and substituted or unsubstituted $C_6$-$C_{48}$-aryl, two R' may form a ring structure; substituted or unsubstituted carboxylic acids and salts thereof; substituted or unsubstituted sulfonic acids and salts thereof; substituted or unsubstituted sulfonic esters; substituted or unsubstituted sulfonic amides; formyl; ether, thioether; carbonate; carbonate ester; sulfates; boronic acids; boronic esters; phosphonic acids; phosphonic esters; phosphines; phosphates; peroxycarbonic acids; thiocarbonic acids; sulfinic acids; sulfinic esters; sulfonates; thiolesters, sulfoxides; sulfones; hydrazides; thioaldehydes; ketones; thioketones; oximes; hydrazines; nitroso; azo; diazo; diazonium; isocyanides; cyanate; isocyanate; thiocyanate; isothiocyanate; hydroperoxide; peroxide; acetals; ketal; orthoester; orthocarbonate esters; ammonium; imines; imides; azide; nitrate; isonitrile; nitrosoxy; substituted or unsubstituted carbamates; substituted or unsubstituted ethers; substituted or unsubstituted polyether carbamates; substituted or unsubstituted arylazo; substituted or unsubstituted $C_2$-$C_{20}$-alkynyl and substituted or unsubstituted $C_2$-$C_{20}$-alkenyl; wherein the one or more substituents, if present in one or more of $R^3$-$R^8$, are independently selected from the group consisting of D; halogen; $NO_2$; CN, $C_2$-$C_{49}$-alkyl acyl; substituted or unsubstituted $C_1$-$C_{20}$-alkoxy; substituted or unsubstituted $C_6$-$C_{48}$-aryloxy; substituted or unsubstituted $C_2$-$C_{49}$-aryl acyl; (meth) acrylate; tosyl; $NH_2$; and OH; and/or wherein two adjacent groups of $R^5$-$R^8$ may be linked to each other to form a fused ring structure; and wherein at least one of $R^3$-$R^8$, is selected from one of the following structures:

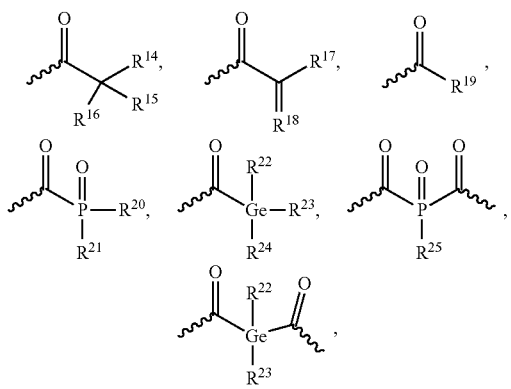

wherein $R^{14}$ to $R^{25}$ are independently selected from the group consisting of H; D; halogen; $NO_2$; CN; OH; SH; substituted or unsubstituted $C_1$-$C_{20}$-alkyl; substituted or unsubstituted $C_3$-$C_{20}$-cycloalkyl; substituted or unsubstituted $C_6$-$C_{48}$-aryl; substituted or unsubstituted $C_2$-$C_{42}$-heteroaryl; substituted or unsubstituted $C_2$-$C_{49}$-alkyl acyl; substituted or unsubstituted $C_2$-$C_{49}$-aryl acyl; substituted or unsubstituted $C_1$-$C_{20}$-alkoxy; substituted or unsubstituted $C_6$-$C_{48}$-aryloxy, and $NH_2$; substituted or unsubstituted $C_1$-$C_{20}$-alkyl ester; substituted or unsubstituted $C_6$-$C_{48}$-aryl ester; substituted or unsubstituted $C_1$-$C_{20}$ alkyl amide; substituted or unsubstituted $C_6$-$C_{48}$-aryl amide; $NR'_2$, $SiR'_3$, —O—$SiR'_3$ wherein R' is independently selected from the group consisting of substituted or unsubstituted $C_1$-$C_{20}$-alkyl and substituted or unsubstituted $C_6$-$C_{48}$-aryl, two R' may form a ring structure; substituted or unsubstituted carboxylic acids and salts thereof; substituted or unsubstituted sulfonic acids and salts thereof; substituted or unsubstituted sulfonic esters; substituted or unsubstituted sulfonic amides; formyl; ether, thioether; carbonate; carbonate ester; sulfates; boronic acids; boronic esters; phosphonic acids; phosphonic esters; phosphines; phosphates; peroxycarbonic acids; thiocarbonic acids; sulfinic acids; sulfinic esters; sulfonates; thiolesters, sulfoxides; sulfones; hydrazides; thioaldehydes; ketones; thioketones; oximes; hydrazines; nitroso; azo; diazo; diazonium; isocyanides; cyanate; isocyanate; thiocyanate; isothiocyanate; hydroperoxide; peroxide; acetals; ketal; orthoester; orthocarbonate esters; ammonium; imines; imides; azide; nitrate; isonitrile; nitrosoxy; substituted or unsubstituted carbamates; substituted or unsubstituted ethers; substituted or unsubstituted polyether carbamates; substituted or unsubstituted arylazo; substituted or unsubstituted $C_2$-$C_{20}$-alkynyl and substituted or unsubstituted $C_2$-$C_{20}$-alkenyl; wherein the one or more substituents, if present in one or more of $R^{14}$-$R^{25}$, are independently selected from the group consisting of D; halogen; $NO_2$; CN, $C_2$-$C_{49}$-alkyl acyl; substituted or unsubstituted $C_1$-$C_{20}$-alkoxy; substituted or unsubstituted $C_6$-$C_{48}$-aryloxy; substituted or unsubstituted $C_2$-$C_{49}$-aryl acyl; (meth) acrylate; tosyl; $NH_2$; and OH; and $R^{15}$ and $R^{16}$ may be linked to each other to form a unsubstituted or substituted ring structure; or (B) characterized in that the photoinitiator molecule is represented by the following formula (II)

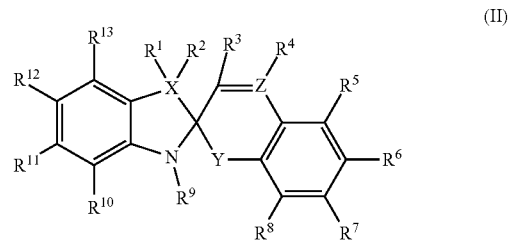

(II)

wherein X is selected from S, $CR^1R^2$, or $NR^1$; Y is selected from O, S, or $NR^c$; when Y is N, the substituent $R^c$ contains the atoms necessary to complete a cyclic structure with $R^8$ selected from the group consisting of benzimidazole, indoline, indole, dihydroquinoline, and tetrahydroquinoline; Z is selected from N or $CR^4$; and $R^1$ to $R^{13}$ are independently selected as defined in $R^3$ to $R^8$ regarding formula (I) above.

2. A process according to claim 1, characterized in that the light of the first wavelength and the light of the second wavelength are simultaneously irradiated into the local volume.

3. A process according to claim 1, characterized in that the light of the second wavelength is irradiated into the local volume after the irradiation of the light of the first wavelength in the local volume has ended, the light of the second wavelength being irradiated before the end of a decay time of the intermediate state of the photoinitiator molecules.

4. A process according to claim 1, characterized in that the photoinitiator molecules in the intermediate state substantially do not absorb the light of the first wavelength.

5. A process according to claim 1, characterized in that the photoinitiator molecules are converted from the intermediate state to the initial state due to the absorption of light of a third wavelength in volumes where no polymerization is desired.

6. A process according to claim 1, characterized in that the photoinitiator molecules are converted into a reactive state due to the sequential absorption of light of the second wavelength which triggers a polymerization in the local volume.

7. A process according to claim 1, characterized in that the photoinitiator molecules are converted into a reactive state due to the absorption of the light of the second wavelength, which triggers a radical polymerization in the local volume.

8. A process according to claim 1, characterized in that $R^{14}$, $R^{15}$, and $R^{16}$ are independently selected from H, D, CN, halogen, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; or substituted or unsubstituted $C_2$-$C_{28}$-heteroaryl.

9. A process according to claim 1, characterized in that $R^{19}$ is selected from substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, substituted or unsubstituted $C_2$-$C_{20}$-alkynyl and substituted or unsubstituted $C_2$-$C_{20}$- alkenyl, the substituent may contain the atoms necessary to complete a cyclic structure with one of $R^5$-$R^8$ or $R^{10}$-$R^{13}$ forming an anthracene, thioxanthone or fluorenone.

10. A process according to one of claim 1, characterized in that $R^{14}$ is $NR'_2$, wherein R' is independently selected from the group consisting of H, D, substituted or unsubstituted $C_1$-$C_{10}$-alkyl and substituted or unsubstituted $C_6$-$C_{32}$-aryl, and two R' may form a ring structure; or OR', wherein R' is selected from the group consisting of H, D, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl, SiR "3, wherein R" is independently selected from the group consisting of substituted or unsubstituted $C_1$-$C_{10}$-alkyl and substituted or unsubstituted $C_6$-$C_{32}$-aryl; and $R^{15}$ and $R^{16}$ are independently selected from H, D, CN, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl.

11. A process according to claim 1, characterized in that $R^{14}$ and $R^{15}$ are OR', wherein R' is independently selected from the group consisting of H, D, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl; and $R^{16}$ is selected from H, D, CN, substituted or unsubstituted $C_1$-$C_{10}$-alkyl; substituted or unsubstituted $C_3$-$C_{10}$-cycloalkyl; substituted or unsubstituted $C_6$-$C_{32}$-aryl; substituted or unsubstituted $C_2$-$C_{28}$-heteroaryl.

12. A process according to claim 1, characterized in that $R^{10}$-$R^{13}$ are independently selected from the group consisting of H and electron withdrawing groups (EWG), and one of $R^5$-$R^8$ is selected from unsubstituted or substituted arylacyl; or unsubstituted or substituted alkylacyl;

and/or at least one of $R^5$-$R^8$ is independently selected from the group consisting of electron donating groups (EDG), and at least one of $R^5$-$R^8$, $R^{10}$-$R^{13}$ is selected from unsubstituted or substituted arylacyl; or unsubstituted or substituted alkylacyl;

or at least one of $R^6$, $R^7$ and $R^{12}$ is selected from the group consisting of $CF_3$, $SO_2Me$, $SO_2NH_2$, CN, F, $NO_2$, $C_6$-aryl, unsubstituted $C_6$-arylacyl of the following formula

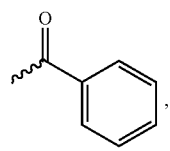

dimethoxy-substituted arylacyl of the formula

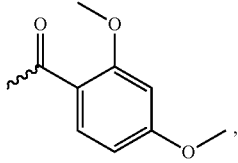

methoxy-substituted arylacyl of the formula

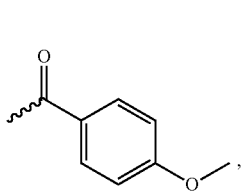

fluorine-substituted arylacyl of the following formula

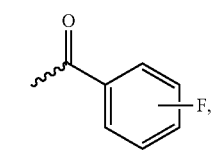

alternatively of the formula

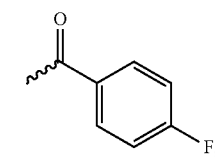

and $C_6$-aryl.

13. A process according to claim 1,
characterized in that the photoinitiator molecules comprise one or more of the following compounds:

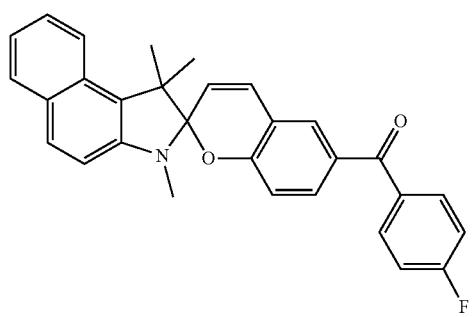

1

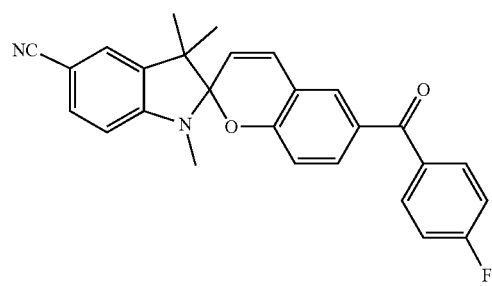

2

-continued
3
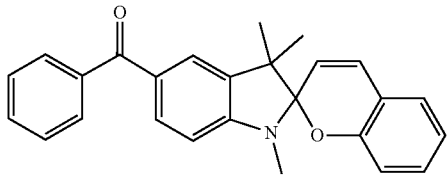
4
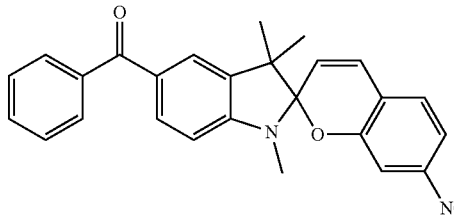
5
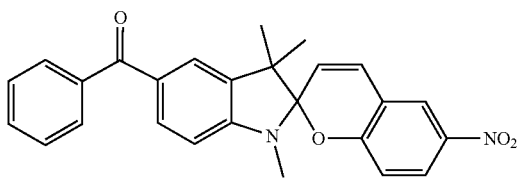
6
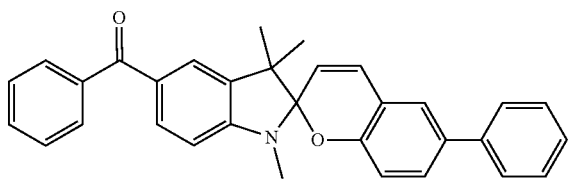
7
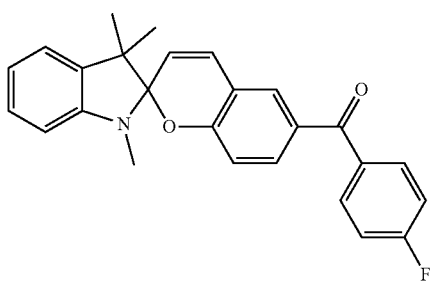
8
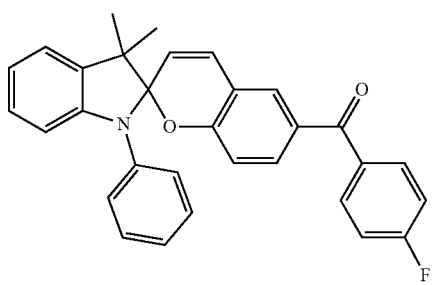
9
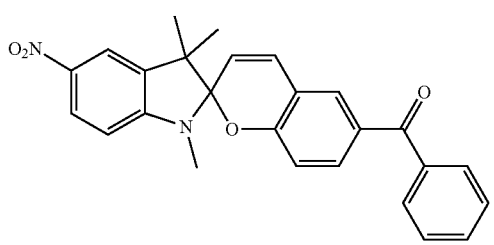
10
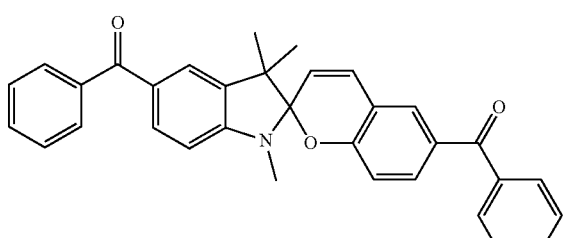
11
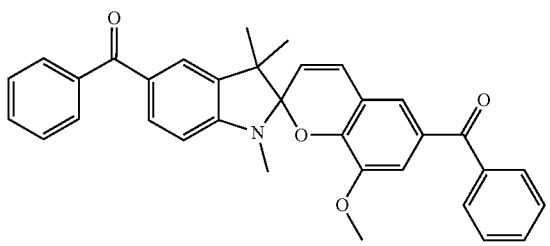
12
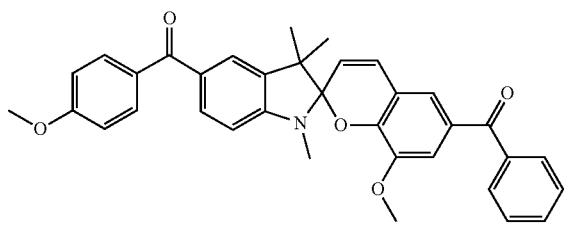
13
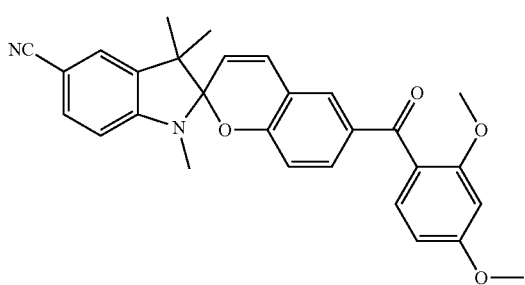
14
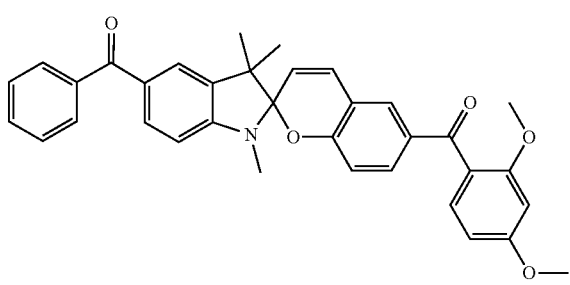

-continued
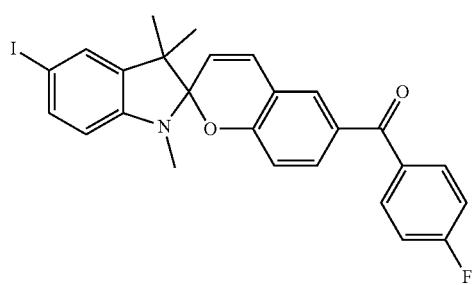
15
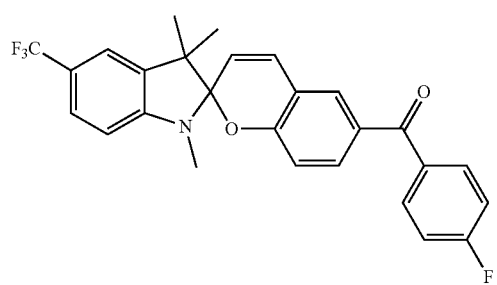
16
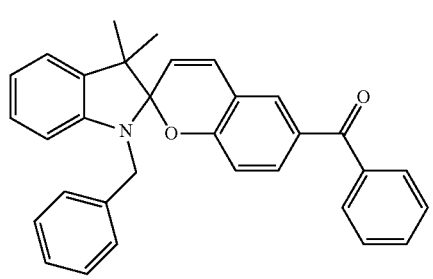
17
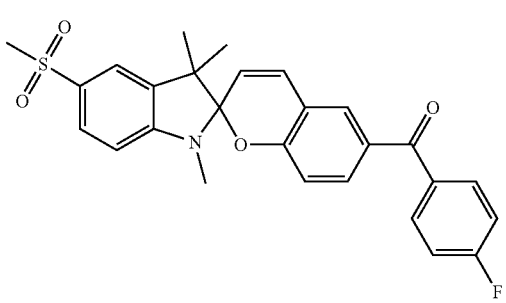
18
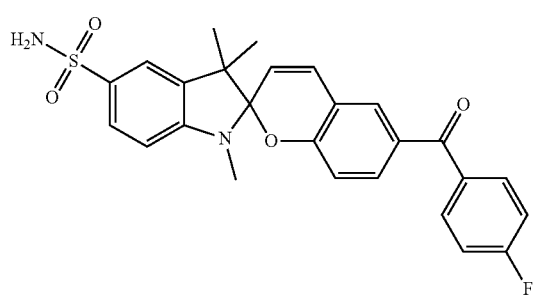
19
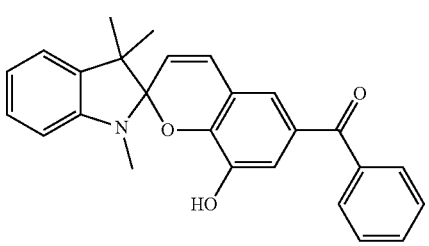
20
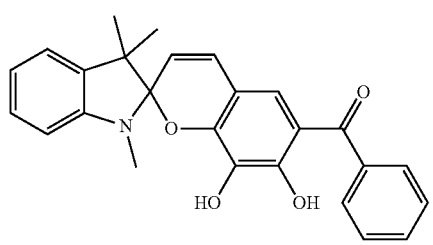
21
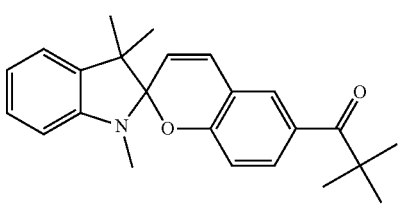
22
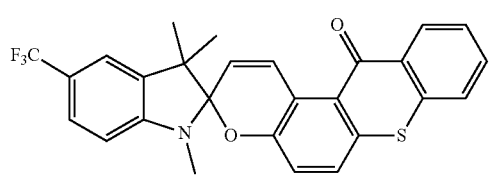
23
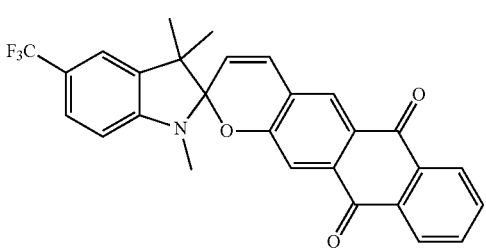
24
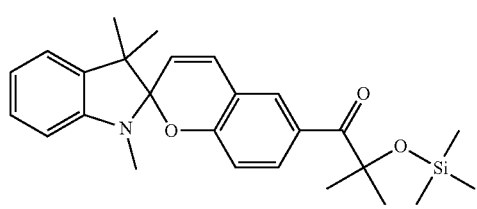
25
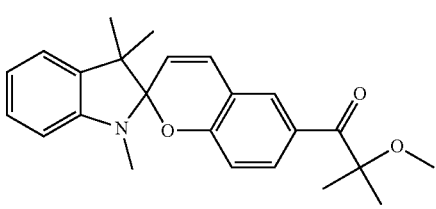
26

-continued
27
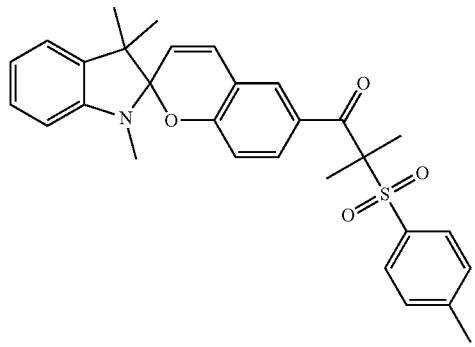
28
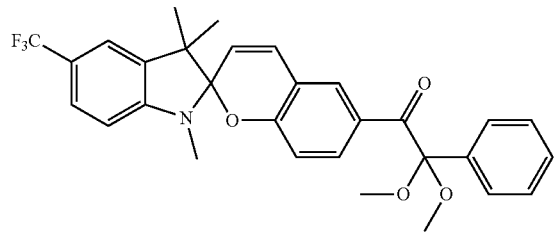
29
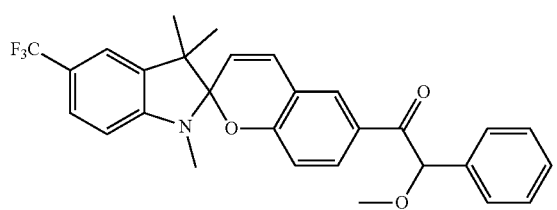
30
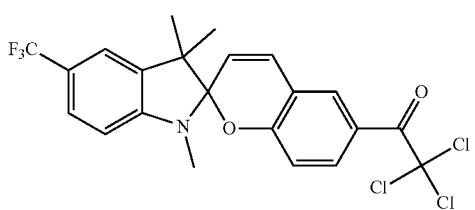
31
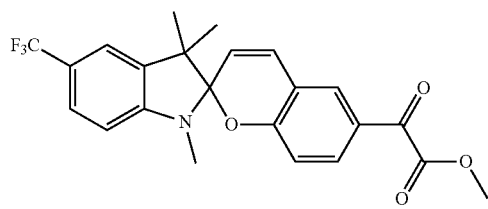
32
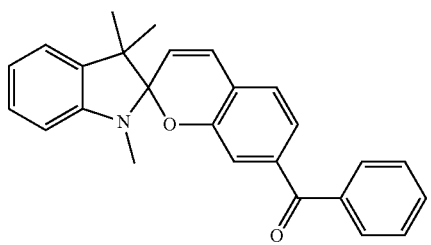
33
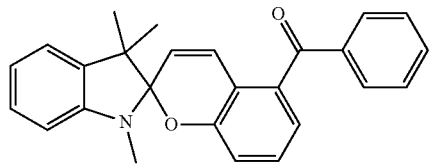
34
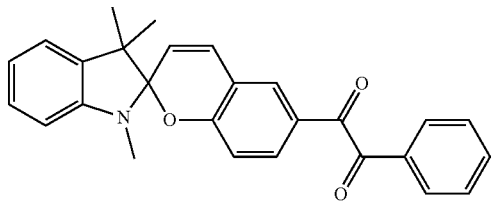
35
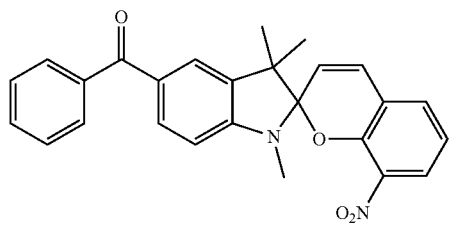
36
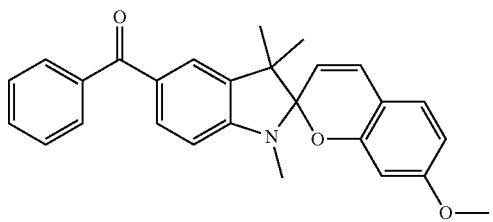
37
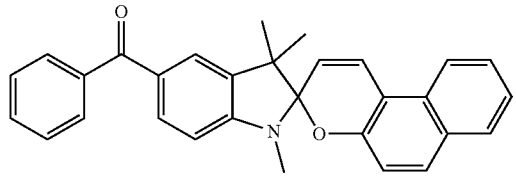
38
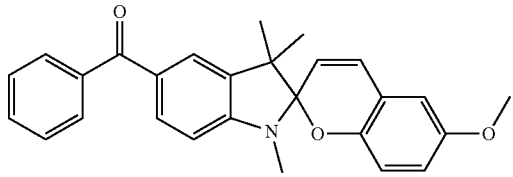

-continued
39
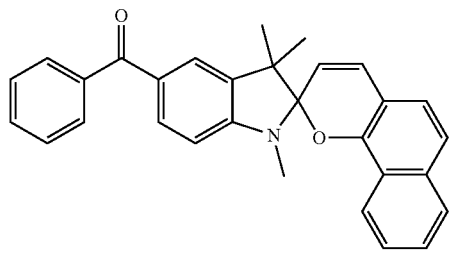
40
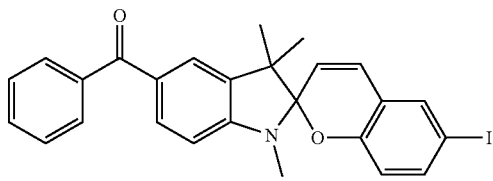
41
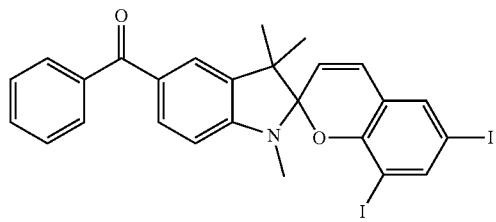
42
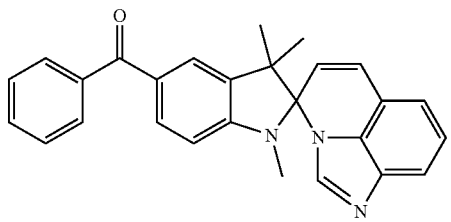
43
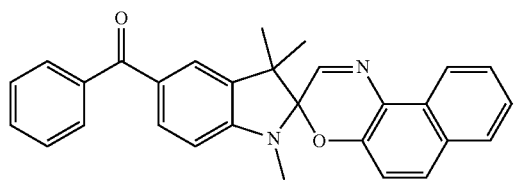
44
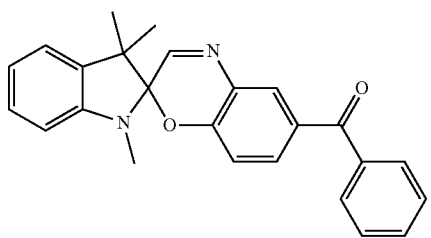
45
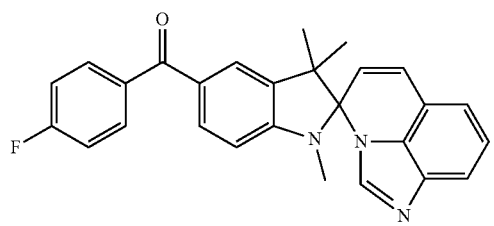
46
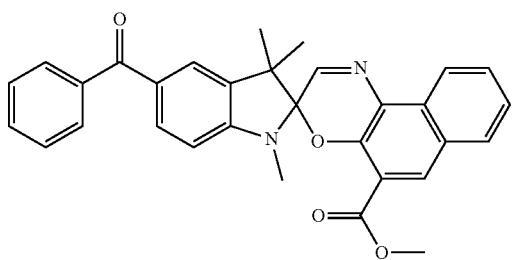
47
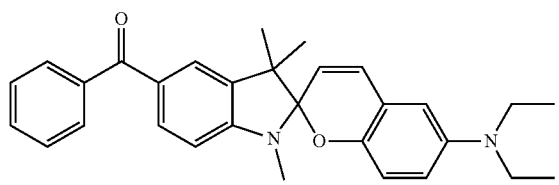
48
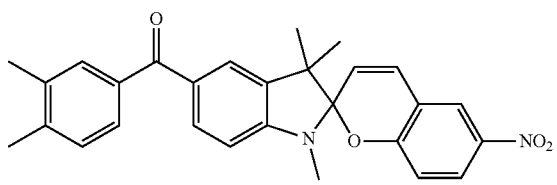
49
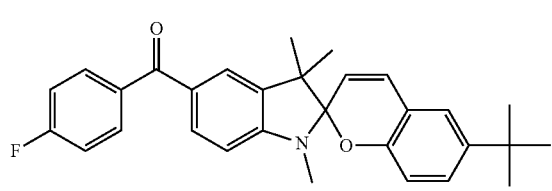
50
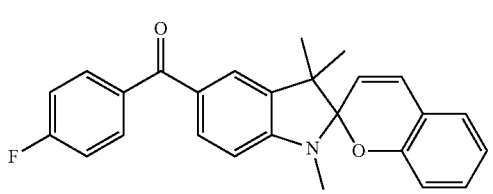
51
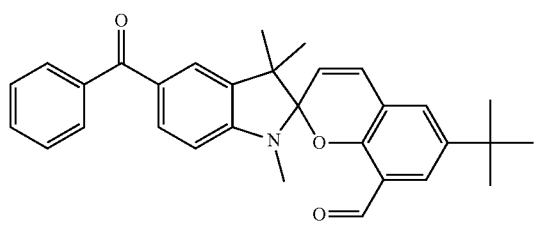
52
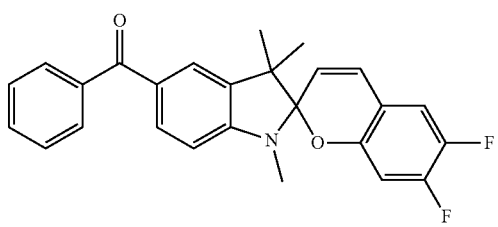

-continued
53
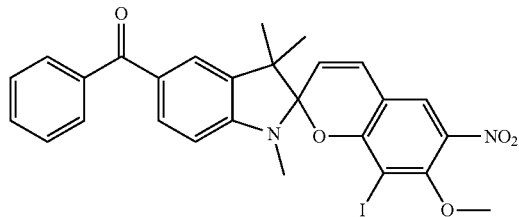
54
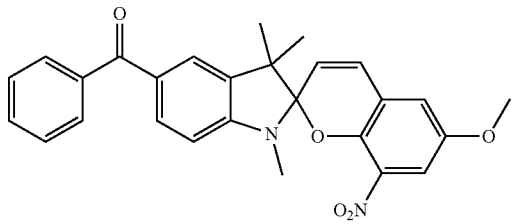
55
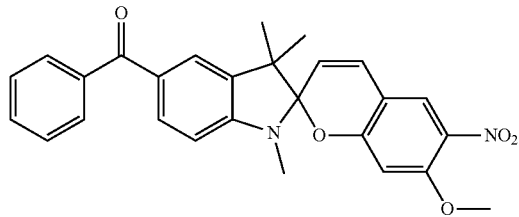
56
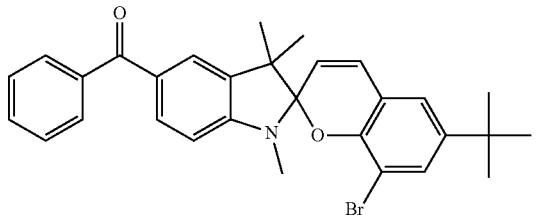
57
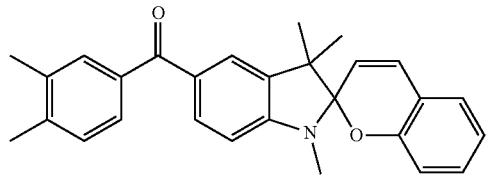
58
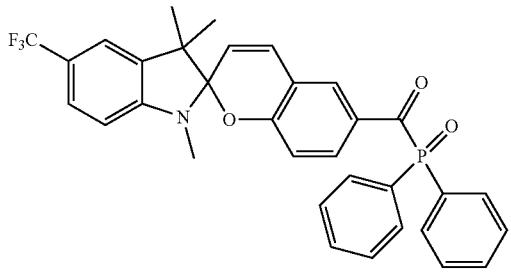
59
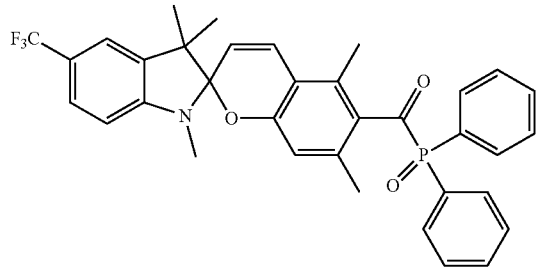
60
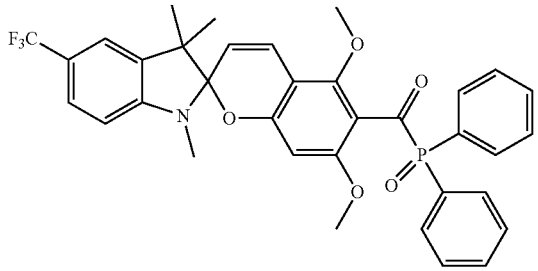
61
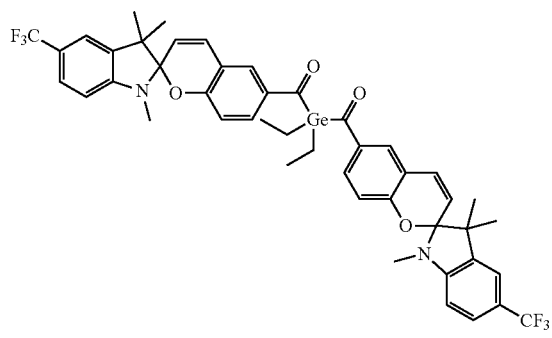
62
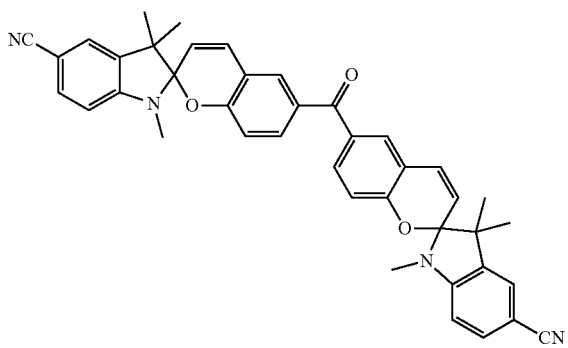

-continued
63
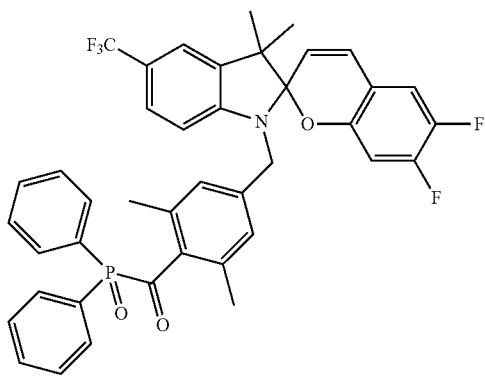
64
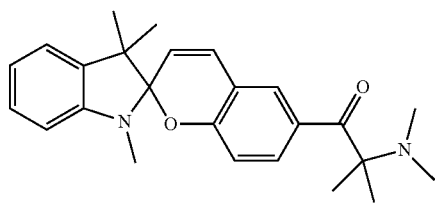
65
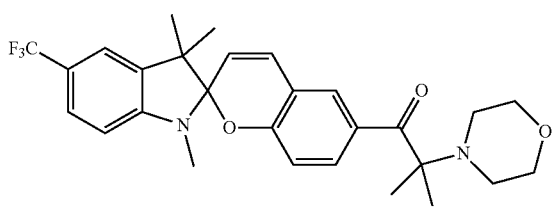
66
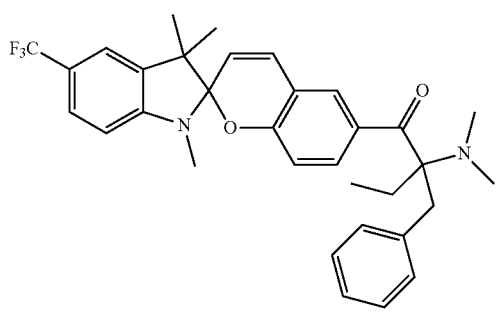
67
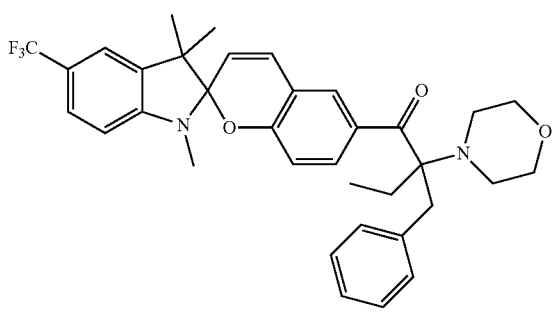
68
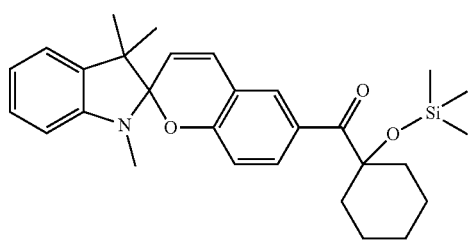
69
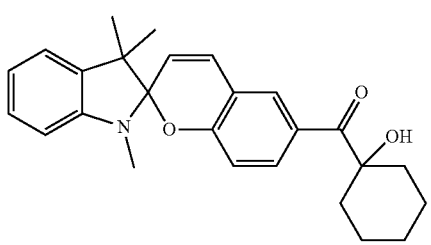
70
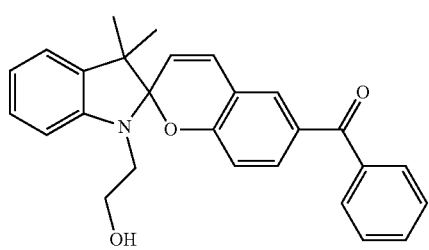

-continued
71
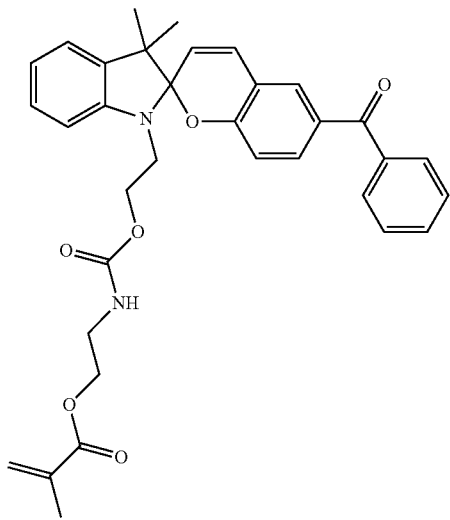
72
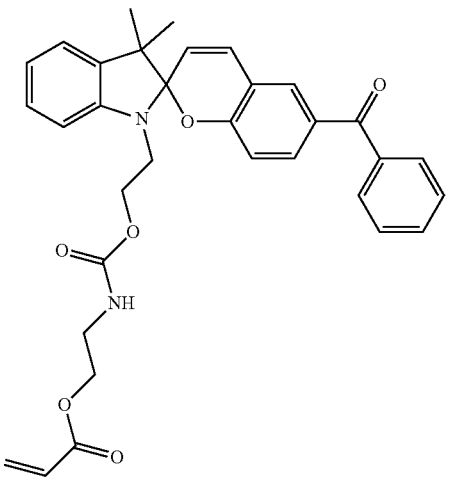
73
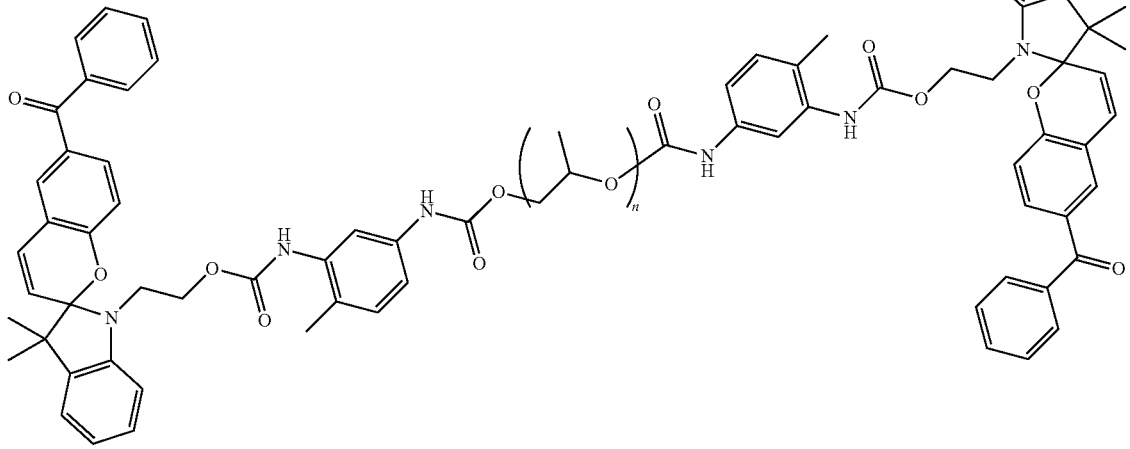
74
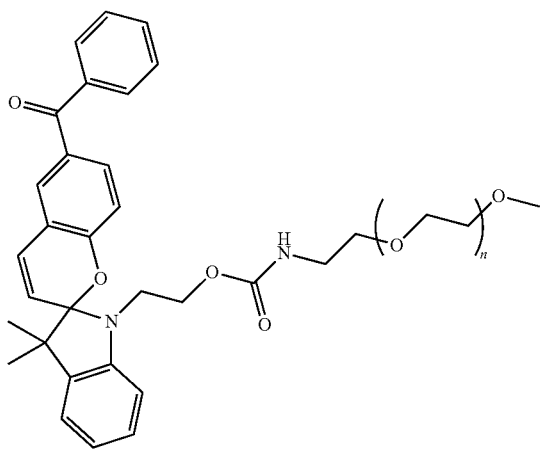
75
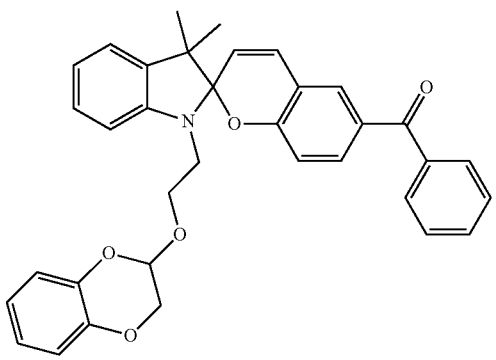

-continued

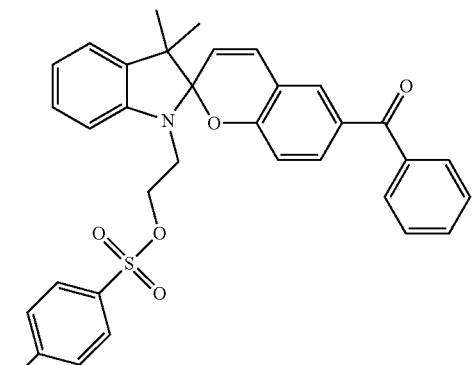
76

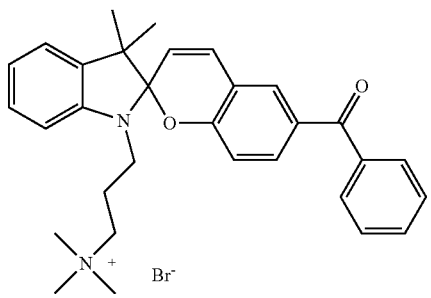
77

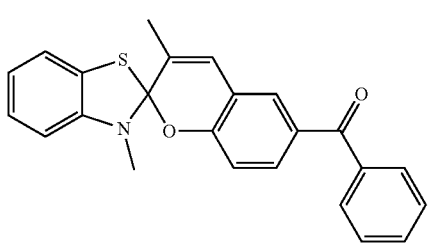
78

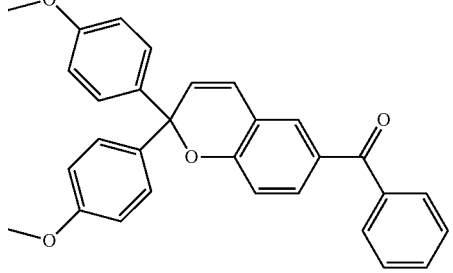
79

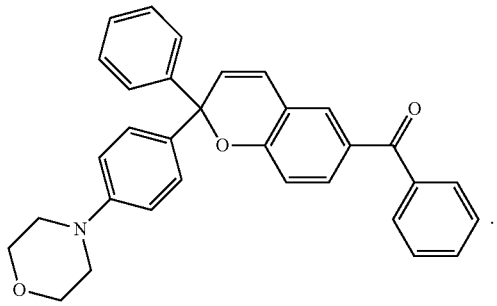
80

14. A process according to claim 1, characterized in that the polymerizable starting material further contains a co-initiator and/or a sensitizer.

15. A process according to claim 1, characterized in that the polymerizable starting material further contains an additive, an acid and/or a base.

16. A process for locally polymerizing a starting material by dual color photopolymerization, comprising:
providing a polymerizable starting material containing photoinitiator molecules which can be converted by sequential optical excitation into a reactive state in which the photoinitiator molecules locally trigger polymerization of the starting material; and
photopolymerizing the starting material in a local volume by irradiating light of a first wavelength and light of a second wavelength, different from the first wavelength, into the local volume, whereby in the local volume
the photoinitiator molecules are converted, due to the absorption of the light of the first wavelength, from an initial state in which the photoinitiator molecules substantially do not absorb the light of the second wavelength, into an intermediate state with changed optical properties compared to the initial state, such that the photoinitiator molecules in the intermediate state absorb the light of the second wavelength; and
the photoinitiator molecules are transferred from the intermediate state to the reactive state due to the absorption of the light of the second wavelength, which triggers the polymerization locally;
characterized in that a light beam of light of the first wavelength and a light beam of light of the second wavelength are irradiated at least partially overlapping in the local volume.

17. A process according to claim 1, characterized in that the starting material is polymerized in several local volumes by means of photopolymerization and thus a three-dimensional shaped body is produced in the starting material.

18. A process for 3D-printing a shaped body, wherein the shaped body is produced by means of a process according to claim 1.

19. Apparatus for locally polymerizing a starting material by dual color photopolymerization, comprising:
an intake for a polymerizable starting material;
light generating means arranged to generate light of a first wavelength and light of a second wavelength, the second wavelength being different from the first wavelength; and
a light guide device arranged to irradiate the light of the first wavelength and the light of the second wavelength into a local volume;

said device being adapted to perform the following procedure:
- taking up the polymerizable starting material by said intake, said starting material containing photoinitiator molecules which can be excited by sequential optical excitation into a reactive state in which the photoinitiator molecules locally initiate polymerization of the starting material; and
- photopolymerizing the starting material in a local volume by irradiating the light of the first wavelength and the light of the second wavelength into the local volume, whereby in the local volume
- the photoinitiator molecules, due to the absorption of the light of the first wavelength, are converted from an initial state in which the photoinitiator molecules substantially do not absorb the light of the second wavelength into an intermediate state with changed optical properties compared to the initial state, such that the photoinitiator molecules in the intermediate state absorb the light of the second wavelength; and
- the photoinitiator molecules are transferred from the intermediate state to the reactive state due to the absorption of the light of the second wavelength, which triggers the polymerization locally.

* * * * *